(12) United States Patent
Bessho et al.

(10) Patent No.: US 7,535,945 B2
(45) Date of Patent: May 19, 2009

(54) SEMICONDUCTOR LASER APPARATUS AND METHOD OF MANUFACTURING THE SAME

(75) Inventors: Yasuyuki Bessho, Hirakata (JP); Masayuki Hata, Kadoma (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 385 days.

(21) Appl. No.: 11/093,024

(22) Filed: Mar. 30, 2005

(65) Prior Publication Data
US 2005/0242361 A1 Nov. 3, 2005

(30) Foreign Application Priority Data

| | | |
|---|---|---|
| Mar. 30, 2004 | (JP) | ............................. 2004-101488 |
| Jun. 22, 2004 | (JP) | ............................. 2004-184316 |
| Sep. 30, 2004 | (JP) | ............................. 2004-289087 |
| Mar. 17, 2005 | (JP) | ............................. 2005-077910 |

(51) Int. Cl.
*H01S 5/00* (2006.01)
(52) U.S. Cl. .............................. 372/50.121; 372/43.01; 372/50.12; 372/50.122; 372/68; 257/88; 257/99; 257/100; 438/22
(58) Field of Classification Search .............. 372/50.12, 372/50.121, 50.122, 68, 43.01; 257/89, 99, 257/100; 438/22
See application file for complete search history.

(56) References Cited

U.S. PATENT DOCUMENTS 6,038,243 A * 3/2000 Mogi ..................... 372/50.121
6,136,623 A * 10/2000 Hofstetter et al. ............. 438/28
6,993,055 B2 * 1/2006 Wang et al. ............ 372/46.013

(Continued)

FOREIGN PATENT DOCUMENTS

JP 2004-207479 7/2001

(Continued)

OTHER PUBLICATIONS

U.S. Appl. No. 11/076,963, filed Mar. 11, 2005, Bessho et al.

(Continued)

*Primary Examiner*—Minsun Harvey
*Assistant Examiner*—Yuanda Zhang
(74) *Attorney, Agent, or Firm*—McDermott Will & Emery LLP

(57) ABSTRACT

Second and third p-side pad electrodes are formed on an insulating film of a blue-violet semiconductor laser device on both sides of a first p-side pad electrode. The second p-side pad electrode and the third p-side pad electrode are formed separately from each other. Solder films are formed on the upper surfaces of the second and third p-side pad electrodes respectively. A fourth p-side pad electrode of a red semiconductor laser device is bonded onto the second p-side pad electrode with the corresponding solder film sandwiched therebetween. A fifth p-side pad electrode of an infrared semiconductor laser device is bonded onto the third p-side pad electrode with the corresponding solder film sandwiched therebetween. The second and third p-side pad electrodes are formed separately from each other, so that the fourth and fifth p-side pad electrodes are electrically isolated from each other.

19 Claims, 42 Drawing Sheets

U.S. PATENT DOCUMENTS

| | | | |
|---|---|---|---|
| 2001/0048703 A1* | 12/2001 | Oh | 372/43 |
| 2001/0050531 A1 | 12/2001 | Ikeda | |
| 2004/0109481 A1 | 6/2004 | Ikeda | |
| 2004/0136428 A1 | 7/2004 | Miyachi et al. | |
| 2004/0184502 A1 | 9/2004 | Miyachi et al. | |
| 2004/0196877 A1* | 10/2004 | Kawakami et al. | 372/23 |

FOREIGN PATENT DOCUMENTS

| | | |
|---|---|---|
| JP | 2004-207480 | 7/2001 |
| JP | 2001-230502 | 8/2001 |

OTHER PUBLICATIONS

U.S. Appl. No. 11/081,726, filed Mar. 17, 2005, Bessho et al.
U.S. Appl. No. 11/092,947, filed Mar. 30, 2005, Bessho et al.
Miyachi et al.; "AlGaInN/AlGaInP Two-Wavelength Laser Diodes Fabricated by Wafer-Level Transferring Technique"; *Japanese Journal of Applied Physics*; pp. L136-L138; vol. 43, No. 2A; c. 2004; Japan.
U.S. Appl. No. 11/078,626, filed Mar. 14, 2005, Inoue et al.
Hashizu et al.; "Three-wavelength Laser Diodes for Optical Disc System"; *International Symposium of Optical Memory (ISOM)*; c. 2005; pp. 232-233.

* cited by examiner

FIG. 13
(a)
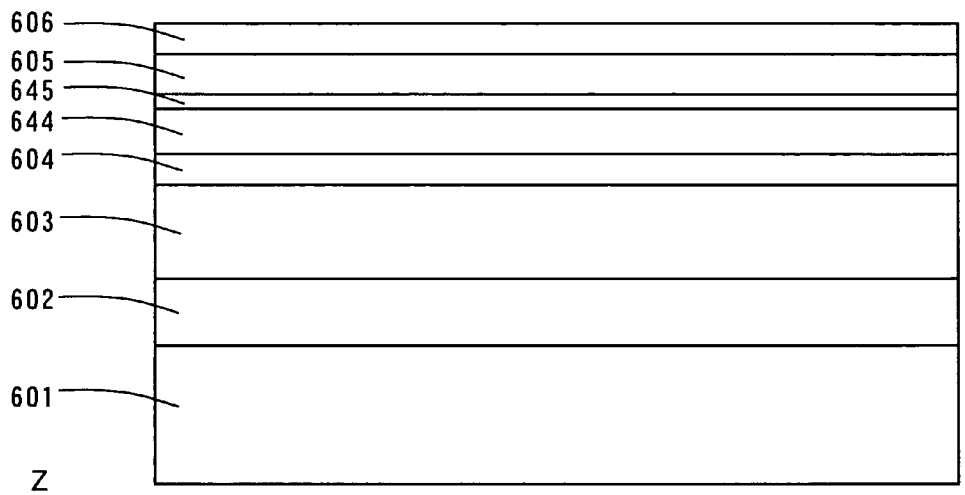
(b)
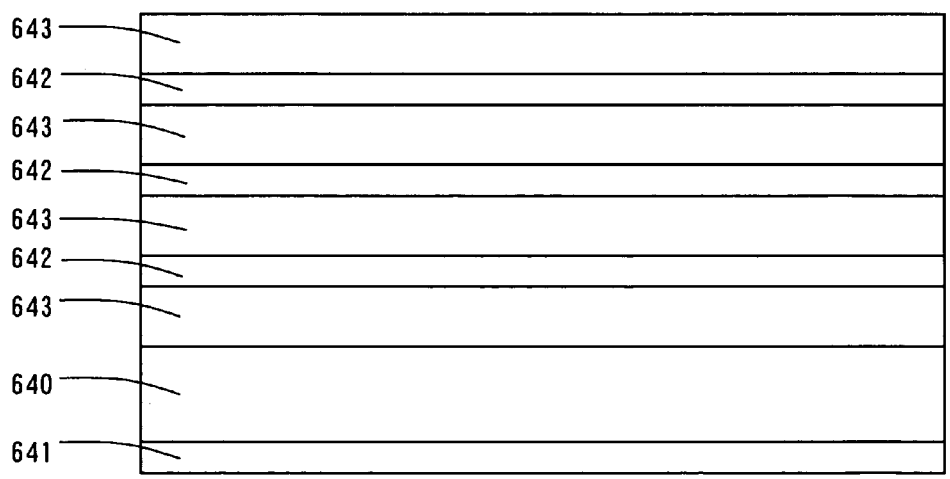

(a)

FIG. 19
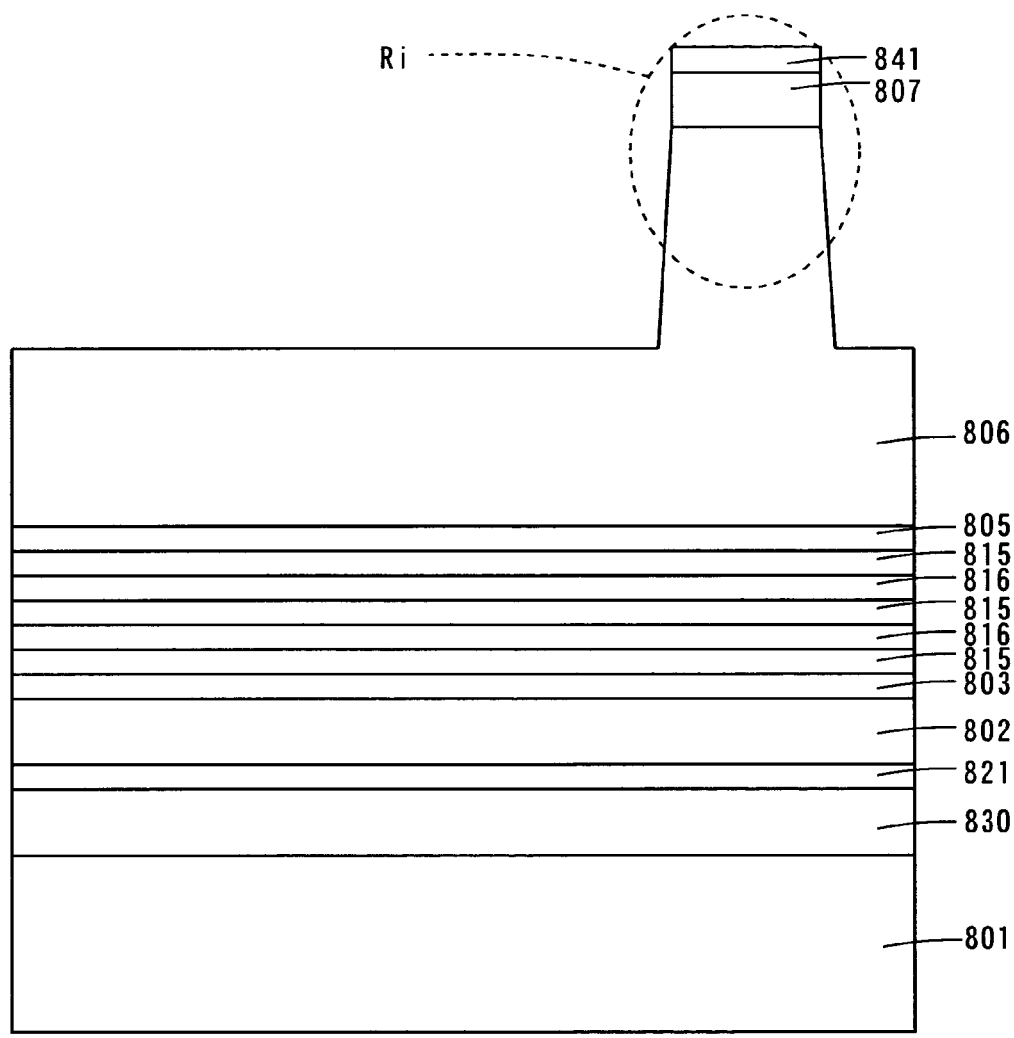
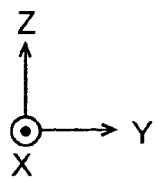

FIG. 22
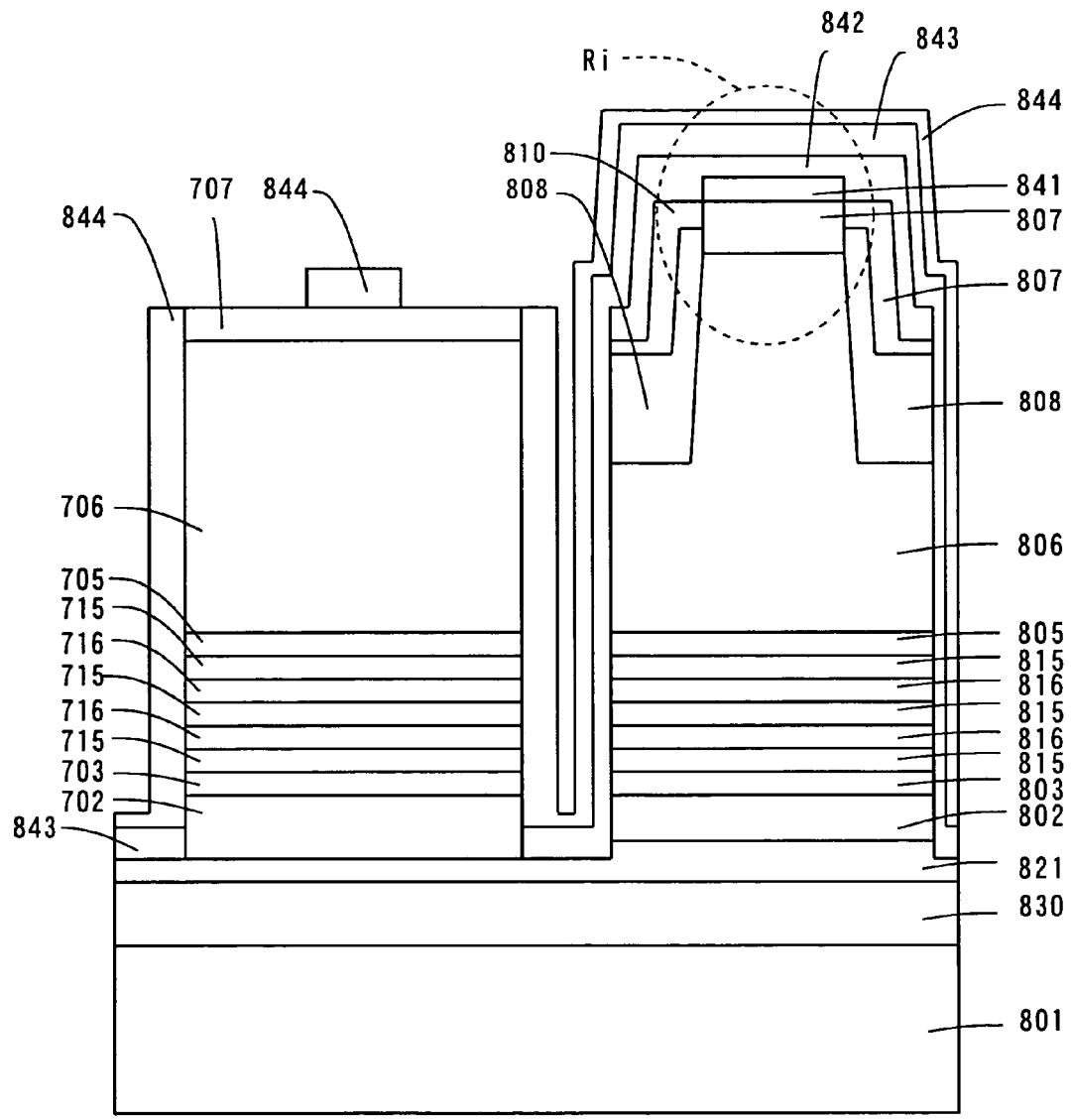
(e)
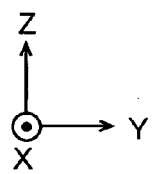

FIG. 24
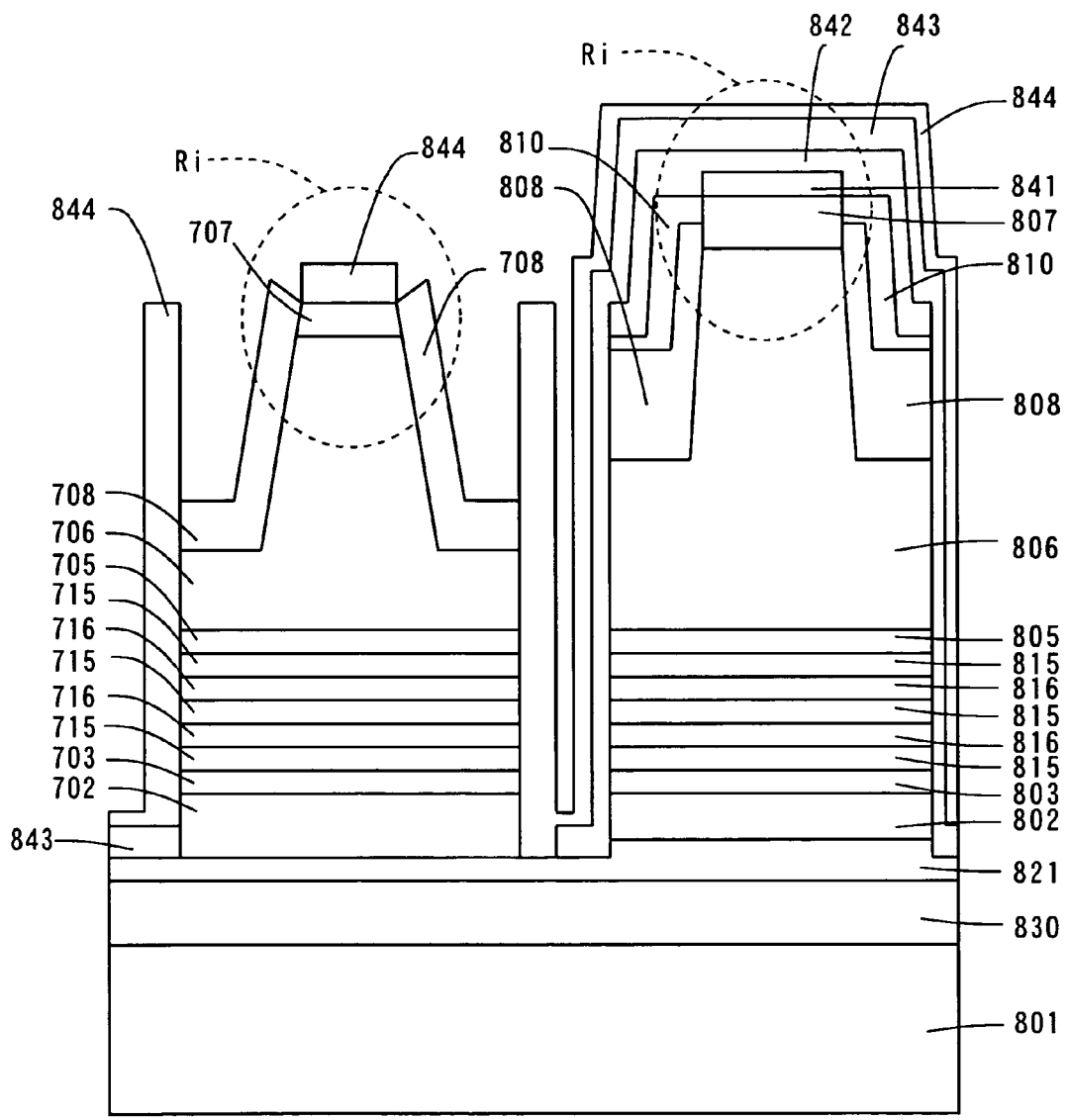
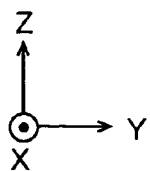

FIG. 25
(h)
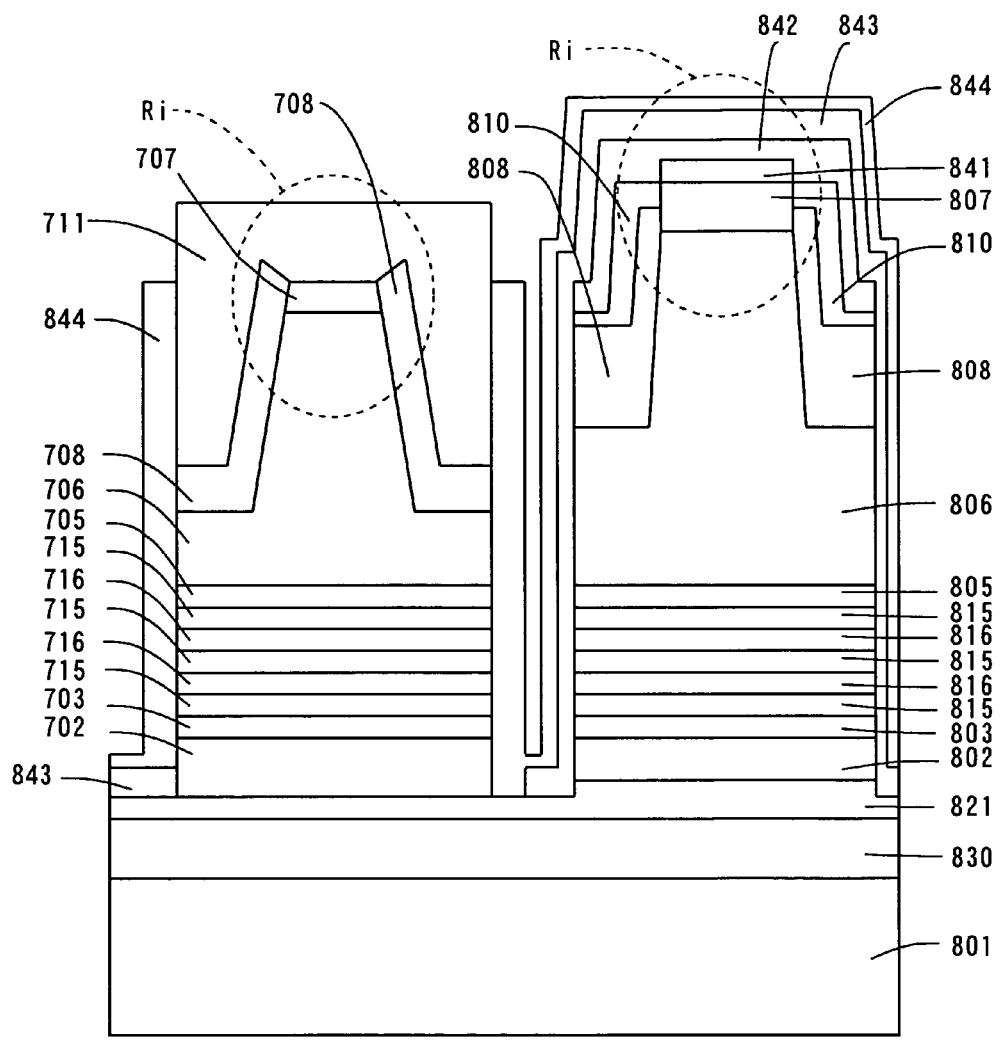
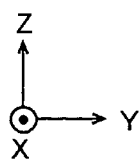

F I G. 3 4
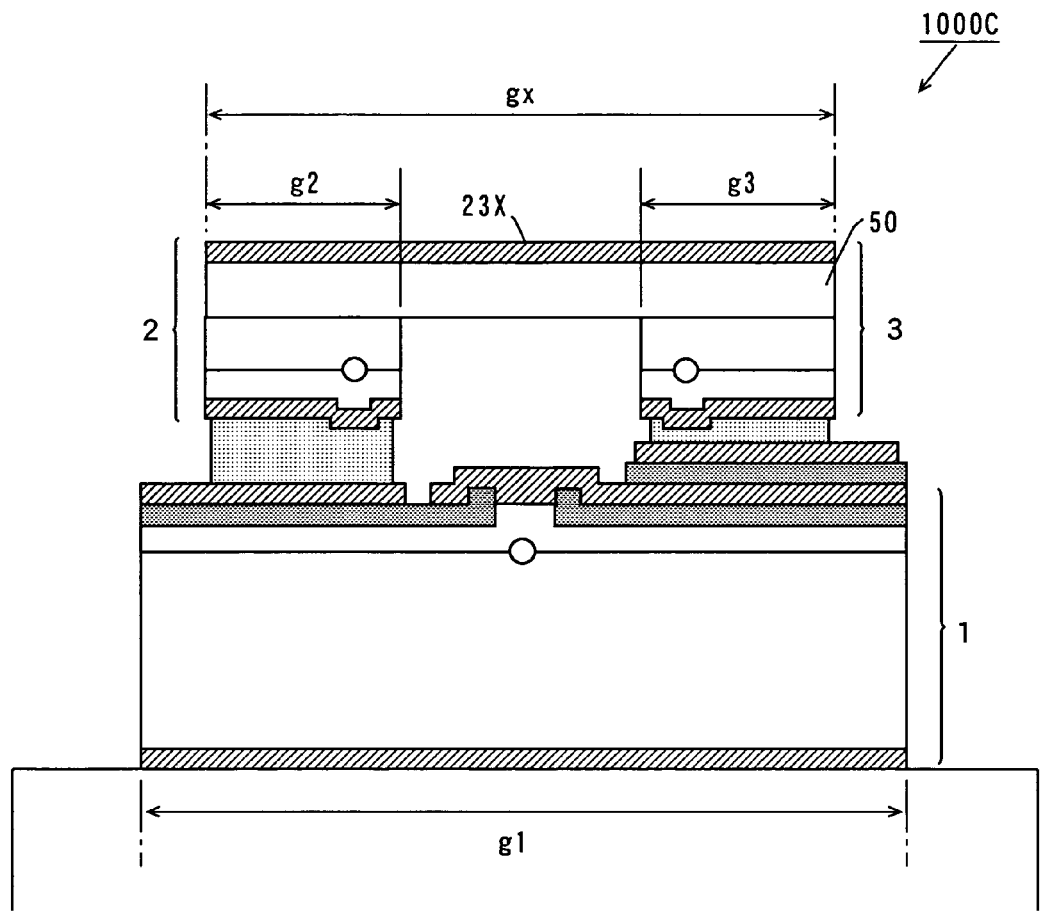

FIG. 35
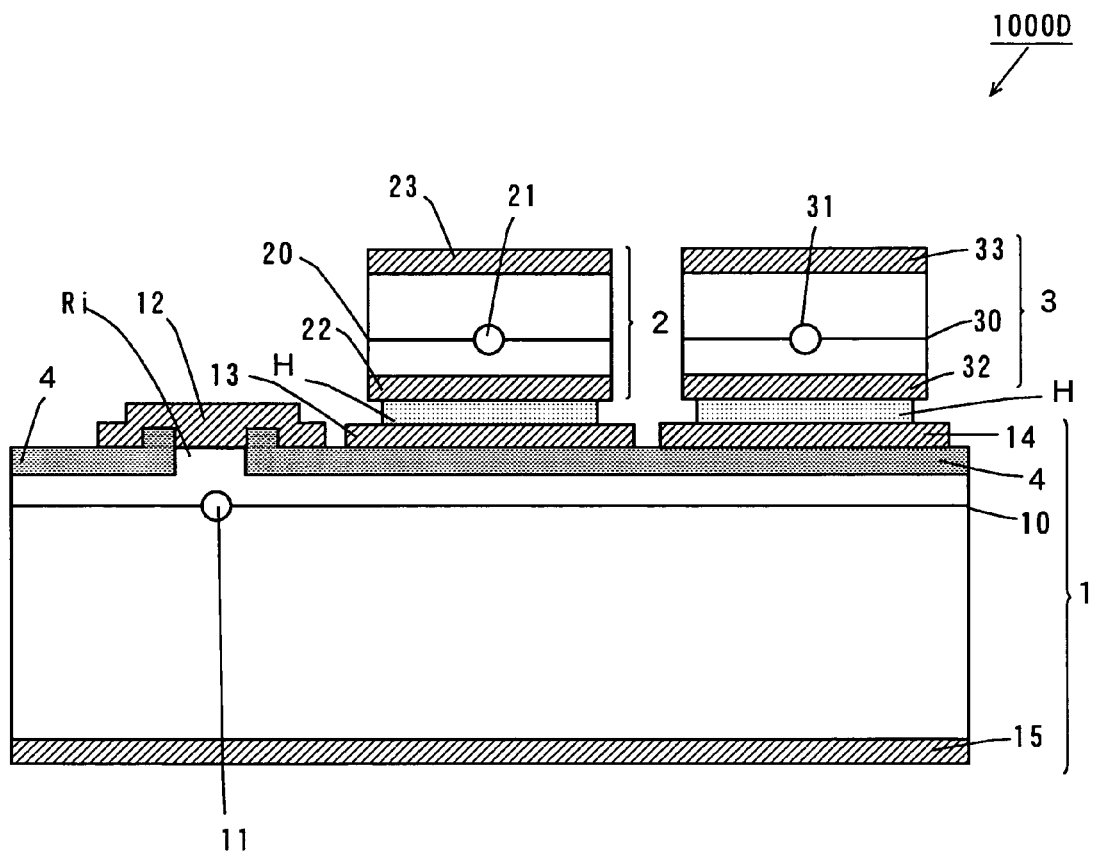
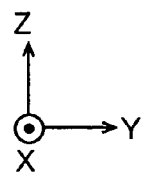

F I G. 3 8
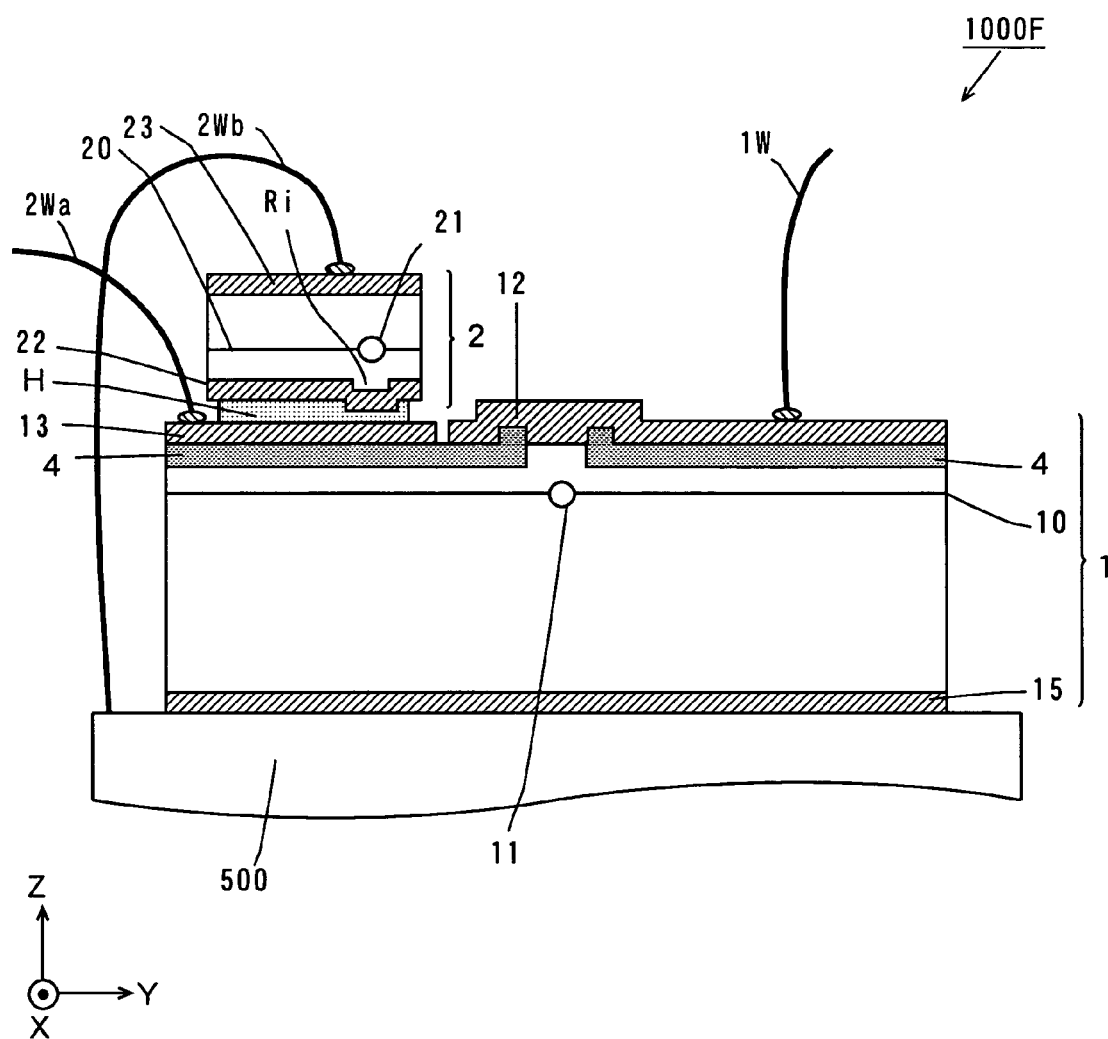

F I G. 4 0
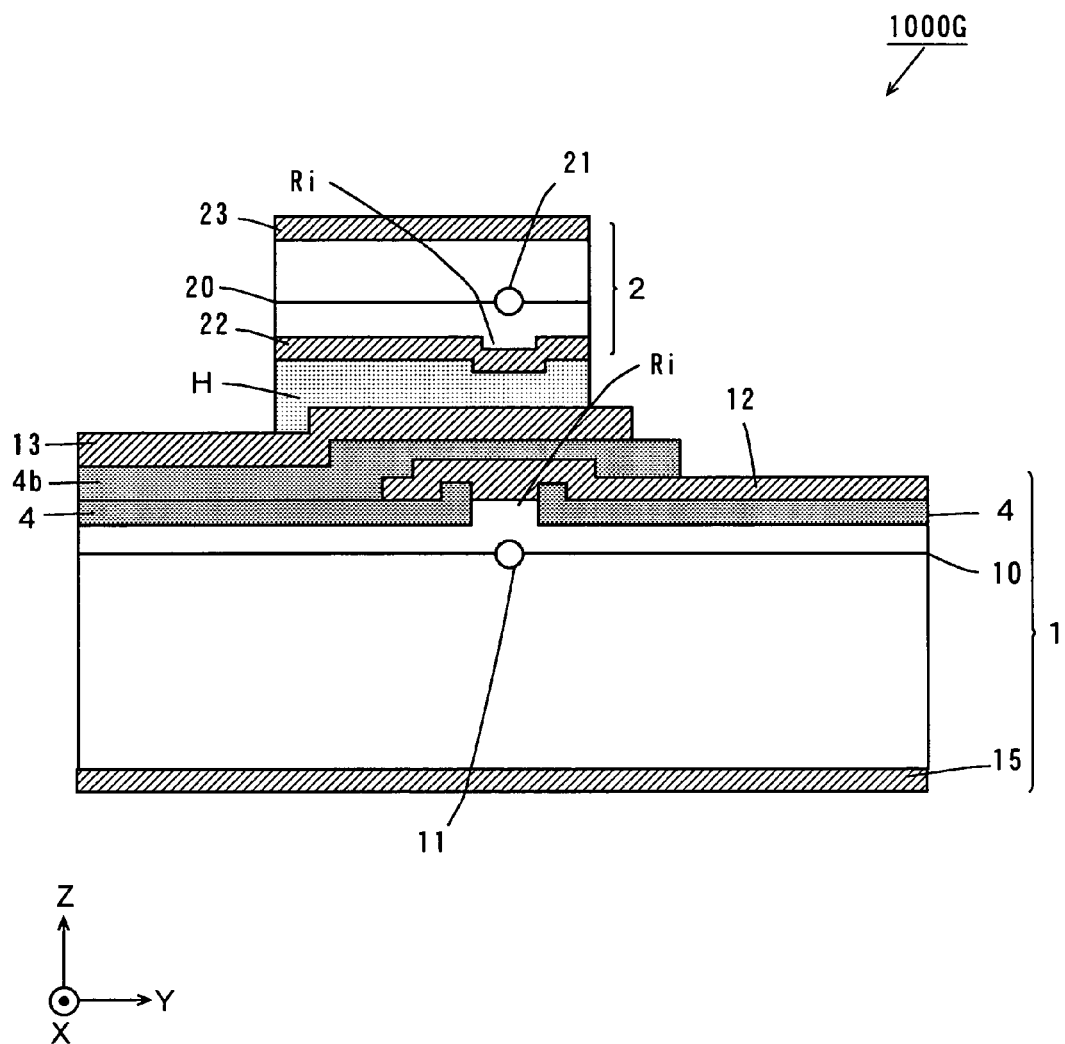

SEMICONDUCTOR LASER APPARATUS AND METHOD OF MANUFACTURING THE SAME

BACKGROUND OF THE INVENTION

1. Field of the Invention

The present invention relates to a semiconductor laser apparatus capable of emitting a plurality of light beams having different wavelengths and a method of manufacturing the same.

2. Description of the Background Art

A semiconductor laser device (infrared semiconductor laser device) emitting infrared light having a wavelength of about 780 nm has generally been applied to a CD (compact disk)/CD-R (compact disk-recordable) drive as a light source. Further, a semiconductor laser device (red semiconductor laser device) emitting red light having a wavelength of about 650 nm has been applied to a DVD (digital versatile disk) drive as a light source.

On the other hand, a DVD capable of recording and playback with blue-violet light having a wavelength of about 405 nm has recently been developed. In order to record and play this DVD, a DVD drive employing a semiconductor laser device (blue-violet semiconductor laser device) emitting the blue-violet light having the wavelength of about 405 nm has also been developed at the same time. This DVD drive requires compatibility with respect to the conventional CD/CD-R and the conventional DVD.

In this case, compatibility with respect to the conventional CD, the conventional DVD and a new DVD is implemented by a method of providing the DVD drive with a plurality of optical pickups emitting infrared light, red light and blue-violet light respectively or a method of providing an infrared semiconductor laser device, a red semiconductor laser device and a blue-violet semiconductor laser device in a single optical pickup. According to this method, however, the number of components is so increased that it is difficult to downsize the DVD drive, simplify the structure thereof and reduce the cost therefor.

In order to prevent such increase of the number of components, a semiconductor laser device formed by integrating an infrared semiconductor laser device and a red semiconductor laser device into one chip is put into practice.

However, while the infrared semiconductor laser device and the red semiconductor laser device formed on GaAs substrates can be integrated into one chip, it is extremely difficult to integrate a blue-violet semiconductor laser device not formed on a GaAs substrate with the infrared and red semiconductor laser devices into one chip.

Therefore, a light-emitting device having a structure obtained by preparing a monolithic red/infrared semiconductor laser device by forming an infrared semiconductor laser device and a red semiconductor laser device on the same chip, forming a blue-violet semiconductor laser device on another chip and thereafter stacking this chip of the blue-violet semiconductor laser device and the chip of the monolithic red/infrared semiconductor laser device with each other is proposed (refer to JP 2001-230502A, for example).

In the aforementioned light-emitting device, however, the infrared and blue-violet semiconductor laser devices share a common electrode in structure, and hence it is difficult to individually apply arbitrary voltages to the infrared semiconductor laser device, the red semiconductor laser device and the blue-violet semiconductor laser device respectively by a driving circuit. Therefore, the structure of the driving circuit has low flexibility, leading to a complicated structure.

Particularly in the aforementioned light-emitting device, a p-side electrode of the infrared semiconductor laser device and an n-side electrode of the blue-violet semiconductor laser device are electrically connected with each other with a bonding layer sandwiched therebetween. Thus, the driving system for the infrared semiconductor laser device and the blue-violet semiconductor laser device is inevitably limited. For example, the infrared semiconductor laser device and the blue-violet semiconductor laser device cannot be driven by a common-cathode driving system connecting n-side electrodes of the three devices in common or an anode-common driving system connecting three p-side electrodes in common.

SUMMARY OF THE INVENTION

An object of the present invention is to provide a semiconductor laser apparatus having a plurality of semiconductor laser devices, in which the plurality of semiconductor laser devices can be driven by various driving systems, and a method of manufacturing the same.

A semiconductor laser apparatus according to an aspect of the present invention comprises a first semiconductor laser device having a first semiconductor layer emitting a light beam of a first wavelength on a first substrate, a second semiconductor laser device having a second semiconductor layer emitting a light beam of a second wavelength on a second substrate and a third semiconductor laser device having a third semiconductor layer emitting a light beam of a third wavelength on a third substrate, wherein the first, second and third wavelengths are different from each other, at least one of the second and third substrates is composed of a material different from that of the first substrate, the first semiconductor laser device has a first electrode on a first surface thereof, the second semiconductor laser device has a first electrode on a first surface thereof, the third semiconductor laser device has a first electrode on a first surface thereof, the first electrode of the second semiconductor laser device and the first electrode of the third semiconductor laser device are bonded to the first surface of the first semiconductor laser device with an insulating film sandwiched therebetween, and the first electrode of the first semiconductor laser device, the first electrode of the second semiconductor laser device and the first electrode of the third semiconductor laser device are electrically isolated from each other.

In this semiconductor laser apparatus, the first electrode of the second semiconductor laser device and the first electrode of the third semiconductor laser device are bonded to the first surface of the first semiconductor laser device with the insulating film sandwiched therebetween, and the first electrode of the first semiconductor laser device, the first electrode of the second semiconductor laser device and the first electrode of the third semiconductor laser device are electrically isolated from each other. Thus, arbitrary voltages can be supplied to the first electrodes of the first, second and third semiconductor laser devices respectively. Therefore, the driving system for the first, second and third semiconductor laser devices can be arbitrarily selected.

The first electrode of the first semiconductor laser device may be formed on a surface of the first semiconductor layer, the first electrode of the second semiconductor laser device may be formed on a surface of the second semiconductor layer, and the first electrode of the third semiconductor laser device may be formed on a surface of the third semiconductor layer.

In this case, the first electrode of the second semiconductor laser device formed on the surface of the second semiconductor layer and the first electrode of the third semiconductor laser device formed on the surface of the third semiconductor layer are bonded to the surface of the first semiconductor laser device of the first semiconductor layer with the insulating film sandwiched therebetween.

Thus, the first, second and third semiconductor layers of the first, second and third semiconductor laser devices are positioned so close to each other that the distances between emission points of the first, second and third semiconductor laser devices are short. Thus, the emission points of the first, second and third semiconductor laser devices can be closer to the center of the semiconductor laser apparatus.

Therefore, a common optical system can be employed for the light beams emitted from the emission points of the first, second and third semiconductor laser devices respectively. Consequently, the first, second and third semiconductor laser devices are improved in light extraction efficiency when the light beams emitted from the emission points are condensed through a lens.

Further, the emission points of the first, second and third semiconductor laser devices are so close to each other that the light beams emitted from the emission points of the first, second and third semiconductor laser devices can pass through the center of a common lens. Thus, optical aberration resulting from passage of the light beams through the lens is reduced to require no component for correcting such optical aberration. Consequently, the semiconductor laser apparatus can be downsized and reduced in cost.

The first electrode of the first semiconductor laser device may extend between at least one of the second and third semiconductor laser devices and the first semiconductor laser device and project from a side surface of at least one of the second and third semiconductor laser devices.

In this case, the first electrode of the first semiconductor laser device projects from the side surface of at least one of the second and third semiconductor laser devices, whereby the first electrode of the first semiconductor laser device projecting from the side surface of at least one of the second and third semiconductor laser devices can be wired when the first electrode between the second and third semiconductor laser devices is hard to wire. Thus, the flexibility in wiring is increased.

When the first substrate is a nitride-based semiconductor substrate and the second and third substrates are gallium arsenide-based semiconductor substrates, the second and third substrates are superior in processability to the first substrate.

Therefore, the first electrode of the first semiconductor laser device can be easily exposed on the first surface of the first semiconductor laser device in the semiconductor laser apparatus by partially removing the easily processable second and third substrates.

Consequently, the first electrode of the first semiconductor laser device can be wired on the first surface of the first semiconductor laser device in the semiconductor laser apparatus in the prepared semiconductor laser apparatus. Thus, the semiconductor laser apparatus can be easily wired.

The first electrode of at least one of the second and third semiconductor laser devices may extend between at least one of the second and third semiconductor laser devices and the first semiconductor laser device and project from a side surface of at least one of the second and third semiconductor laser devices.

In this case, the first electrode of at least one of the second and third semiconductor laser devices projecting from the side surface of at least one of the second and third semiconductor laser devices can be wired. Thus, the flexibility in wiring is increased. Further, the first electrode of at least one of the second and third semiconductor laser devices can be reliably and easily wire-bonded, and the wiring is simplified.

A portion of the first electrode of at least one of the second and third semiconductor laser devices projecting from the side surface of at least one of the second and third semiconductor laser devices may be formed on the first surface of the first semiconductor laser device.

In this case, the first electrode of at least one of the second and third semiconductor laser devices projecting from the side surface of at least one of the second and third semiconductor laser devices can be wired on the first surface of the first semiconductor laser device. Thus, the flexibility in wiring is increased. Further, the first electrode of at least one of the second and third semiconductor laser devices can be reliably and easily wire-bonded, and the wiring is simplified.

When the first substrate is a nitride-based semiconductor substrate and the second and third substrates are gallium arsenide-based semiconductor substrates, the second and third substrates are superior in processability to the first substrate.

Therefore, the first electrode of at least one of the second and third semiconductor laser devices can be easily exposed on the first surface of the first semiconductor laser device in the semiconductor laser apparatus by partially removing the easily processable second substrate.

Consequently, the first electrode of at least one of the second and third semiconductor laser devices can be wired on the first surface of the first semiconductor laser device in the semiconductor laser apparatus in the prepared semiconductor laser apparatus. Thus, the semiconductor laser apparatus can be easily wired.

Both of the first electrode of the first semiconductor laser device and the first electrode of at least one of the second and third semiconductor laser devices may extend between at least one of the second and third semiconductor laser devices and the first semiconductor laser device and project from a same side surface of at least one of the second and third semiconductor laser devices.

In this case, the first electrode of the first semiconductor laser device and the first electrode of at least one of the second and third semiconductor laser devices project from the same side surface of at least one of the second and third semiconductor laser devices, whereby the first electrode of the first semiconductor laser device and the first electrode of at least one of the second and third semiconductor laser devices can be wired on substantially identical positions on the first surface of the first semiconductor laser device in the direction perpendicular to the side surfaces of at least one of the second and third semiconductor laser devices and parallel to the first surface of the first substrate.

Thus, a region for wiring can be reduced in the semiconductor laser apparatus. Further, the size of the first semiconductor laser device can be reduced in a direction perpendicular to the side surfaces of at least one of the second and third semiconductor laser devices and parallel to a first surface of the first substrate. Consequently, the semiconductor laser apparatus can be downsized.

A portion of the first electrode of the first semiconductor laser device projecting from the side surface of the at least one of the second and third semiconductor laser devices may be at least partially exposed on a first region of the first surface of the first semiconductor laser device on the side of at least one of the second and third semiconductor laser devices, and a portion of the first electrode of the at least one of the second and third semiconductor laser devices projecting from the side surface of the at least one of the second and third semiconductor laser devices may be at least partially exposed on the first region.

In this case, the portion of the first electrode of the first semiconductor laser device projecting from the side surface of at least one of the second and third semiconductor laser devices is at least partially exposed on the first region of the first surface of the first semiconductor laser device on the side of at least one of the second and third semiconductor laser devices. Thus, the exposed portion of the first electrode of the first semiconductor laser device can be wired on the first region.

Further, the portion of the first electrode of at least one of the second and third semiconductor laser devices projecting from the side surface of at least one of the second and third semiconductor laser devices is at least partially exposed on the first region. Thus, the exposed portion of the first electrode of at least one of the second and third semiconductor laser devices can be wired on the first region.

Each of the second and third semiconductor laser devices may have a cavity extending in one direction and side surfaces along the longitudinal direction of the cavity, and the first region may include a second region in which the first electrode of the first semiconductor laser device is at least partially exposed and a third region in which the first electrode of the at least one of the second and third semiconductor laser devices is at least partially exposed, and wherein the second and third regions may be arranged along a direction parallel to the respective side surfaces of the second and third semiconductor laser devices.

In this case, both of the first electrode of the first semiconductor laser device and the first electrode of at least one of the second and third semiconductor laser devices can be partially exposed on the first surface of the first semiconductor laser device along the direction parallel to the side surfaces of the second and third semiconductor laser devices.

Thus, the first electrode of the first semiconductor laser device and the first electrode of at least one of the second and third semiconductor laser devices can be wired on substantially identical positions on the first surface of the first semiconductor laser device in the direction perpendicular to the side surfaces of at least one of the second and third semiconductor laser devices and parallel to the first surface of the first substrate. Therefore, the region for wiring can be reduced in the semiconductor laser apparatus.

Further, the size of the first semiconductor laser device can be reduced in the direction perpendicular to the side surfaces of the second and third semiconductor laser devices. Thus, the semiconductor laser apparatus can be downsized.

The portion of the first electrode of at least one of the second and third semiconductor laser devices projecting from the side surface of at least one of the second and third semiconductor laser devices may be formed on the portion of the first electrode of the first semiconductor laser device projecting from the side surface of at least one of the second and third semiconductor laser devices with the insulating film sandwiched therebetween.

In this case, the portions of the first electrode of the first semiconductor laser device and the first electrode of at least one of the second and third semiconductor laser devices projecting from the side surface of at least one of the second and third semiconductor laser devices are electrically isolated from each other through the insulating film.

The insulating film may be formed such that the first electrode of the first semiconductor laser device is at least partially exposed on the portion of the first electrode of the first semiconductor laser device projecting from the side surface of at least one of the second and third semiconductor laser devices. In this case, the partially exposed portion of the first electrode of the first semiconductor laser device can be wire-bonded.

The second substrate and the third substrate may be formed by a common substrate, the second semiconductor layer and the third semiconductor layer may be formed on the common substrate to be isolated from each other, and the second semiconductor laser device and the third semiconductor laser device may have a common second electrode formed on the common substrate.

In this case, the second and third semiconductor laser devices are so formed on the common substrate that the second and third semiconductor laser devices are easily bonded to the first semiconductor laser device.

Further, the second and third semiconductor laser devices are easily wired through the common second electrode of the second and third semiconductor laser devices.

The second semiconductor laser device may have a second electrode on a surface opposite to a junction with the first semiconductor laser device, and the third semiconductor laser device may have a second electrode on a surface opposite to a junction with the first semiconductor laser device.

In this case, the second electrodes of the second and third semiconductor laser devices are positioned on the surfaces opposite to the first semiconductor laser device, whereby the second electrodes of the second and third semiconductor laser devices can be wired from the same side as the first electrode of the first semiconductor laser device.

The total thickness of the second substrate and the second semiconductor layer in the second semiconductor laser device and/or the total thickness of the third substrate and the third semiconductor layer in the third semiconductor laser device may be smaller than the total thickness of the first substrate and the first semiconductor layer in the first semiconductor laser device.

In this case, strain in the first substrate and the first semiconductor layer is reduced in the first semiconductor laser device. Thus, the wavelength and emission efficiency of the light beam emitted from the first semiconductor laser device are stabilized.

The first semiconductor laser device may have an emission point emitting a light beam in a first direction parallel to a first surface of the first substrate, the second semiconductor laser device may have an emission point emitting a light beam in the first direction, and the third semiconductor laser device may have an emission point emitting a light beam in the first direction.

Further, the emission point of the second semiconductor laser device may be formed on a position closer to the emission point of the first semiconductor laser device than the center of the second semiconductor layer in a second direction parallel to the first surface of the first substrate and perpendicular to the first direction, and the emission point of the third semiconductor laser device may be formed on a position closer to the emission point of the first semiconductor laser device than the center of the third semiconductor layer in the second direction parallel to the first surface of the first substrate and perpendicular to the first direction.

In this case, the first semiconductor laser device emits the light beam from the emission point in the first direction parallel to the first surface of the first substrate. Further, the second semiconductor laser device emits the light beam from the emission point formed on the position closer to the emission point of the first semiconductor laser device than the center of the second semiconductor layer in the first direction parallel to the first surface of the first substrate. In addition, the third semiconductor laser device emits the light beam from the emission point formed on the position closer to the emission point of the first semiconductor laser device than the center of the third semiconductor layer in the first direction parallel to the first surface of the first substrate.

Thus, the distances between the emission points of the first, second and third semiconductor laser devices are so short that all of the emission points of the first, second and third semiconductor laser devices can be closer to the center of the semiconductor laser apparatus. Therefore, a common optical system can be employed for the light beams emitted from the emission points of the first, second and third semiconductor laser devices respectively. Consequently, the first, second and third semiconductor laser devices are improved in light extraction efficiency when the light beams emitted from the emission points are condensed through a lens.

Further, the emission points of the first, second and third semiconductor laser devices are so close to each other that the light beams emitted from the emission points of the first, second and third semiconductor laser devices can pass through the center of a common lens. Thus, optical aberration resulting from passage of the light beams through the lens is reduced to require no component for correcting such optical aberration. Consequently, the semiconductor laser apparatus can be downsized and reduced in cost.

A wire may be connected to a position of the first electrode of the second semiconductor laser device, which is opposite to the third semiconductor laser device, in a direction parallel to a first surface of the first substrate and perpendicular to a light-emitting direction and/or a position of the first electrode of the third semiconductor laser device, which is opposite to the second semiconductor laser device, in the direction parallel to the first surface of the first substrate and perpendicular to the light-emitting direction.

Thus, the first electrode of the second semiconductor laser device and/or the first electrode of the third semiconductor laser device can be reliably and easily wire-bonded. Further, wiring is simplified.

A semiconductor laser apparatus according to another aspect of the present invention comprises a first semiconductor laser device having a first semiconductor layer emitting a light beam of a first wavelength on a first substrate and a second semiconductor laser device having a second semiconductor layer emitting a light beam of a second wavelength on a second substrate, wherein the first and second wavelengths are different from each other, the second substrate is composed of a material different from that of the first substrate, the first semiconductor laser device has a first electrode on a first surface thereof, the second semiconductor laser device has a first electrode on a first surface thereof, the first electrode of the second semiconductor laser device is bonded to the first surface of the first semiconductor laser device with an insulating film sandwiched therebetween, and the first electrode of the first semiconductor laser device and the first electrode of the second semiconductor laser device are electrically isolated from each other.

In this semiconductor laser apparatus, the first electrode of the second semiconductor laser device is bonded to the first surface of the first semiconductor laser device with the insulating film sandwiched therebetween, and the first electrodes of the first and second semiconductor laser devices are electrically isolated from each other. Thus, arbitrary voltages can be supplied to the first electrodes of the first and second semiconductor laser devices respectively. Therefore, the driving system for the first and second semiconductor laser devices can be arbitrarily selected.

When the first substrate is a nitride-based semiconductor substrate and the second substrate is a gallium arsenide-based semiconductor substrate, the second substrate is superior in processability to the first substrate.

Therefore, the first electrode of the first semiconductor laser device can be easily exposed on the first surface of the first semiconductor laser device in the semiconductor laser apparatus by partially removing the easily processable second substrate.

Consequently, the first electrode of the first semiconductor laser device can be wired on the first surface of the first semiconductor laser device in the semiconductor laser apparatus in the prepared semiconductor laser apparatus. Thus, the semiconductor laser apparatus can be easily wired.

The first electrode of the first semiconductor laser device may extend between the first semiconductor laser device and the second semiconductor laser device and project from a side surface of the second semiconductor laser device.

In this case, the first electrode of the first semiconductor laser device projecting from the side surface of the second semiconductor laser device can be wired. Thus, the flexibility of wiring is increased. Further, the first electrode of the first semiconductor laser device can be reliably and easily wire-bonded, and the wiring is simplified.

The first electrode of the second semiconductor laser device may extend between the first semiconductor laser device and the second semiconductor laser device and project from a side surface of the second semiconductor laser device.

In this case, the first electrode of the second semiconductor laser device projecting from the side surface of the second semiconductor laser device can be wired. Thus, the flexibility of wiring is increased. Further, the first electrode of the second semiconductor laser device can be reliably and easily wire-bonded, and the wiring is simplified.

A portion of the first electrode of the second semiconductor laser device projecting from the side surface of the second semiconductor laser device may be formed on the first surface of the first semiconductor laser device.

In this case, the first electrode of the second semiconductor laser device projecting from the side surface of the second semiconductor laser device can be wired. Thus, the flexibility of wiring is increased. Further, the first electrode of the second semiconductor laser device can be reliably and easily wire-bonded, and the wiring is simplified.

When the first substrate is a nitride-based semiconductor substrate and the second substrate is a gallium arsenide-based semiconductor substrate, the second substrate is superior in processability to the first substrate.

Therefore, the first electrode of the second semiconductor laser device can be easily exposed on the first surface of the first semiconductor laser device in the semiconductor laser apparatus by partially removing the easily processable second substrate.

Consequently, the first electrode of the second semiconductor laser device can be wired on the first surface of the first semiconductor laser device in the semiconductor laser apparatus in the prepared semiconductor laser apparatus. Thus, the semiconductor laser apparatus can be easily wired.

Both of the first electrodes of the first and second semiconductor laser devices may extend between the first semiconductor laser device and the second semiconductor laser device and project from a same side surface of the second semiconductor laser device.

In this case, the first electrodes of the first and second semiconductor laser devices project from the same side surface of the second semiconductor laser device, whereby the first electrodes of the first and second semiconductor laser devices can be wired on substantially identical positions on the first surface of the first semiconductor laser device in the direction perpendicular to the side surfaces of the second semiconductor laser device and parallel to the first surface of the first substrate. Thus, a region for wiring can be reduced in the semiconductor laser apparatus. Further, the size of the first semiconductor laser device can be reduced in a direction perpendicular to the side surfaces of the second semiconductor laser device and parallel to the first surface of the first substrate. Thus, the semiconductor laser device can be downsized.

A portion of the first electrode of the first semiconductor laser device projecting from the side surface of the second semiconductor laser device may be at least partially exposed on a first region of the first surface of the first semiconductor laser device on the side of the second semiconductor laser device, and a portion of the first electrode of the second semiconductor laser device projecting from the side surface of the second semiconductor laser device may be at least partially exposed on the first region.

In this case, the portion of the first electrode of the first semiconductor laser device projecting from the side surface of the second semiconductor laser device is at least partially exposed on the first region of the first surface of the first semiconductor laser device on the side of the second semiconductor laser device. Thus, the exposed portion of the first electrode of the first semiconductor laser device can be wired on the first region.

Further, a portion of the first electrode of the second semiconductor laser device projecting from the side surface of the second semiconductor laser device is at least partially exposed on the first region. Thus, the exposed portion of the first electrode of the second semiconductor laser device can be wired on the first region.

The second semiconductor laser device may have a cavity extending in one direction and side surfaces along the longitudinal direction of the cavity, and the first region may include a second region in which the first electrode of the first semiconductor laser device is at least partially exposed and a third region in which the first electrode of the second semiconductor laser device is at least partially exposed, and wherein the second and third regions may be arranged along a direction parallel to the side surfaces of the second semiconductor laser device.

In this case, both of the first electrodes of the first and second semiconductor laser devices can be partially exposed on the first surface of the first semiconductor laser device along the direction parallel to the side surfaces of the second semiconductor laser device. Thus, the first electrodes of the first and second semiconductor laser devices can be wired on substantially identical positions on the first surface of the first semiconductor laser device in the direction perpendicular to the side surfaces of the second semiconductor laser device and parallel to the first surface of the first substrate. Therefore, a region for wiring can be reduced in the semiconductor laser apparatus. Further, the size of the first semiconductor laser device can be reduced in the direction perpendicular to the side surfaces of the second semiconductor laser device. Consequently, the semiconductor laser apparatus can be downsized.

The portion of the first electrode of the second semiconductor laser device projecting from the side surface of the second semiconductor laser device may be formed on the portion of the first electrode of the first semiconductor laser device projecting from the side surface of the second semiconductor laser device with the insulating film sandwiched therebetween.

In this case, the portions of the first electrodes of the first and second semiconductor laser devices projecting from the side surface of the second semiconductor laser device are electrically isolated from each other through the insulating film.

The insulating film may be formed such that the first electrode of the first semiconductor laser device is at least partially exposed on the portion of the first electrode of the first semiconductor laser device projecting from the side surface of the second semiconductor laser device. In this case, the partially exposed portion of the first electrode of the first semiconductor laser device can be wire-bonded.

The first electrode of the first semiconductor laser device may be formed on a surface of the first semiconductor layer. Further, the first electrode of the second semiconductor laser device may be formed on a surface of the second semiconductor layer.

In this case, the first electrode of the second semiconductor laser device formed on the surface of the second semiconductor layer is bonded to the surface of the first semiconductor layer of the first semiconductor laser device with the insulating film sandwiched therebetween.

Thus, the first and second semiconductor layers of the first and second semiconductor laser devices are positioned so close to each other that the distance between emission points of the first and second semiconductor laser devices is short. Thus, both of the emission points of the first and second semiconductor laser devices can be closer to the center of the semiconductor laser apparatus.

Therefore, a common optical system can be employed for the light beams emitted from the emission points of the first and second semiconductor laser devices respectively. Consequently, the first and second semiconductor laser devices are improved in light extraction efficiency when the light beams emitted from the emission points are condensed through a lens.

Further, the emission points of the first and second semiconductor laser devices are so close to each other that the light beams emitted from the emission points of the first and second semiconductor laser devices can pass through the center of a common lens. Thus, optical aberration resulting from passage of the light beams through the lens is reduced to require no component for correcting such optical aberration. Consequently, the semiconductor laser apparatus can be downsized and reduced in cost.

The second semiconductor laser device may have a second electrode on a surface opposite to a junction with the first semiconductor laser device. In this case, the second electrode of the second semiconductor laser device is so positioned on the surface opposite to the first semiconductor laser device that the second electrode of the second semiconductor laser device can be wired from the same side as the first electrode of the first semiconductor laser device.

The total thickness of the second substrate and the second semiconductor layer in the second semiconductor laser device may be smaller than the total thickness of the first substrate and the first semiconductor layer in the first semiconductor laser device.

In this case, strain in the first substrate and the first semiconductor layer is reduced in the first semiconductor laser device. Thus, the wavelength and emission efficiency of the light beam emitted from the first semiconductor laser device are stabilized.

The first semiconductor laser device may have an emission point emitting a light beam in a first direction parallel to the first surface of the first substrate. In this case, the first semiconductor laser device emits the light beam from the emission point in the first direction parallel to the first surface of the first substrate.

The second semiconductor laser device may have an emission point emitting a light beam in the first direction. In this case, the second semiconductor laser device emits the light beam from the emission point in the first direction parallel to the first surface of the first substrate.

The first semiconductor laser device may have an emission point emitting a light beam in a first direction parallel to the first surface of the first substrate, the second semiconductor laser device may have an emission point emitting a light beam in the first direction, and the emission points of the first and second semiconductor laser devices may be arranged to substantially coincide with each other in a second direction parallel to the first surface of the first substrate and perpendicular to the first direction.

In this case, the first semiconductor laser device emits the light beam from the emission point in the first direction parallel to the first surface of the first substrate. Further, the second semiconductor laser device emits the light beam in the first direction from the emission point arranged to substantially coincide with the emission point of the first semiconductor laser device in the second direction.

Thus, the emission points of the first and second semiconductor laser devices are substantially coaxial with each other in the second direction, whereby the distance between the emission points of the first and second semiconductor laser devices can be reduced.

The distance between the emission points of the first and second semiconductor laser devices is so reduced that both of the emission points of the first and second semiconductor laser devices can be closer to the center of the semiconductor laser apparatus. Thus, a common optical system can be employed for the light beams emitted from the emission points of the first and second semiconductor laser devices respectively. Consequently, both of the first and second semiconductor laser devices are improved in light extraction efficiency when the light beams emitted from the emission points are condensed through a lens.

Further, the emission points of the first and second semiconductor laser devices are so rendered closer to each other that the light beams emitted from the emission points of the first and second semiconductor laser devices can pass through the center of a common lens. Thus, optical aberration resulting from passage of the light beams through the lens is reduced to require no component for correcting such optical aberration. Consequently, an optical system such as an optical pickup can be downsized and reduced in cost.

In addition, the emission points of the first and second semiconductor laser devices are substantially positioned on a line, so that the semiconductor laser apparatus and an optical pickup comprising the same can be easily designed.

The first semiconductor laser device may have an emission point emitting a light beam in a first direction parallel to the first surface of the first substrate, the second semiconductor laser device may have an emission point emitting a light beam in the first direction, and the emission point of the second semiconductor laser device may be formed on a position closer to the emission point of the first semiconductor laser device than the center of the second semiconductor layer in a second direction parallel to the first surface and perpendicular to the first direction.

In this case, the first semiconductor laser device emits the light beam from the emission point in the first direction parallel to the first surface of the first substrate. Further, the second semiconductor laser device emits the light beam from the emission point formed on the position closer to the emission point of the first semiconductor laser device than the center of the second semiconductor layer in the first direction parallel to the first surface of the first substrate.

Thus, the distance between the emission points of the first and second semiconductor laser devices is so short that both of the emission points of the first and second semiconductor laser devices can be closer to the center of the semiconductor laser apparatus. Therefore, a common optical system can be employed for the light beams emitted from the emission points of the first and second semiconductor laser devices respectively. Consequently, both of the first and second semiconductor laser devices are improved in light extraction efficiency when the light beams emitted from the emission points are condensed through a lens.

Further, the emission points of the first and second semiconductor laser devices are so close to each other that the light beams emitted from the emission points of the first and second semiconductor laser devices can pass through the center of a common lens. Thus, optical aberration resulting from passage of the light beams through the lens is reduced to require no component for correcting such optical aberration. Consequently, an optical system such as an optical pickup can be downsized and reduced in cost.

A wire may be connected to a position of the first electrode on a side of the second semiconductor laser device in a direction parallel to the first surface of the first substrate and perpendicular to a light-emitting direction. Thus, the first electrode of the second semiconductor laser device can be reliably and easily wire-bonded. Further, wiring is simplified.

The first substrate may be a translucent substrate. The translucent substrate has such transmittance and thickness that the second semiconductor laser device or the second and third semiconductor laser devices are viewable through the first substrate. In this case, the second semiconductor laser device or the second and third semiconductor laser devices are viewable through the first substrate formed by the translucent substrate when the second semiconductor laser device or the second and third semiconductor laser devices are bonded to the first surface of the first semiconductor laser device. Thus, the second semiconductor laser device or the second and third semiconductor laser devices can be easily aligned. Consequently, the bonded position(s) can be correctly adjusted. Therefore, accuracy of alignment of the emission points of the first and second semiconductor laser devices or the first, second and third semiconductor laser devices can be improved.

The first semiconductor layer may be composed of a nitride-based semiconductor. In this case, the first semiconductor layer is so composed of the nitride-based semiconductor having high thermal conductivity that the first semiconductor layer of the first semiconductor laser device is improved in heat dissipativity. Thus, the first semiconductor laser device is improved in temperature characteristic as well as in reliability.

The first semiconductor laser device may have a ridge on the first surface, and the insulating film may be formed on a side surface of the ridge. In this case, the insulating film electrically isolates the first electrodes of the first and second semiconductor laser devices or the first, second and third semiconductor laser devices from each other, and narrows a current to the ridge.

A method of manufacturing a semiconductor laser apparatus according to still another aspect of the present invention is a method of manufacturing a semiconductor laser apparatus capable of emitting light beams of a plurality of wavelengths, and comprises steps of preparing a first semiconductor laser device having a first semiconductor layer emitting a light beam of a first wavelength on a translucent and conductive first growth substrate, preparing a second semiconductor laser device having a second semiconductor layer emitting a light beam of a second wavelength and a third semiconductor laser device having a third semiconductor layer emitting a light beam of a third wavelength on a second growth substrate composed of a material different from that of the first growth substrate, preparing a stacked substrate by bonding the second growth substrate formed with the second and third semiconductor laser devices onto the first growth substrate formed with the first semiconductor laser device and forming a semiconductor laser apparatus having the first, second and third semiconductor laser devices by cleaving the stacked substrate.

In this method of manufacturing a semiconductor laser apparatus, the first semiconductor laser device having the first semiconductor layer emitting the light beam of the first wavelength is prepared on the first growth substrate, and the second semiconductor laser device having the second semiconductor layer emitting the light beam of the second wavelength and the third semiconductor laser device having the third semiconductor layer emitting the light beam of the third wavelength are prepared on the second growth substrate.

The second growth substrate formed with the second and third semiconductor laser devices is bonded onto the first growth substrate formed with the first semiconductor laser device for preparing the stacked substrate, and the semiconductor laser apparatus having the first, second and third semiconductor laser devices is formed by cleaving the stacked substrate.

Thus, the semiconductor laser apparatus having the first, second and third semiconductor laser devices can be obtained by cleaving the stacked substrate formed by the first and second growth substrates, whereby the first and second growth substrates may not be individually cleaved but the manufacturing steps are simplified.

The translucent first growth substrate has such transmittance and thickness that the second and third semiconductor laser devices are viewable through the first growth substrate.

Thus, the first growth substrate is so translucent that the positions of the second and third semiconductor laser devices can be confirmed through the first growth substrate when the second growth substrate is bonded onto the first growth substrate.

Thus, the first, second and third semiconductor laser devices can be so easily aligned that accuracy of alignment of the first, second and third semiconductor laser devices are improved.

In particular, the first, second and third semiconductor laser devices have emission points emitting the light beams of the first, second and third wavelengths respectively. The accuracy of alignment of the first, second and third semiconductor laser devices are improved as described above, whereby the accuracy of alignment of an emission point of the prepared semiconductor laser apparatus is improved.

The first substrate has electric conductivity. When the first semiconductor laser device on the first growth substrate is bonded to the second and third semiconductor laser devices on the second growth substrate, a second electrode for driving the first semiconductor laser device can be provided on the first growth substrate.

Thus, it is not necessary to provide both of the first electrode and the second electrode for driving the first semiconductor laser device on the bonded surfaces of the first and second growth substrates. Consequently, the semiconductor laser apparatus is simplified in structure, and downsized.

When the semiconductor laser apparatus is assembled, further, the first growth substrate can be arranged on a stem. Consequently, the semiconductor laser apparatus is improved in heat dissipativity as well as in reliability when the first growth substrate has excellent thermal conductivity.

If the first growth substrate is composed of an insulating material, a step of removing the first growth substrate of the insulating material is required after the step of bonding the first and second growth substrates to each other in order to provide the second electrode for driving the first semiconductor laser device on the first growth substrate, leading to complication of the manufacturing steps. When the first growth substrate is removed, further, the first semiconductor laser device may be so damaged that the device characteristics are deteriorated.

In addition, the semiconductor laser apparatus must be assembled while increasing the thickness of the second growth substrate when the first growth substrate is removed. Consequently, the semiconductor laser apparatus is deteriorated in heat dissipativity and reduced in reliability if thermal conductivity of the second growth substrate is lower than that of the first growth substrate.

The method may further include a step of partially removing the second growth substrate after the step of preparing the stacked substrate, the step of preparing the first semiconductor laser device may include a step of forming the first electrode of the first semiconductor laser device on the first semiconductor layer, and the step of partially removing the second growth substrate may include partially removing the second growth substrate such that the first electrode of the first semiconductor laser device is partially exposed on the first growth substrate.

In this case, the first electrode of the first semiconductor laser device is formed on the first semiconductor layer in preparation of the first semiconductor laser device. Thereafter the second growth substrate is bonded onto the first electrode of the first semiconductor laser device, for preparing the stacked substrate.

After preparation of the stacked substrate, the second growth substrate is so partially removed as to partially expose the first electrode of the first semiconductor laser device.

When the first substrate is a nitride-based semiconductor substrate and the second substrate is a gallium arsenide-based semiconductor substrate, the second substrate is superior in processability to the first substrate.

Therefore, the first electrode of the first semiconductor laser device can be easily exposed on the side of the second growth substrate in the stacked substrate by partially removing the easily processable second substrate.

Consequently, the first electrode of the first semiconductor laser device can be wired on the first surface of the first semiconductor laser device in the semiconductor laser apparatus in the prepared semiconductor laser apparatus. Thus, the semiconductor laser apparatus can be easily wired.

The method may further include a step of partially removing the second growth substrate after the step of preparing the stacked substrate, the step of preparing the first semiconductor laser device may include a step of forming an insulating film on the first semiconductor layer and forming the first electrode of at least one of the second and third semiconductor laser devices on the insulating film, and the step of partially removing the second growth substrate may include an operation of partially removing the second growth substrate such that the first electrode of at least one of the second and third semiconductor laser devices is partially exposed on the first growth substrate.

In this case, the first electrode of at least one of the second and third semiconductor laser devices is formed on the first semiconductor layer with the insulating film sandwiched therebetween in preparation of the first semiconductor laser device. Thereafter the second growth substrate is bonded onto the first electrode of at least one of the second and third semiconductor laser devices formed on the insulating film, for preparing the stacked substrate.

After preparation of the stacked substrate, the second growth substrate is so partially removed as to partially expose the first electrode of at least one of the second and third semiconductor laser devices formed on the insulating film.

When the first growth substrate is a nitride-based semiconductor substrate and the second growth substrate is a gallium arsenide-based semiconductor substrate, the second growth substrate is superior in processability to the first growth substrate.

Therefore, the first electrode of at least one of the second and third semiconductor laser devices formed on the insulating film can be easily exposed on the side of the second growth substrate in the stacked substrate by partially removing the easily processable second growth substrate.

Consequently, the first electrode of at least one of the second and third semiconductor laser devices can be wired on the first surface of the first semiconductor laser device in the semiconductor laser apparatus in the prepared semiconductor laser apparatus. Thus, the semiconductor laser apparatus can be easily wired.

The step of preparing the first semiconductor laser device may include a step of forming a first cavity extending in a first direction and formed by the first semiconductor layer on the first growth substrate, the step of preparing the second and third semiconductor laser devices may include steps of forming a second cavity extending in the first direction and formed by the second semiconductor layer on the second growth substrate and forming a third cavity extending in the first direction and formed by the third semiconductor layer on the second growth substrate, the step of preparing the stacked substrate may include a step of bonding the second growth substrate onto the first growth substrate so that the first cavity is substantially parallel to the second and third cavities, and the step of forming the semiconductor laser apparatus may include a step of cleaving the first and second growth substrates along a second direction perpendicular to the first direction and thereafter cleaving at least the first growth substrate along the first direction.

In this case, the first cavity extending in the first direction is formed in the step of preparing the first semiconductor laser device, and the second and third cavities extending in the first direction are prepared in the step of preparing the second and third semiconductor laser devices. The second growth substrate is so bonded onto the first growth substrate that the first cavity is substantially parallel to the second and third cavities in the step of preparing the stacked substrate.

Further, the first and second growth substrates are cleaved along the second direction perpendicular to the first direction in the step of forming the semiconductor laser apparatus. Thus, the cavity facets of the first, second and third semiconductor laser devices are formed to be substantially parallel to each other.

Consequently, the light beams of the first, second and third wavelengths emitted from the first, second and third cavity facets respectively are substantially parallelized.

The step of forming the first cavity may include a step of forming a ridge extending in the first direction on the first semiconductor layer, the step of bonding the second growth substrate onto the first growth substrate may include a step of bonding the second growth substrate onto the first growth substrate so that the ridge is positioned between the second semiconductor layer and the third semiconductor layer, and the height of the ridge may be smaller than the height of the second and third semiconductor layers formed on the second growth substrate.

In this case, the ridge extending in the first direction is formed on the first semiconductor layer in the step of forming the first cavity. Further, the second growth substrate is so bonded onto the first growth substrate that the ridge is positioned between the second and third semiconductor layers when the first and second growth substrates are bonded to each other.

Further, the ridge is formed with the height smaller than the height of the second and third semiconductor layers formed on the second growth substrate. Thus, the ridge formed on the first growth substrate can be easily arranged between the second and third semiconductor layers when the first and second growth substrates are bonded to each other. Consequently, the first and second growth substrates can be easily bonded to each other.

The step of forming the first cavity may include a step of forming a ridge extending in the first direction on the first semiconductor layer, the step of bonding the second growth substrate onto the first growth substrate may include a step of bonding the second growth substrate onto the first growth substrate so that the ridge is positioned between the second semiconductor layer and the third semiconductor layer, and the width of the ridge in the second direction may be smaller than the distance between the second semiconductor layer and the third semiconductor layer in the second direction.

In this case, the ridge extending in the first direction is formed on the first semiconductor layer in the step of forming the first cavity. Further, the second growth substrate is so bonded onto the first growth substrate that the ridge is positioned between the second and third semiconductor layers when the first and second growth substrates are bonded to each other.

In addition, the ridge is formed with the width smaller than the distance between the second and third semiconductor layers in the second direction. Thus, the ridge formed on the first growth substrate can be easily arranged between the second and third semiconductor layers when the first and second growth substrates are bonded to each other. Consequently, the first and second growth substrates can be easily bonded to each other.

A method of manufacturing a semiconductor laser apparatus according to a further aspect of the present invention is a method of manufacturing a semiconductor laser apparatus capable of emitting light beams of a plurality of wavelengths, and comprises steps of preparing a first semiconductor laser device having a first semiconductor layer emitting a light beam of a first wavelength on a first growth substrate, preparing a second semiconductor laser device having a second semiconductor layer emitting a light beam of a second wavelength on a second growth substrate composed of a material different from that of the first growth substrate, preparing a stacked substrate by bonding the second growth substrate formed with the second semiconductor laser device onto the first growth substrate formed with the first semiconductor laser device and forming a semiconductor laser apparatus having the first and second semiconductor laser devices by cleaving the stacked substrate.

In this method of manufacturing a semiconductor laser apparatus, the first semiconductor laser device having the first semiconductor layer emitting the light beam of the first wavelength is prepared on the first growth substrate, and the second semiconductor laser device having the second semiconductor layer emitting the light beam of the second wavelength is prepared on the second growth substrate.

The second growth substrate formed with the second semiconductor laser device is bonded onto the first growth substrate formed with the first semiconductor laser device for preparing the stacked substrate, and the semiconductor laser apparatus having the first and second semiconductor laser devices is formed by cleaving the stacked substrate.

Thus, the semiconductor laser apparatus having the first and second semiconductor laser devices can be obtained by cleaving the stacked substrate formed by the first and second growth substrates, whereby the first and second growth substrates may not be individually cleaved but the manufacturing steps are simplified.

The first growth substrate may have electric conductivity. When the first semiconductor laser device on the first growth substrates is bonded to the second semiconductor laser device on the second growth substrate, a second electrode for driving the first semiconductor laser device can be provided on the first growth substrate.

Thus, it is not necessary to provide both of the first electrode and the second electrode for driving the first semiconductor laser device on the bonded surfaces of the first and second growth substrates. Consequently, the semiconductor laser apparatus is simplified in structure, and downsized.

When the semiconductor laser apparatus is assembled, further, the first growth substrate can be arranged on a stem. Consequently, the semiconductor laser apparatus is improved in heat dissipativity as well as in reliability when the first growth substrate has excellent thermal conductivity.

If the first growth substrate is composed of an insulating material, a step of removing the first growth substrate of the insulating material is required after the step of bonding the first and second growth substrates to each other in order to provide the second electrode for driving the first semiconductor laser device on the first growth substrate, leading to complication of the manufacturing steps. When the first growth substrate is removed, further, the first semiconductor laser device may be so damaged that the device characteristics are deteriorated.

In addition, the semiconductor laser apparatus must be assembled while increasing the thickness of the second growth substrate when the first growth substrate is removed. Consequently, the semiconductor laser apparatus is deteriorated in heat dissipativity and reduced in reliability if thermal conductivity of the second growth substrate is lower than that of the first growth substrate.

The first growth substrate maybe a translucent substrate. The translucent substrate has such transmittance and thickness that the second semiconductor laser device is viewable through the first growth substrate. In this case, the position of the second semiconductor laser device can be confirmed through the first growth substrate formed by the translucent substrate when the second growth substrate is bonded onto the first growth substrate.

Thus, the first and second semiconductor laser devices can be so easily positioned that the positions of the first and second semiconductor laser devices are improved in accuracy.

In particular, the first and second semiconductor laser devices have emission points emitting light beams of first and second wavelengths respectively. The accuracy of alignment of the first and second semiconductor laser devices are so improved as described above that the accuracy of alignment of an emission point of the prepared semiconductor laser apparatus is improved.

The method may further include a step of partially removing the second growth substrate after the step of preparing the stacked substrate, the step of preparing the first semiconductor laser device may include a step of forming the first electrode of the first semiconductor laser device on the first semiconductor layer, and the step of partially removing the second growth substrate may include partially removing the second growth substrate such that the first electrode of the first semiconductor laser device is partially exposed on the first growth substrate.

In this case, the first electrode of the first semiconductor laser device is formed on the first semiconductor layer in preparation of the first semiconductor laser device. Thereafter the second growth substrate is bonded onto the first growth substrate, for preparing the stacked substrate.

After preparation of the stacked substrate, the second growth substrate is so partially removed as to partially expose the first electrode of the first semiconductor laser device.

When the first growth substrate is a nitride-based semiconductor substrate and the second growth substrate is a gallium arsenide-based semiconductor substrate, the second growth substrate is superior in processability to the first growth substrate.

Therefore, the first electrode of the first semiconductor laser device can be easily exposed on the side of the second growth substrate in the stacked substrate by partially removing the easily processable second growth substrate.

Consequently, the first electrode of the first semiconductor laser device can be wired on the first surface of the first semiconductor laser device in the semiconductor laser apparatus in the prepared semiconductor laser apparatus. Thus, the semiconductor laser apparatus can be easily wired.

The method may further include a step of partially removing the second growth substrate after the step of preparing the stacked substrate, the step of preparing the first semiconductor laser device may include a step of forming an insulating film on the first semiconductor layer and forming the first electrode of the second semiconductor laser device on the insulating film, and the step of partially removing the second growth substrate may include an operation of partially removing the second growth substrate such that the first electrode of the second semiconductor laser device is partially exposed on the first growth substrate.

In this case, the first electrode of the second semiconductor laser device is formed on the first semiconductor layer with the insulating film sandwiched therebetween in preparation of the first semiconductor laser device. Thereafter the second growth substrate is bonded onto the first electrode of the second semiconductor laser device formed on the insulating film, for preparing the stacked substrate.

After preparation of the stacked substrate, the second growth substrate is so partially removed as to partially expose the first electrode of the second semiconductor laser device formed on the insulating film.

When the first growth substrate is a nitride-based semiconductor substrate and the second growth substrate is a gallium arsenide-based semiconductor substrate, the second growth substrate is superior in processability to the first growth substrate.

Therefore, the first electrode of the second semiconductor laser device formed on the insulating film can be easily exposed on the side of the second growth substrate in the stacked substrate by partially removing the easily processable second growth substrate.

Consequently, the first electrode of the second semiconductor laser device can be wired from the side of the second semiconductor laser device of the semiconductor laser apparatus in the prepared semiconductor laser apparatus. Thus, the semiconductor laser apparatus can be easily wired.

The method may further include a step of processing the second growth substrate into a prescribed thickness after the step of preparing the stacked substrate. In this case, the second growth substrate is processed into the prescribed thickness after preparation of the stacked substrate.

When the first growth substrate is a nitride-based semiconductor substrate and the second growth substrate is a gallium arsenide-based semiconductor substrate, the second growth substrate is superior in processability to the first growth substrate. Thus, the second growth substrate can be easily processed into the prescribed thickness.

Further, the thinly processed second growth substrate is easily cleavable. Thus, the stacked substrate is so easily cleavable that cavity facets of the first and second semiconductor laser devices can be easily formed. Further, flat cavity facets can be easily obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a) to 6(h) are schematic sectional views showing an exemplary method of manufacturing the semiconductor laser apparatus according to the first embodiment;

FIGS. 13(a) to 31 are process drawings for illustrating a specific method of manufacturing the semiconductor laser apparatus according to the first embodiment;

FIG. 34 is a diagram for illustrating preferable shapes of a blue-violet semiconductor laser device and a monolithic red/infrared semiconductor laser device in the third embodiment;

FIG. 35 is a schematic sectional view showing an exemplary semiconductor laser apparatus according to a fourth embodiment of the present invention;

FIG. 38 is a schematic sectional view of the semiconductor laser apparatus shown in FIG. 37 assembled on a stem;

FIG. 40 is a schematic diagram showing an exemplary semiconductor laser apparatus according to a seventh embodiment of the present invention;

DESCRIPTION OF THE PREFERRED EMBODIMENTS

Semiconductor laser apparatuses and methods of manufacturing the same according to embodiments of the present invention are now described.

First Embodiment

Figure 1:
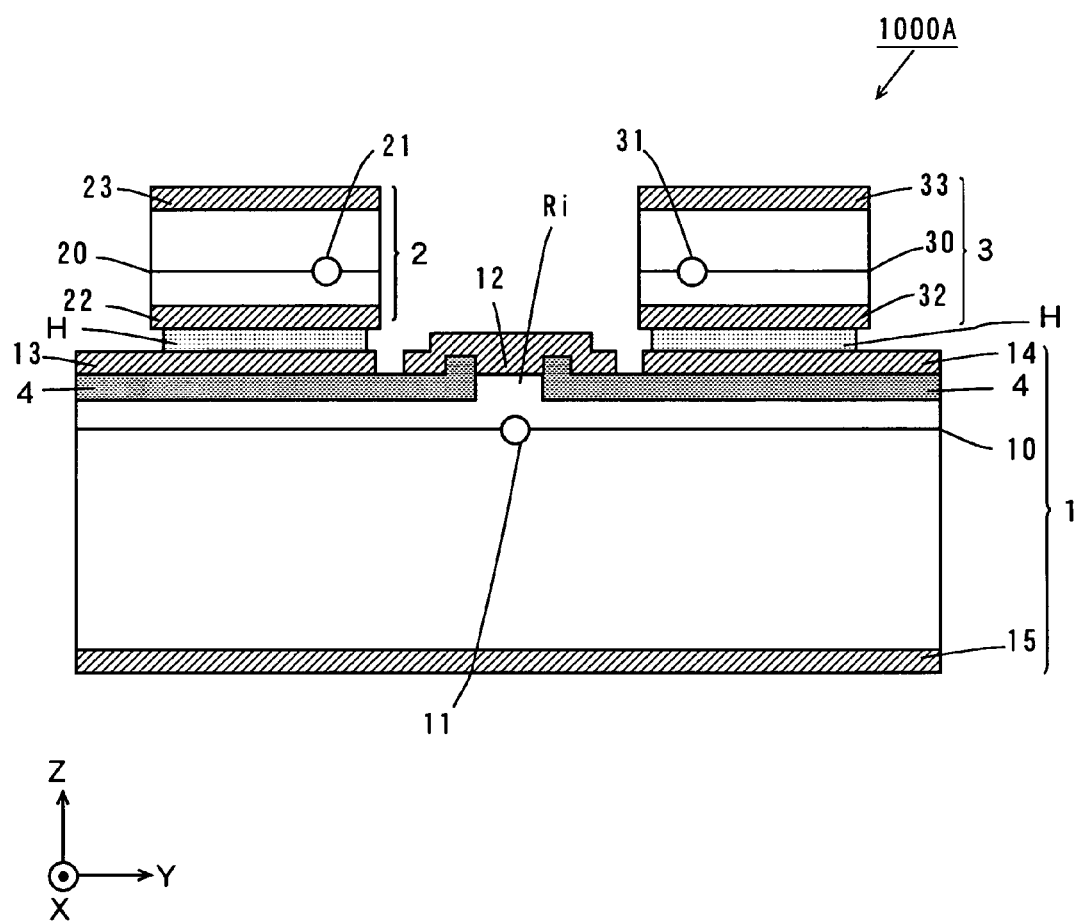
FIG. 1 is a schematic sectional view showing an exemplary semiconductor laser apparatus according to a first embodiment of the present invention.

FIG. 1 is a schematic sectional view showing an exemplary semiconductor laser apparatus 1000A according to a first embodiment of the present invention.

The semiconductor laser apparatus 1000A according to the first embodiment comprises a semiconductor laser device (hereinafter referred to as a blue-violet semiconductor laser device) 1 emitting a laser beam having a wavelength of about 400 nm, a semiconductor laser device (hereinafter referred to as a red semiconductor laser device) 2 emitting a laser beam having a wavelength of about 650 nm and a semiconductor laser device (hereinafter referred to as an infrared semiconductor laser device) 3 emitting a laser beam having a wavelength of about 780 nm.

According to the first embodiment, the blue-violet semiconductor laser device 1 is prepared by forming a semiconductor layer on a GaN substrate. The red semiconductor laser device 2 and the infrared semiconductor laser device 3 are prepared by forming semiconductor layers on a GaAs substrate, as described later in more detail.

As shown in FIG. 1, the blue-violet semiconductor laser device 1 has a striped ridge Ri on the upper surface thereof. Insulating films 4 are formed on the both sides of the side surfaces of the ridge Ri of the blue-violet semiconductor laser device 1, while a p-side pad electrode 12 is formed to cover the upper surface of the ridge Ri and an n-side electrode 15 is formed on the lower surface of the blue-violet semiconductor laser device 1. The blue-violet semiconductor laser device 1 is formed with a p-n junction surface 10 corresponding to the interface between a p-type semiconductor and an n-type semiconductor.

An n electrode 23 is formed on the upper surface of the red semiconductor laser device 2, while a p-side pad electrode 22 is formed on the lower surface thereof. The red semiconductor laser device 2 is formed with a p-n junction surface 20 corresponding to the interface between a p-type semiconductor and an n-type semiconductor.

An n electrode 33 is formed on the upper surface of the infrared semiconductor laser device 3, while a p-side pad electrode 32 is formed on the lower surface thereof. The infrared semiconductor laser device 3 is formed with a p-n junction surface 30 corresponding to the interface between a p-type semiconductor and an n-type semiconductor.

P-side pad electrodes 13 and 14 are formed on the insulating films 4 of the blue-violet semiconductor laser device 1 to be isolated from the p-side pad electrode 12.

Solder films H are formed on the upper surfaces of the p-side pad electrodes 13 and 14 respectively. The p-side pad electrode 22 of the red semiconductor laser device 2 is bonded onto the p-side pad electrode 13 with the corresponding solder film H sandwiched therebetween. Further, the p-side pad electrode 32 of the infrared semiconductor laser device 3 is bonded onto the p-side pad electrode 14 with the corresponding solder film H sandwiched therebetween.

Thus, the p-side pad electrode 22 of the red semiconductor laser device 2 is electrically connected with the p-side pad electrode 13, and the p-side pad electrode 32 of the infrared semiconductor laser device 3 is electrically connected with the p-side pad electrode 14.

As shown in FIG. 1, the upper surface of the p-side pad electrode 13 is externally exposed except the junction with the red semiconductor laser device 2. The exposed portion of the p-side pad electrode 13 extends sideward beyond the red semiconductor laser device 2 oppositely to the p-side pad electrode 12 of the blue-violet semiconductor laser device 1.

As shown in FIG. 1, further, the upper surface of the p-side pad electrode 14 is externally exposed except the junction with the infrared semiconductor laser device 3. The exposed portion of the p-side pad electrode 14 extends sideward beyond the infrared semiconductor laser device 3 oppositely to the p-side pad electrode 12 of the blue-violet semiconductor laser device 1.

Referring to FIG. 1, three directions X, Y and Z are perpendicular to each other as shown by arrows X, Y and Z. The directions X and Y are parallel to the p-n junction surfaces 10, 20 and 30 of the blue-violet, red and infrared semiconductor laser devices 1, 2 and 3. The direction Z is perpendicular to the p-n junction surfaces 10, 20 and 30 of the blue-violet, red and infrared semiconductor laser devices 1, 2 and 3.

A voltage is applied between the p-side pad electrode 12 and the n electrode 15 of the blue-violet semiconductor laser device 1, so that the laser beam having the wavelength of about 400 nm is emitted in the direction X from a region (hereinafter referred to as a blue-violet-beam-emission point) 11 of the p-n junction surface 10 located under the ridge Ri.

A voltage is applied between the p-side pad electrode 22 and the n electrode 23 of the red semiconductor laser device 2, so that the laser beam having the wavelength of about 650 nm is emitted in the direction X from a prescribed region (hereinafter referred to as a red-beam-emission point) 21 of the p-n junction surface 20.

A voltage is applied between the p-side pad electrode 32 and the n electrode 33 of the infrared semiconductor laser device 3 so that the laser beam having the wavelength of about 780 nm is emitted in the direction X from a prescribed region (hereinafter referred to as an infrared-beam-emission point) 31 of the p-n junction surface 30.

Figure 2:
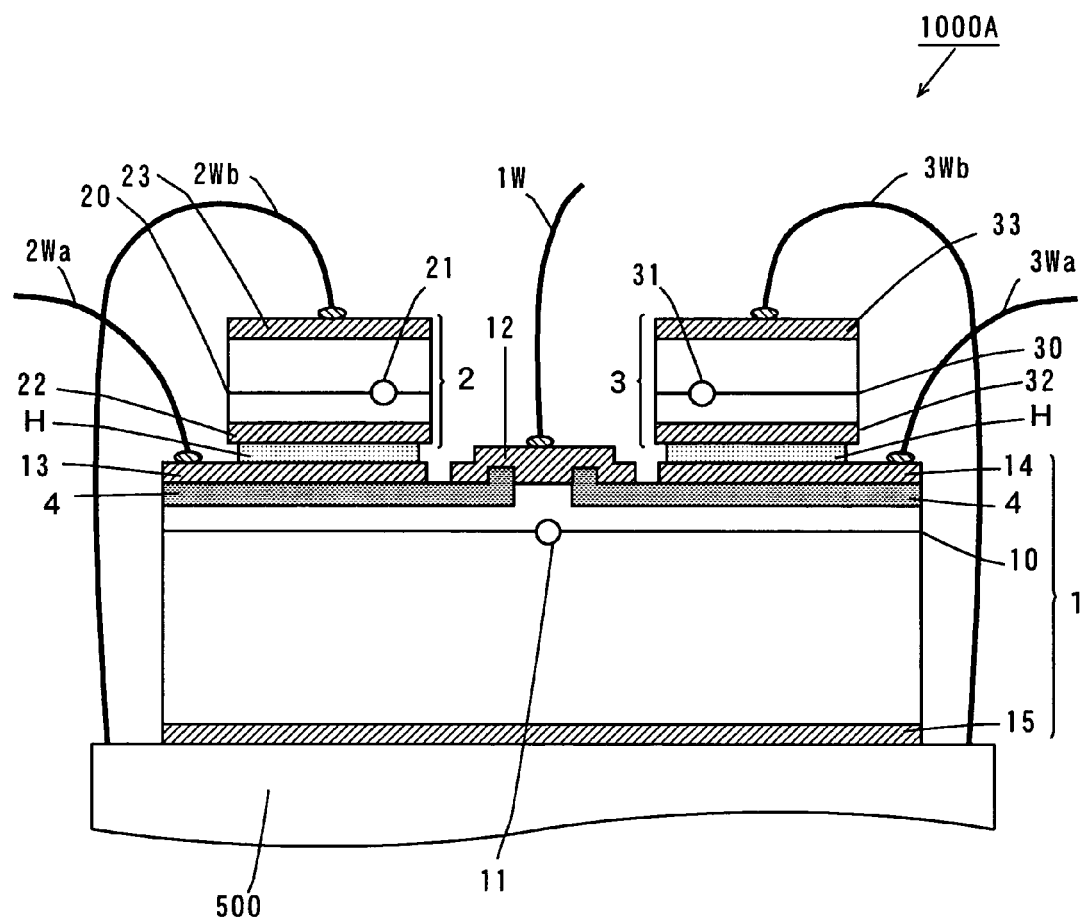
FIG. 2 is a schematic sectional view of the semiconductor laser apparatus shown in FIG. 1 assembled on a stem.
Figure 3:
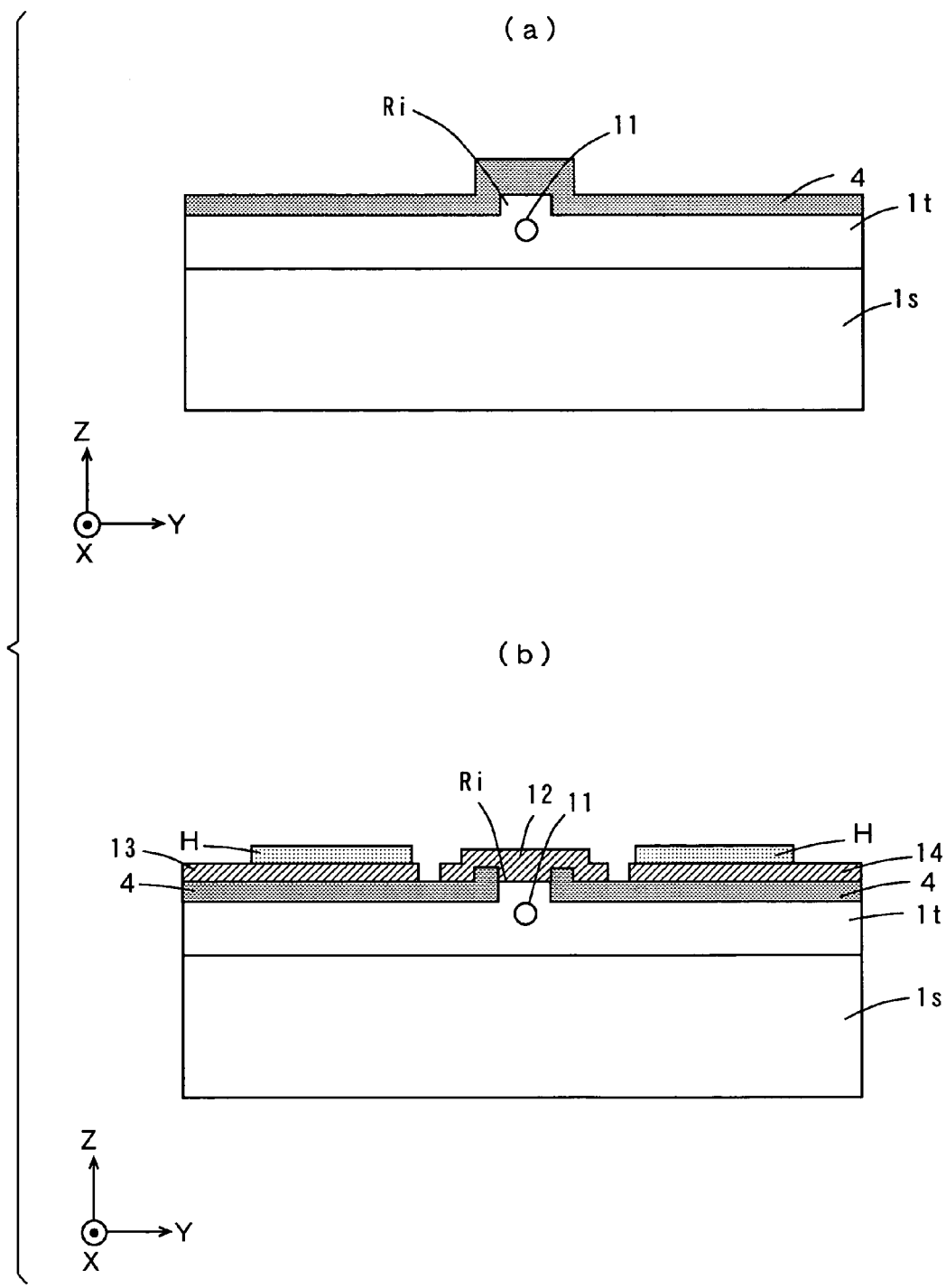
Figure 4:
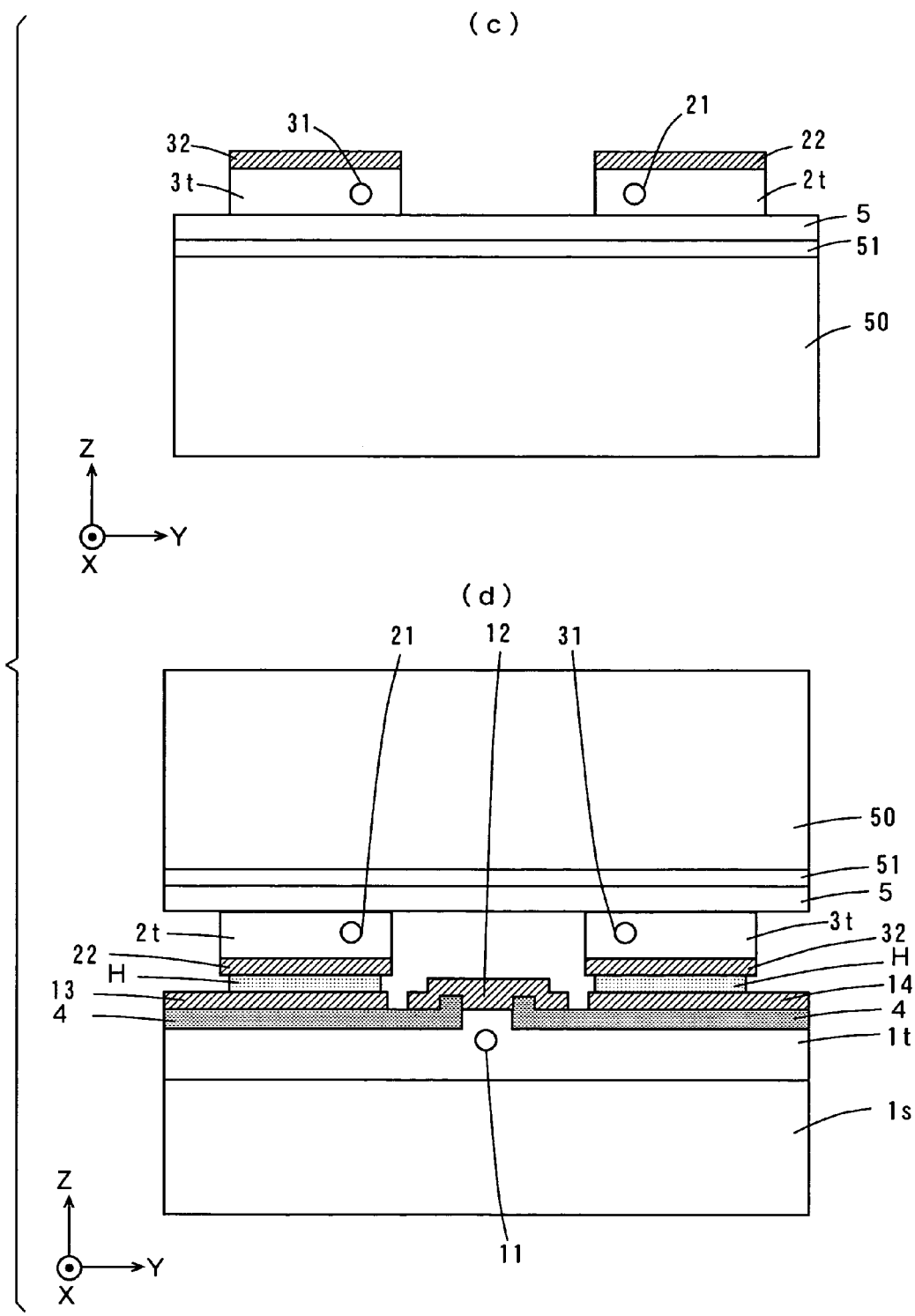
Figure 5:
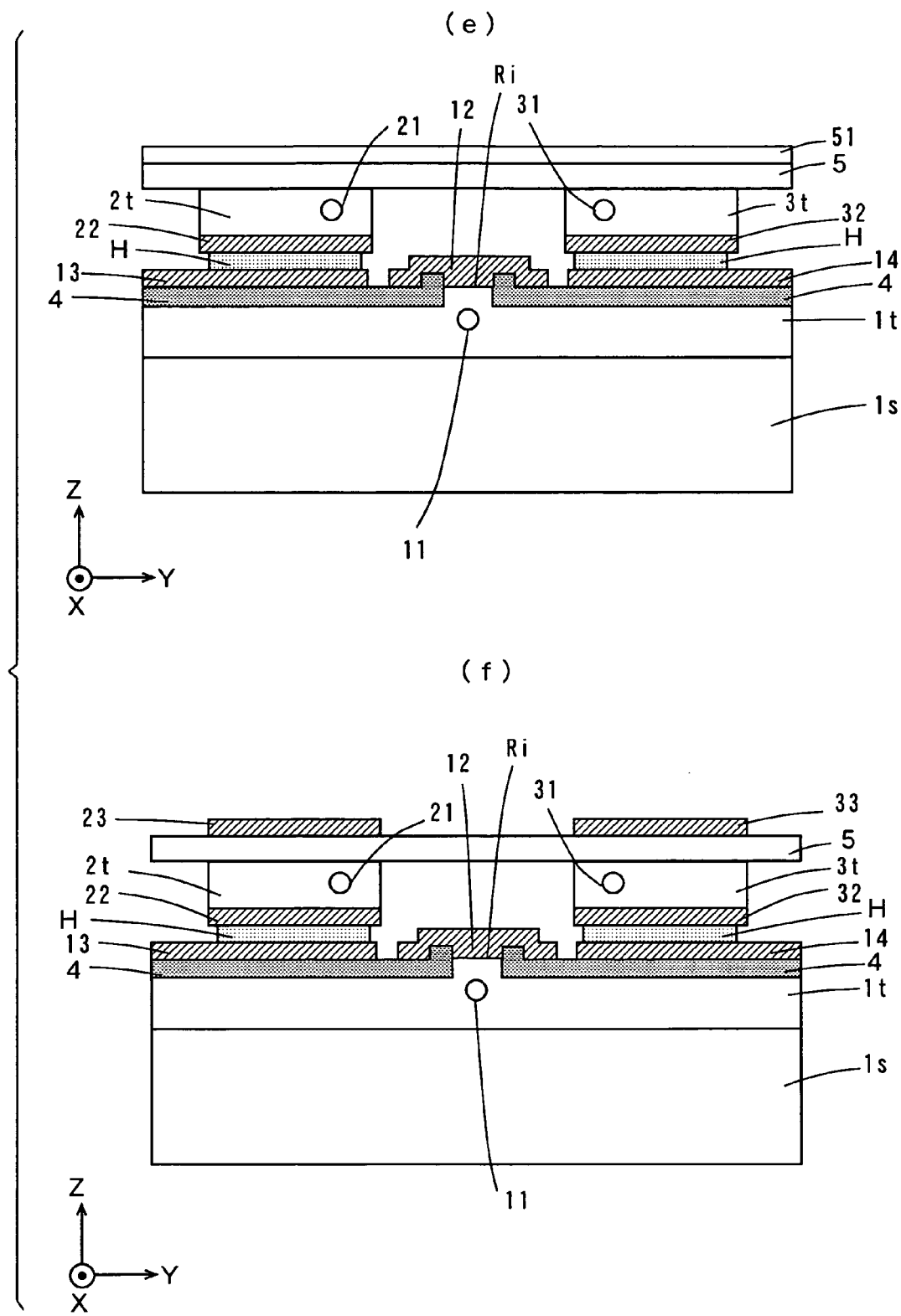
Figure 6:
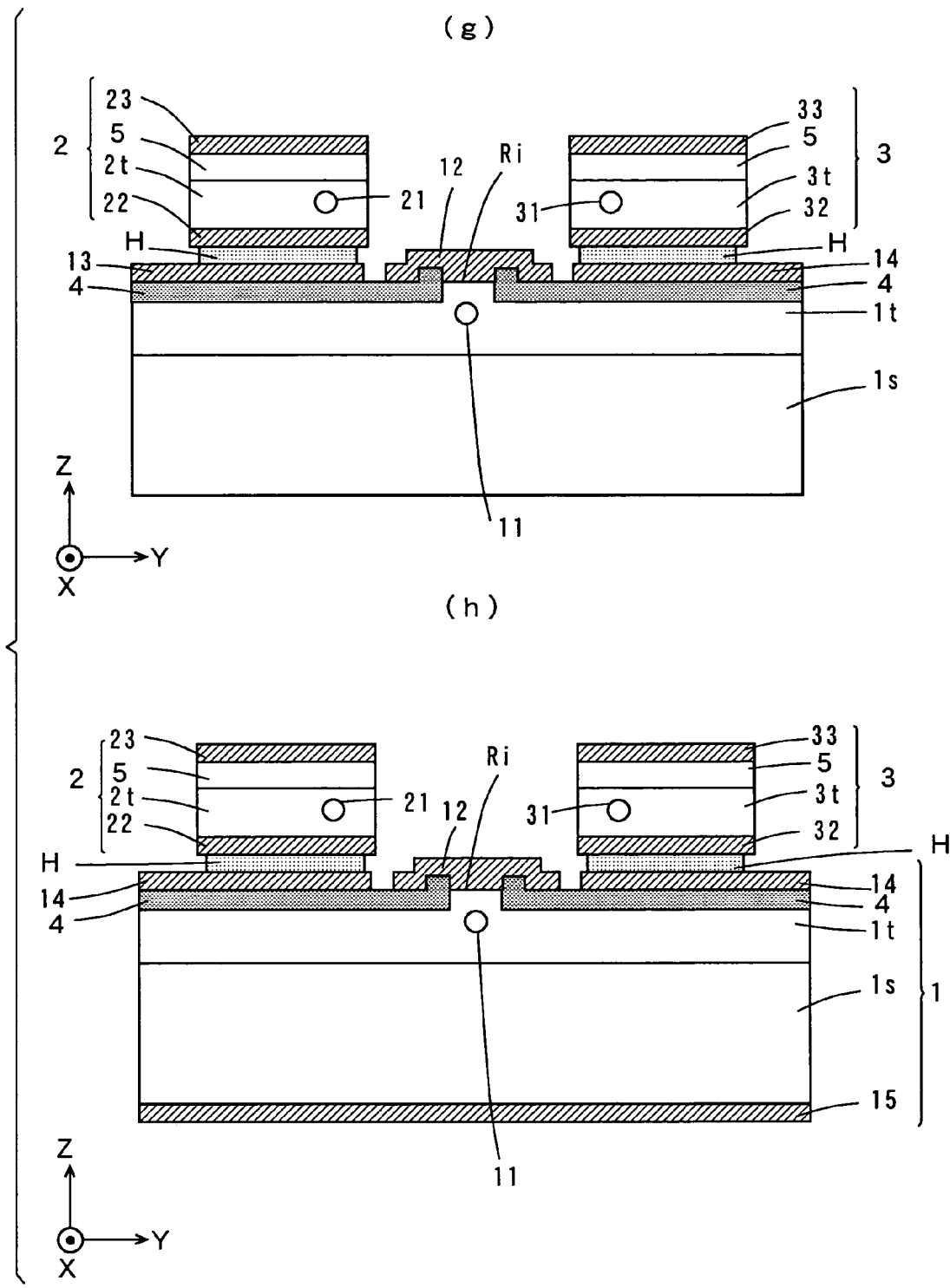

FIG. 2 is a schematic diagram of the semiconductor laser apparatus 1000A shown in FIG. 1 assembled on a stem 500. Also in FIG. 2, the directions X, Y and Z are defined similarly to those in FIG. 1.

When applied to an optical pickup, the semiconductor laser apparatus 1000A shown in FIG. 1 is mounted on the stem 500 composed of a metal such as Cu, CuW or Al as shown in FIG. 2. The p-side pad electrodes 12, 13 and 14 and the n electrodes 23 and 33 are wired through wires 1W, 2Wa, 3Wa, 2Wb and 3Wb respectively.

In this case, the n electrode 15 is bonded to the upper surface of the stem 500. Thus, the n electrode 15 and the stem 500 are electrically connected with each other.

The n electrode 23 of the red semiconductor laser device 2 is electrically connected to the upper surface of the stem 500 through the wire 2Wb. The n electrode 33 of the infrared semiconductor laser device 3 is electrically connected to the stem 500 through the wire 3Wb.

Thus, the stem 500 serves as an n electrode common to the blue-violet, red and infrared semiconductor laser devices 1, 2 and 3, to implement common-cathode wire connection.

On the other hand, the p-side pad electrode 12 of the blue-violet semiconductor laser device 1 is connected to a driving circuit (not shown) through the wire 1W. Further, the p-side pad electrode 13 electrically connected with the p-side pad electrode 22 of the red semiconductor laser device 2 is connected to the driving circuit (not shown) through the wire 2Wa. In addition, the p-side pad electrode 14 electrically connected with the p-side pad electrode 32 of the infrared semiconductor laser device 3 is connected to the driving circuit (not shown) through the wire 3Wa.

The blue-violet semiconductor laser device 1 can be driven by applying a voltage between the stem 500 and the wire 1W, the red semiconductor laser device 2 can be driven by applying a voltage between the stem 500 and the wire 2Wa, and the infrared semiconductor laser device 3 can be driven by applying a voltage between the stem 500 and the wire 3Wa. Thus, the blue-violet, red and infrared semiconductor laser devices 1, 2 and 3 can be individually driven respectively.

Referring to FIG. 2, the wire 1W for driving the blue-violet semiconductor laser device 1 is connected onto the p-side pad electrode 12 formed above the blue-violet-beam-emission point 11.

On the other hand, the wire 2Wa for driving the red semiconductor laser device 2 is connected to the exposed portion of the p-side pad electrode 13 extending sideward beyond the red semiconductor laser device 2. Further, the wire 2Wb for driving the red semiconductor laser device 2 is connected to the n electrode 23 formed on the upper surface of the red semiconductor laser device 2.

Thus, the red semiconductor laser device 2 is positioned between the p-side pad electrode 12 of the blue-violet semiconductor laser device 1 and the joint of the wire 2Wa for driving the red semiconductor laser device 2 in the direction Y.

In other words, the wire 2Wa is connected to a portion of the p-side pad electrode 13 of the red semiconductor laser device 2 opposite to the p-side pad electrode 12 of the blue-violet semiconductor laser device 1 in a direction parallel to the surface of the GaN substrate and perpendicular to the direction for emitting the laser beams.

On the other hand, the wire 3Wa for driving the infrared semiconductor laser device 3 is connected to the exposed portion of the p-side pad electrode 14 extending sideward beyond the infrared semiconductor laser device 3. Further, the wire 3Wb for driving the infrared semiconductor laser device 3 is connected to the n electrode 33 formed on the upper surface of the infrared semiconductor laser device 3.

Thus, the infrared semiconductor laser device 3 is positioned between the p-side pad electrode 12 and the joint of the wire 3Wa for driving the infrared semiconductor laser device 3 in the direction Y.

In other words, the wire 3Wa is connected to a portion of the p-side pad electrode 14 of the infrared semiconductor laser device 3 opposite to the p-side pad electrode 12 of the blue-violet semiconductor laser device 1 in the direction parallel to the surface of the GaN substrate and perpendicular to the direction for emitting the laser beams.

As hereinabove described, both of the wires 2Wa and 3Wa for driving the red and infrared semiconductor laser devices 2 and 3 respectively are connected to the portions of the p-side pad electrodes 13 and 14 opposite to the p-side pad electrode 12 of the blue-violet semiconductor laser device 1 respectively according to the first embodiment.

Thus, the wires 2Wa and 3Wa are reliably and easily bonded to the red and infrared semiconductor laser devices 2 and 3 respectively. Further, wiring is simplified.

In addition, no spaces for connecting the wires 2Wa, 2Wb, 3Wa and 3Wb may be provided in the vicinity of the p-side pad electrode 12 of the blue-violet semiconductor laser device 1, whereby the distance between the red and infrared semiconductor laser devices 2 and 3 can be shorter in the direction Y.

Thus, the distance between the red and infrared semiconductor laser devices 2 and 3 is so short that the distances between the blue-violet, red and infrared-beam-emission points 11, 21 and 31 of the blue-violet, red and infrared semiconductor laser devices 1, 2 and 3 can be shorter. Therefore, all of the blue-violet, red and infrared-beam-emission points 11, 21 and 31 can be closer to the center of the semiconductor laser apparatus 1000A.

The distances between the blue-violet, red and infrared-beam-emission points 11, 21 and 31 can be so short in the direction Y that a common optical system can be employed for the laser beams emitted from the blue-violet, red and infrared-beam-emission points 11, 21 and 31 respectively.

Thus, the blue-violet, red and infrared semiconductor laser devices 1, 2 and 3 are improved in light extraction efficiency when the laser beams are condensed through a lens.

Further, the laser beams emitted from the blue-violet, red and infrared-beam-emission points 11, 21 and 31 can pass through the center of a common lens. Thus, light aberration resulting from passage of the laser beams through a lens is reduced to require no component for correcting light aberration. Consequently, an optical system such as an optical pickup is downsized and reduced in cost.

A method of manufacturing the semiconductor laser apparatus 1000A according to the first embodiment is now described. FIGS. 3(a) to 6(h) are schematic process drawings showing an exemplary method of manufacturing the semiconductor laser apparatus 1000A according to the first embodiment. Also in FIGS. 3(a) to 6(h), the directions X, Y and Z are defined similarly to those in FIG. 1.

As shown in FIG. 3(a), a semiconductor layer 1t having a multilayer structure is formed on a first surface of an n-GaN substrate 1s serving as a first growth substrate and the ridge Ri, having a convex section, extending in the direction X is formed on the semiconductor layer 1t, in order to prepare the blue-violet semiconductor laser device 1. Thereafter an insulating film 4 of SiO$_2$ is formed on the upper surface of the semiconductor layer 1t formed with the ridge Ri.

As shown in FIG. 3(b), a portion of the insulating film 4 formed on the upper surface of the ridge Ri is removed. A p electrode (not shown in FIG. 3(b)) is formed on the upper surface of the ridge Ri. The p-side pad electrodes 12, 13 and 14 are formed on the exposed portion of the semiconductor layer 1t (on the p electrode (not shown)) and the insulating films 4 located on both sides of the ridge Ri respectively. Further, the solder films H of Au—Sn are formed on the upper surfaces of the p-side pad electrodes 13 and 14 respectively. The n electrode 15 of the blue-violet semiconductor laser device 1 is formed in a later step.

As shown in FIG. 4(c), an etching stopper layer 51 of AlGaAs is formed on a surface of an n-GaAs substrate 50 serving as a second growth substrate and an n-GaAs contact layer 5 is formed on the etching stopper layer 51, in order to prepare the red and infrared semiconductor laser devices 2 and 3.

A semiconductor layer 2t having an AlGaInP-based multilayer structure and a semiconductor layer 3t having an AlGaAs-based multilayer structure are formed on the n-GaAs contact layer 5 to be isolated from each other. Further, the p-side pad electrodes 22 and 32 are formed on the semiconductor layers 2t and 3t respectively. P electrodes (not shown in FIG. 4(c)) are formed between the semiconductor layer 2t and the p-side pad electrode 22 and between the semiconductor layer 3t and the p-side pad electrode 32 respectively. The n electrodes 23 and 33 of the red and infrared semiconductor laser devices 2 and 3 are formed in a later step. The red and infrared semiconductor laser devices 2 and 3 are also formed with ridges (not shown in FIG. 4(c)).

As shown in FIG. 4(d), the p-side pad electrodes 13 and 22 formed on the corresponding insulating film 4 and the semiconductor layer 2t respectively are bonded to each other with the corresponding solder film H sandwiched therebetween while the p-side pad electrodes 14 and 32 formed on the corresponding insulating film 4 and the semiconductor layer 3t respectively are bonded to each other with the corresponding solder film H sandwiched therebetween, thereby forming a stacked substrate.

Both of the n-GaN substrate 1s and the n-GaAs substrate 50 have thicknesses of about 300 to 500 µm. Thus, the n-GaN substrate 1s and the n-GaAs substrate 50 can be so easily handled that the p-side pad electrodes 22 and 32 are easily bonded to the p-side pad electrodes 13 and 14 respectively.

The n-GaN substrate 1s of the blue-violet semiconductor laser device 1 is transparent. The n-GaN substrate 1s has such transmittance and thickness that the red and infrared semiconductor laser devices 2 and 3 are viewable through this n-GaN substrate 1s.

Thus, the positions of the p-side pad electrodes 22 and 32 bonded to the p-side pad electrodes 13 and 14 respectively can be visually confirmed through the n-GaN substrate 1s. Therefore, the red and infrared semiconductor laser devices 2 and 3 can be easily aligned on the blue-violet semiconductor laser device 1.

According to the first embodiment, the substrate for the blue-violet semiconductor laser device 1 is not restricted to the n-GaN substrate 1s but may alternatively be prepared from another translucent and conductive substrate. For example, an n-ZnO substrate can be employed as another translucent substrate. In this case, the red and infrared semiconductor laser devices 2 and 3 can be easily aligned on the blue-violet semiconductor laser device 1, as hereinabove described.

As shown in FIG. 5(e), the n-GaAs substrate 50 is processed into a prescribed thickness by etching or polishing, and thereafter etched up to the etching stopper layer 51.

For example, the n-GaAs substrate 50 is first polished into the prescribed thickness, and thereafter removed by dry etching such as reactive ion etching (RIE).

Then, the etching stopper layer 51 is removed. For example, the etching stopper layer 51 is removed by wet etching with an etching solution composed of hydrofluoric acid or hydrochloric acid.

As shown in FIG. 5(f), the n electrodes 23 and 33 are formed on regions of the n-GaAs contact layer 5 located above the semiconductor layers 2t and 3t respectively by patterning after removal of the etching stopper layer 51.

As shown in FIG. 6(g), portions of the n-GaAs contact layer 5 not formed with the semiconductor layers 2t and 3t are removed by dry etching, thereby preparing the red and infrared semiconductor laser devices 2 and 3. The structures of the red and infrared semiconductor laser devices 2 and 3 are described later in more detail.

As shown in FIG. 6(h), the thickness of the n-GaN substrate 1s is reduced by polishing, and the n electrode 15 is thereafter formed on the lower surface of the n-GaN substrate 1s, thereby preparing the blue-violet semiconductor laser device 1. The structure of the blue-violet semiconductor laser device 1 is described later in more detail.

Finally, the stacked substrate of the blue-violet, red and infrared semiconductor laser device 1, 2 and 3 prepared in the aforementioned manner is separated in the form of bars by cleavage, thereby forming the cavity facets. Protective films are formed on the cavity facets, which in turn are further finely cut along the direction X in the form of chips. Thus, the semiconductor laser apparatus 1000A according to the first embodiment is completed.

The structure of the blue-violet semiconductor laser device 1 is now described in detail with reference to FIGS. 7(a) and 7(b), along with a method of preparing the same.

Figure 7:
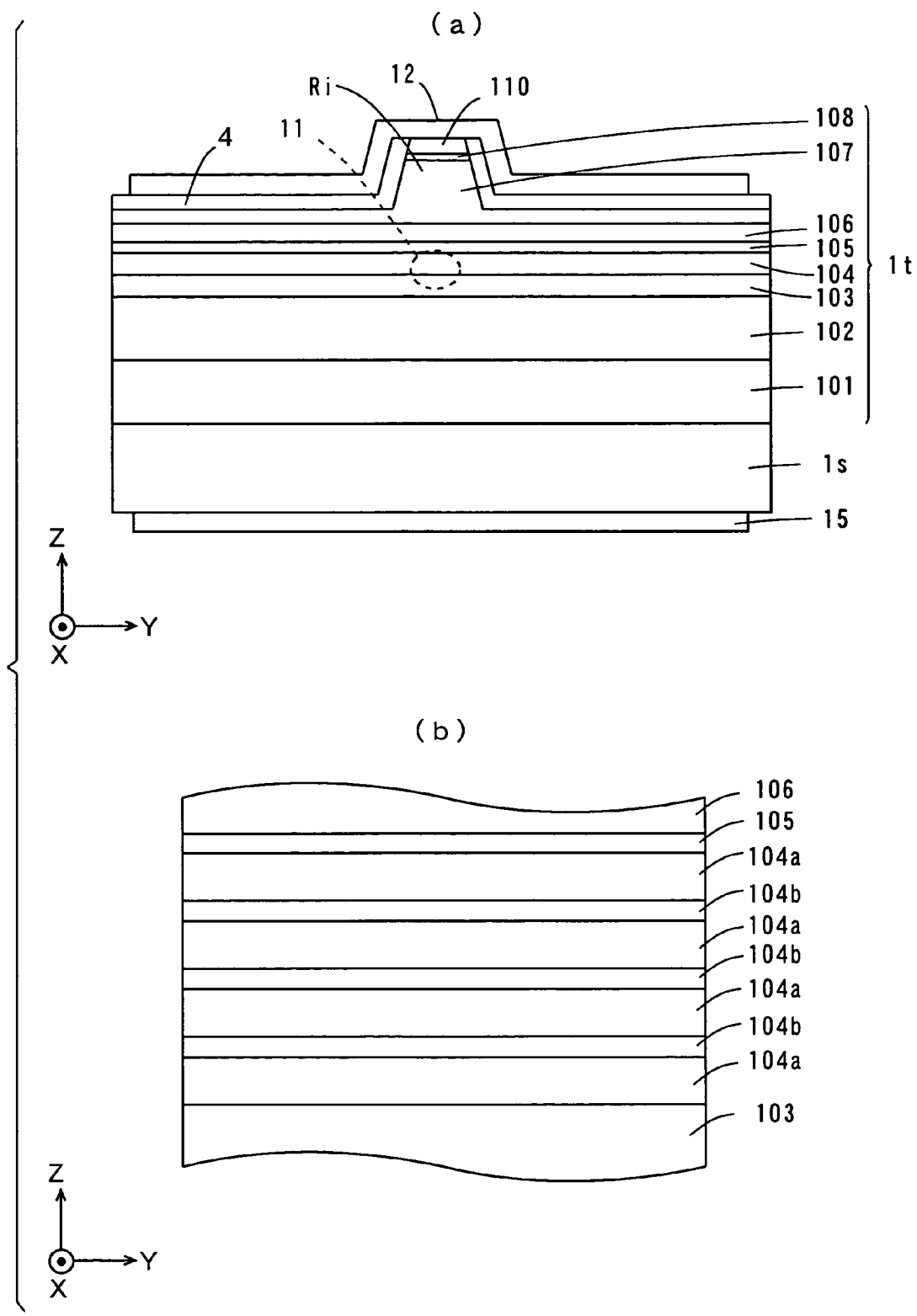
FIGS. 7(a) and 7(b) are schematic sectional views for illustrating the structure of a blue-violet semiconductor laser device in detail.

FIGS. 7(a) and 7(b) are schematic sectional views for illustrating the structure of the blue-violet semiconductor laser device 1 in detail. Also in the following description, the directions X, Y and Z are defined similarly to those in FIG. 1.

In preparation of the blue-violet semiconductor laser device 1, the semiconductor layer 1t having a multilayer structure is formed on the n-GaN substrate 1s, as hereinabove described.

As shown in FIG. 7(a), an n-GaN layer 101, an n-AlGaN cladding layer 102, an n-GaN optical guide layer 103, a multiple quantum well (MQW) active layer 104, an undoped AlGaN cap layer 105, an undoped GaN optical guide layer 106, a p-AlGaN cladding layer 107 and an undoped GaInN contact layer 108 are successively formed on the n-GaN substrate 1s as the semiconductor layer 1t having a multilayer structure. These layers 102 to 108 are formed by metal organic chemical vapor deposition (MOCVD), for example.

As shown in FIG. 7(b), the MQW active layer 104 has a structure obtained by alternately stacking four undoped GaInN barrier layers 104a and three undoped GaInN well layers 104b.

For example, the n-AlGaN cladding layer 102 has an Al composition of 0.15 and a Ga composition of 0.85. The n-GaN layer 101, the n-AlGaN cladding layer 102 and the n-GaN optical guide layer 103 are doped with Si.

Each undoped GaInN barrier layer 104a has a Ga composition of 0.95 and an In composition of 0.05. Each undoped GaInN well layer 104b has a Ga composition of 0.90 and an In composition of 0.10. The p-AlGaN cap layer 105 has an Al composition of 0.30 and a Ga composition of 0.70.

Further, the p-AlGaN cladding layer 107 has an Al composition of 0.15 and a Ga composition of 0.85. The p-AlGaN cladding layer 107 is doped with Mg. The undoped GaInN contact layer 108 has a Ga composition of 0.95 and an In composition of 0.05.

In the aforementioned semiconductor layer 1t, the p-AlGaN cladding layer 107 is formed with a striped ridge Ri extending in the direction X. The ridge Ri of the p-AlGaN cladding layer 107 has a width of about 1.5 µm.

The undoped GaInN contact layer 108 is formed on the upper surface of the ridge Ri of the p-AlGaN cladding layer 107.

The insulating film 4 of $SiO_2$ is formed on the upper surfaces of the p-AlGaN cladding layer 107 and the undoped GaInN contact layer 108, and the portion of the insulating film 4 formed on the undoped GaInN contact layer 108 is removed by etching. The p electrode 110 composed of Pd, Pt and Au is formed on the externally exposed portion of the undoped GaInN contact layer 108. Further, the p-side pad electrode 12 is formed by sputtering, vacuum evaporation or electron beam evaporation to cover the upper surfaces of the p electrode 110 and the insulating films 4. Description of the p-side pad electrodes 13 and 14 shown in FIG. 1 is omitted.

Thus, the semiconductor layer 1t having a multilayer structure is formed on a first surface of the n-GaN substrate 1s. Further, the n electrode 15 composed of Ti, Pt and Au is formed on a second surface of the n-GaN substrate 1s.

In this blue-violet semiconductor laser device 1, the blue-violet-beam-emission point 11 is formed on a position of the MQW active layer 104 located under the ridge Ri. In this example, the MQW active layer 104 corresponds to the p-n junction surface 10 shown in FIG. 1.

The structure of the red semiconductor laser device 2 is described in detail with reference to FIGS. 8(a) and 8(b), along with a method of preparing the same.

Figure 8:
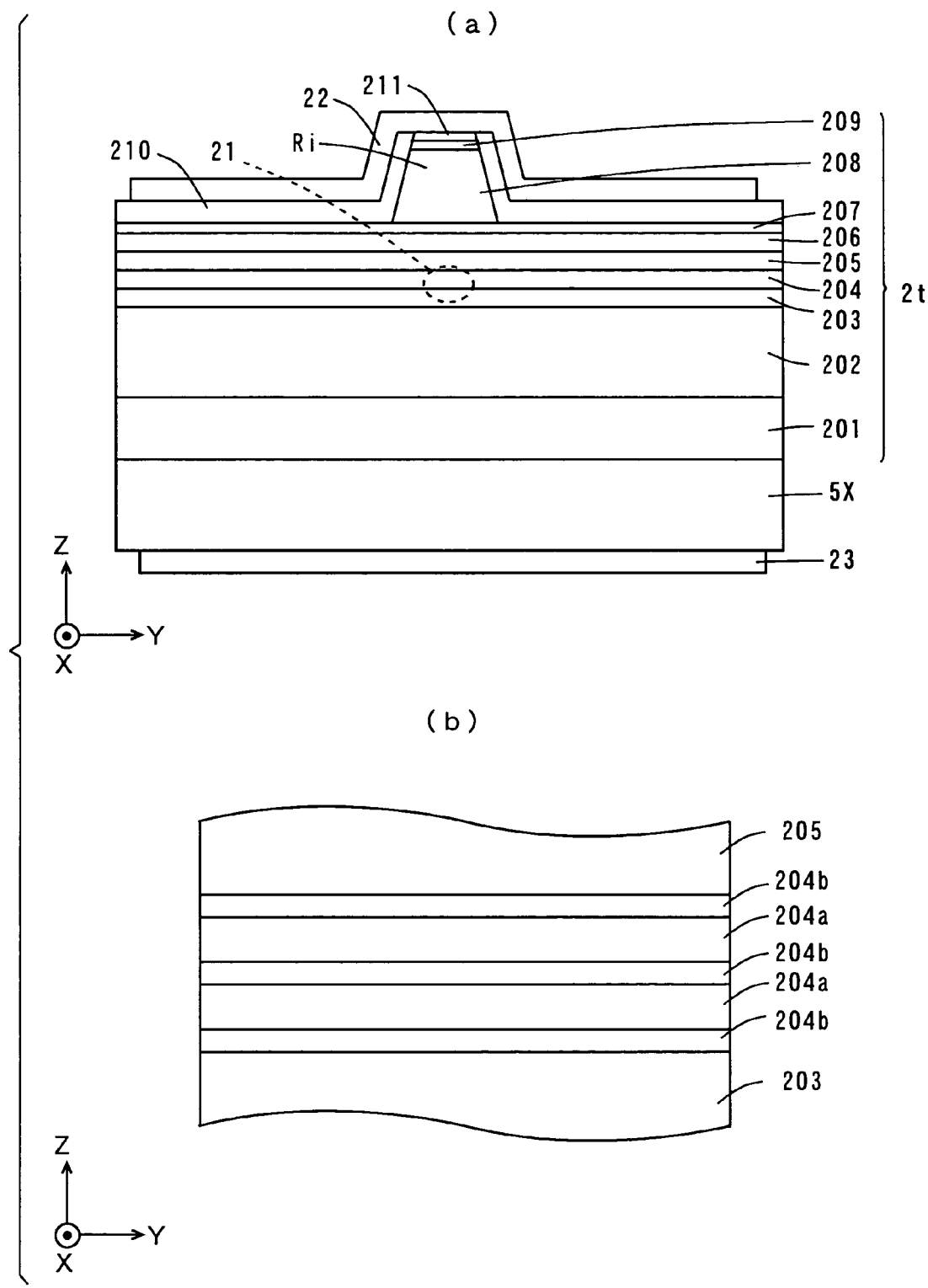
FIGS. 8(a) and 8(b) are schematic sectional views for illustrating the structure of a red semiconductor laser device in detail.

FIGS. 8(a) and 8(b) are schematic sectional views for illustrating the structure of the red semiconductor laser device 2 in detail. Also in the following description, the directions X, Y and Z are defined similarly to those in FIG. 1. While the red semiconductor laser device 2 is prepared by forming the semiconductor layer 2t on the n-GaAs contact layer 5 according to the first embodiment, the semiconductor layer 2t is alternatively formed on an n-GaAs substrate 5X in place of the n-GaAs contact layer 5 in the following description. The n-GaAs substrate 5X is doped with Si.

As shown in FIG. 8(a), an n-GaAs layer 201, an n-AlGaInP cladding layer 202, an undoped AlGaInP optical guide layer 203, an MQW active layer 204, an undoped AlGaInP optical guide layer 205, a p-AlGaInP first cladding layer 206, a p-InGaP etching stopper layer 207, a p-AlGaInP second cladding layer 208 and a p-contact layer 209 are successively formed on the n-GaAs substrate 5X as the semiconductor layer 2t having a multilayer structure. These layers 201 to 209 are formed by MOCVD, for example.

As shown in FIG. 8(b), the MQW active layer 204 has a structure obtained by alternately stacking two undoped AlGaInP barrier layers 204a and three undoped InGaP well layers 204b.

For example, the n-AlGaInP cladding layer 202 has an Al composition of 0.70, a Ga composition of 0.30, an In composition of 0.50 and a P composition of 0.50. The n-GaAs layer 201 and the n-AlGaInP cladding layer 202 are doped with Si.

The undoped AlGaInP optical guide layer 203 has an Al composition of 0.50, a Ga composition of 0.50, an In composition of 0.50 and a P composition of 0.50.

Each undoped AlGaInP barrier layer 204a has an Al composition of 0.50, a Ga composition of 0.50, an In composition of 0.50 and a P composition of 0.50. Each undoped InGaP well layer 204b has an In composition of 0.50 and a Ga composition of 0.50. The undoped AlGaInP optical guide layer 205 has an Al composition of 0.50, a Ga composition of 0.50, an In composition of 0.50 and a P composition of 0.50.

Further, the p-AlGaInP first cladding layer 206 has an Al composition of 0.70, a Ga composition of 0.30, an In composition of 0.50 and a P composition of 0.50. The p-InGaP etching stopper layer 207 has an In composition of 0.50 and a Ga composition of 0.50.

The p-AlGaInP second cladding layer 208 has an Al composition of 0.70, a Ga composition of 0.30, an In composition of 0.50 and a P composition of 0.50.

The p-contact layer 209 has a multilayer structure of a p-GaInP layer and a p-GaAs layer. The p-GaInP layer has a Ga composition of 0.5 and an In composition of 0.5.

In the composition of each of the aforementioned AlGaInP-based materials, a, b, c and d in a general formula $(Al_aGa_b)_{0.5}In_cP_d$ denote the Al, Ga, In and P compositions respectively.

The p-AlGaInP first cladding layer 206, the p-InGaP etching stopper layer 207, the p-AlGaInP second cladding layer 208 and the p-contact layer 209 consisting of p-GaInP are doped with Zn.

The p-AlGaInP second cladding layer 208 is formed only on a part (central portion) of the p-InGaP etching stopper layer 207. The p-contact layer 209 is formed on the upper surface of the p-AlGaInP second cladding layer 208.

Thus, the p-AlGaInP second cladding layer 208 and the p-contact layer 209 of the aforementioned semiconductor layer 2t form a striped ridge Ri extending in the direction X. The ridge Ri formed by the p-AlGaInP second cladding layer 208 and the p-contact layer 209 has a width of about 2.5 μm.

An insulating film 210 of $SiO_2$ is formed on the upper surface of the p-InGaP etching stopper layer 207, the side surfaces of the p-AlGaInP second cladding layer 208 and the upper surface and the side surfaces of the p-contact layer 209, and a portion of the insulating film 210 formed on the p-contact layer 209 is removed by etching. A p electrode 211 of Cr and Au is formed on the externally exposed p-contact layer 209. Further, the p-side pad electrode 22 is formed by sputtering, vacuum evaporation or electron beam evaporation to cover the upper surfaces of the p electrode 211 and the insulating films 210.

Thus, the semiconductor layer 2t having a multilayer structure is formed on a first surface of the n-GaAs substrate 5X. The n electrode 23 of AuGe, Ni an Au is formed on a second surface of the n-GaAs substrate 5X.

In this red semiconductor laser device 2, the red-beam-emission point 21 is formed on a position of the MQW active layer 204 located under the ridge Ri. In this example, the MQW active layer 204 corresponds to the p-n junction surface 20 shown in FIG. 1.

While the ridge Ri is formed on the semiconductor layer 2t of the red semiconductor laser device 2 in the above description of FIGS. 8(a) and 8(b), illustration of the ridge Ri of the red semiconductor laser device 2 is omitted in the description of FIGS. 1 to 6(h).

The structure of the infrared semiconductor laser device 3 is described in detail with reference to FIGS. 9(a) and 9(b), along with a method of preparing the same.

Figure 9:
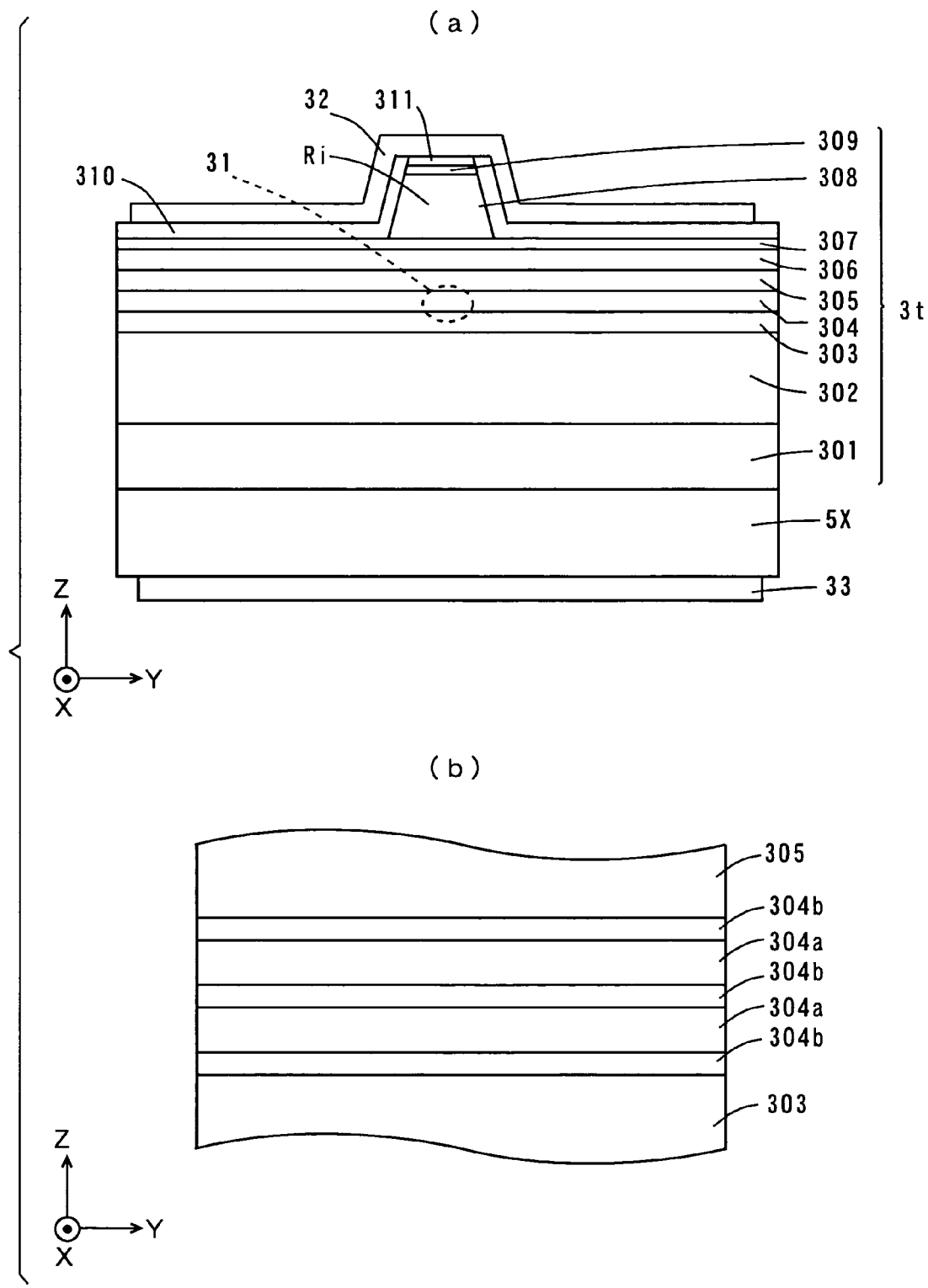
FIGS. 9(a) and 9(b) are schematic sectional views for illustrating the structure of an infrared semiconductor laser device in detail.

FIGS. 9(a) and 9(b) are schematic sectional views for illustrating the structure of the infrared semiconductor laser device 3 in detail. Also in the following description, the directions X, Y and Z are defined similarly to those in FIG. 1. While the infrared semiconductor laser device 3 is prepared by forming the semiconductor layer 3t on the n-GaAs contact layer 5 according to the first embodiment, the semiconductor layer 3t is alternatively formed on the n-GaAs substrate 5X in place of the n-GaAs contact layer 5 in the following description. This n-GaAs substrate 5X is doped with Si.

As shown in FIG. 9(a), an n-GaAs layer 301, an n-AlGaAs cladding layer 302, an undoped AlGaAs optical guide layer 303, an MQW active layer 304, an undoped AlGaAs optical guide layer 305, a p-AlGaAs first cladding layer 306, a p-AlGaAs etching stopper layer 307, a p-AlGaAs second cladding layer 308 and a p-GaAs contact layer 309 are successively formed on the n-GaAs substrate 5X as the semiconductor layer 3t having a multilayer structure. These layers 301 to 309 are formed by MOCVD, for example.

As shown in FIG. 9(b), the MQW active layer 304 has a structure obtained by alternately stacking two undoped AlGaAs barrier layers 304a and three undoped AlGaAs well layers 304b.

For example, the n-AlGaAs cladding layer 302 has an Al composition of 0.45 and a Ga composition of 0.55. The n-GaAs layer 301 and the n-AlGaAs cladding layer 302 are doped with Si.

The undoped AlGaAs optical guide layer 303 has an Al composition of 0.35 and a Ga composition of 0.65. Each undoped AlGaAs barrier layer 304a has an Al composition of 0.35 and a Ga composition of 0.65. Each undoped AlGaAs well layer 304b has an Al composition of 0.10 and a Ga composition of 0.90. The undoped AlGaAs optical guide layer 305 has an Al composition of 0.35 and a Ga composition of 0.65.

Further, the p-AlGaAs first cladding layer 306 has an Al composition of 0.45 and a Ga composition of 0.55. The p-AlGaAs etching stopper layer 307 has an Al composition of 0.70 and a Ga composition of 0.30.

The p-AlGaAs second cladding layer 308 has an Al composition of 0.45 and a Ga composition of 0.55.

The p-AlGaAs first cladding layer 306, the p-AlGaAs etching stopper layer 307, the p-AlGaAs second cladding layer 308 and the p-GaAs contact layer 309 are doped with Zn.

The p-AlGaAs second cladding layer 308 is formed only on a part (central portion) of the p-AlGaAs etching stopper layer 307. The p-GaAs contact layer 309 is formed on the upper surface of the p-AlGaAs second cladding layer 308.

Thus, the p-AlGaAs second cladding layer 308 and the p-GaAs contact layer 309 of the aforementioned semiconductor layer 3t form a striped ridge Ri extending in the direction X. The ridge Ri formed by the p-AlGaAs second cladding layer 308 and the p-GaAs contact layer 309 has a width of about 2.8 μm.

An insulating film 310 of SiN is formed on the upper surface of the p-AlGaAs etching stopper layer 307, the side surfaces of the p-AlGaAs second cladding layer 308 and the upper surface and the side surfaces of the p-GaAs contact layer 309, and a portion of the insulating film 310 formed on the p-GaAs contact layer 309 is removed by etching. A p electrode 311 of Cr and Au is formed on the externally exposed p-GaAs contact layer 309. The p-side pad electrode 32 is formed by sputtering, vacuum evaporation or electron beam evaporation to cover the upper surfaces of the p electrode 311 and the insulating films 310.

Thus, the semiconductor layer 3t having a multilayer structure is formed on a first surface of the n-GaAs substrate 5X. The n electrode 33 of AuGe, Ni and Au is formed on a second surface of the n-GaAs substrate 5X.

In this infrared semiconductor laser device 3, the infrared-beam-emission point 31 is formed on a position of the MQW active layer 304 located under the ridge Ri. In this example, the MQW active layer 304 corresponds to the p-n junction surface 30 shown in FIG. 1.

While the ridge Ri is formed on the semiconductor layer 3t of the infrared semiconductor laser device 3 in the above description of FIGS. 9(a) and 9(b), illustration of the ridge Ri of the infrared semiconductor laser device 3 is omitted in the description of FIGS. 1 to 6(h).

Preferable shapes, bonded positions and the positions of the emission points 11, 21 and 31 of the blue-violet, red and infrared semiconductor laser devices 1, 2 and 3 in the first embodiment are now described.

Figure 10:
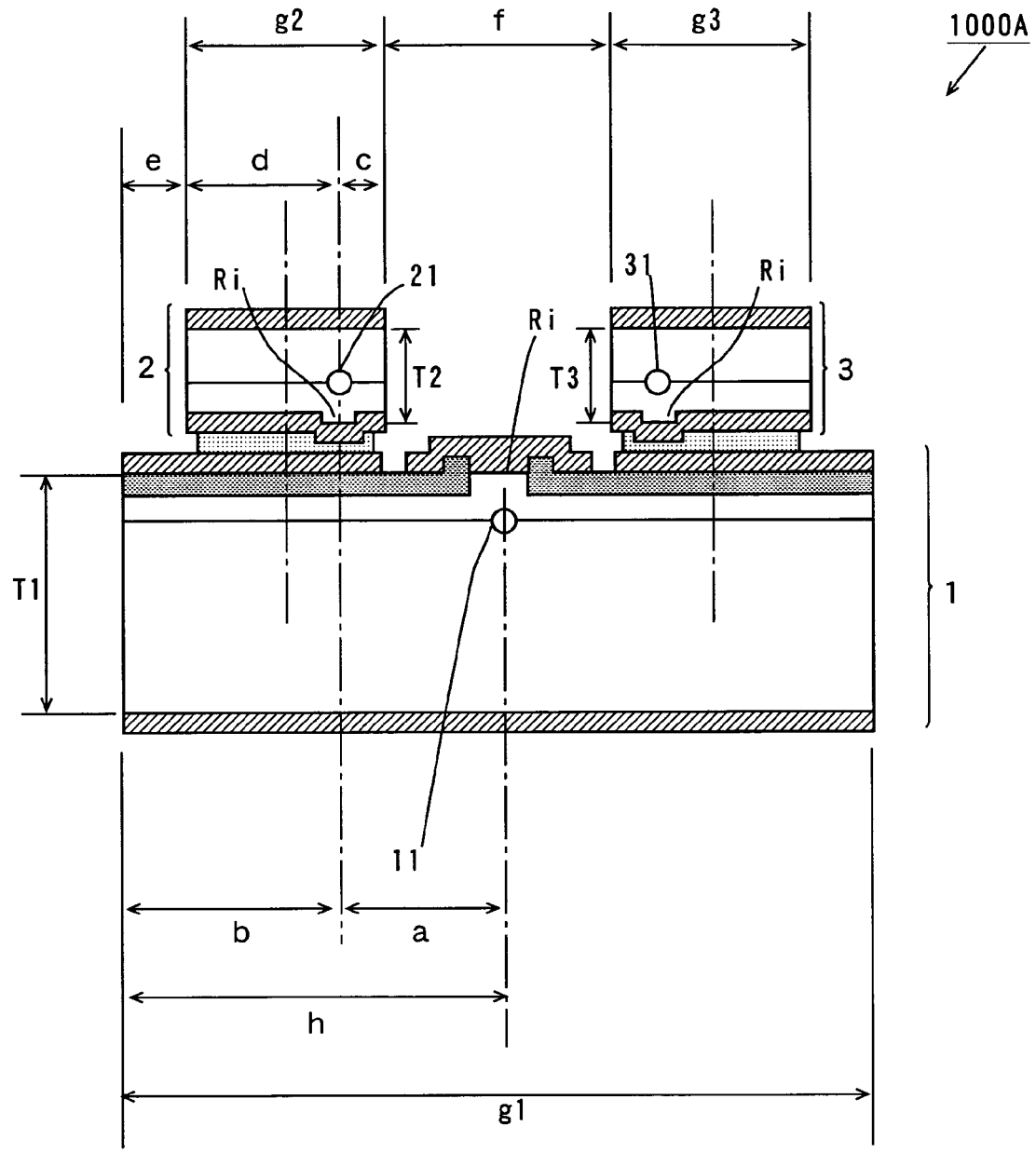
FIG. 10 is a diagram for illustrating preferable shapes, bonded positions and positions of emission points of the blue-violet, red and infrared semiconductor laser devices in the first embodiment.

FIG. 10 is a diagram for illustrating the preferable shapes, the bonded positions and the positions of the emission points 11, 21 and 31 of the blue-violet, red and infrared semiconductor laser devices 1, 2 and 3 in the first embodiment. Also in the following description, the directions X, Y and Z are defined similarly to those shown in FIG. 1.

FIG. 10 illustrates the ridges Ri of the red and infrared semiconductor laser devices 2 and 3 described with reference to FIGS. 8(a), 8(b), 9(a) and 9(b).

Positions of the ridges Ri formed on the red and infrared semiconductor laser devices 2 and 3 are decided in consideration of positions of the red and infrared semiconductor laser devices 2 and 3 bonded to the blue-violet semiconductor laser device 1 and the positional relation between the blue-violet, red and infrared-beam-emission points 11, 21 and 31 in the direction Y.

The blue-violet, red and infrared-beam-emission points 11, 21 and 31 are formed on the positions of the MQW active layers 104, 204 and 304 located under the ridges Ri of the blue-violet, red and infrared semiconductor laser devices 1, 2 and 3 respectively. Therefore, the positions of the ridges Ri of the red and infrared semiconductor laser devices 2 and 3 are decided in response to the positions of the red and infrared-beam-emission points 21 and 31 described later respectively.

Referring to FIG. 10, symbols T1, T2 and T3 denote the thicknesses (in the direction Z) of the blue-violet, red and infrared semiconductor laser devices 1, 2 and 3 respectively. The thickness T1 of the blue-violet semiconductor laser device 1 is preferably larger than the thicknesses T2 and T3 of the red and infrared semiconductor laser devices 2 and 3.

The aforementioned relation is expressed as follows:

$$T1 > T2 \quad (1)$$

$$T1 > T3 \quad (2)$$

The thickness T1 of the blue-violet semiconductor laser device 1 corresponds to the total thickness of the n-GaN substrate 1s and the semiconductor layer 1t shown in FIGS. 7(a) and 7(b), the thickness T2 of the red semiconductor laser device 2 corresponds to the total thickness of the n-GaAs substrate 5X and the semiconductor layer 2t shown in FIGS. 8(a) and 8(b), and the thickness T3 of the infrared semiconductor laser device 3 corresponds to the total thickness of the n-GaAs substrate 5X and the semiconductor layer 3t shown in FIGS. 9(a) and 9(b).

In this case, the thicknesses T2 and T3 of the red and infrared semiconductor laser devices 2 and 3 are smaller than the thickness T1 of the blue-violet semiconductor laser device 1, whereby the red and infrared semiconductor laser devices 2 and 3 are also cleaved when the blue-violet semiconductor laser device 1 is cleaved in preparation of the semiconductor laser apparatus 1000A. Therefore, the cavity facets can be easily formed and flat cavity facets can be easily obtained.

The blue-violet semiconductor laser device 1 is more easily influenced by strain as compared with the red and infrared semiconductor laser devices 2 and 3. In the blue-violet semiconductor laser device 1, the wavelength and the emission efficiency of the laser beam may be varied due to occurrence of strain.

If the thickness T1 of the blue-violet semiconductor laser device 1 is smaller than the thicknesses T2 and T3 of the red and infrared semiconductor laser devices 2 and 3, large strain may be caused in the blue-violet semiconductor laser device 1.

The aforementioned strain is easily caused on the emission points 11, 21 and 31 of the blue-violet, red and infrared semiconductor laser devices 1, 2 and 3. If the distances between the blue-violet, red and infrared-beam-emission points 11, 21 and 31 in the direction Y are short, therefore, strain resulting from the red and infrared semiconductor laser devices 2 and 3 is easily caused in the vicinity of the blue-violet-beam-emission point 11 of the blue-violet semiconductor laser device 1.

In the semiconductor laser apparatus 100A shown in FIG. 10, further, the blue-violet semiconductor laser device 1 and the red and infrared semiconductor laser devices 2 and 3 are bonded to each other on the surfaces formed with the ridges Ri. Also in this case, strain is easily caused in the blue-violet, red and infrared semiconductor laser devices 1, 2 and 3 due to the shapes of the ridges Ri.

According to the first embodiment, however, the thickness T1 of the blue-violet semiconductor laser device 1 is set larger than the thicknesses T2 and T3 of the red and infrared semiconductor laser devices 2 and 3 as hereinabove described, whereby the rate of occurrence of strain can be reduced in the blue-violet semiconductor laser device 1. Consequently, the variation of the wavelength and the emission efficiency of the laser beam can be reduced and stabilized in the blue-violet semiconductor laser device 1.

In particular, the thickness T1 of the blue-violet semiconductor laser device 1 is preferably 50 to 250 μm and the thicknesses T2 and T3 of the red and infrared semiconductor laser devices 2 and 3 are preferably 5 to 150 μm in the semiconductor laser apparatus 1000A shown in FIG. 10.

Referring to FIG. 10, symbols g1, g2 and g3 denote the widths (in the direction Y) of the blue-violet, red and infrared semiconductor laser devices 1, 2 and 3 respectively. The width g1 of the blue-violet semiconductor laser device 1 is preferably larger than the total of the widths g2 and g3 of the red and infrared semiconductor laser devices 2 and 3.

This relation is expressed as follows:

$$g1 > g2 + g3 \quad (3)$$

In this case, the p-side pad electrodes 13 and 14 can be formed on the insulating films 4 of the blue-violet semiconductor laser device 1, as described with reference to FIG. 2.

As hereinabove described, the semiconductor layer 1t is formed on the n-GaN substrate 1s in the blue-violet semiconductor laser device 1. Further, the semiconductor layers 2t and 3t are formed on the n-GaAs substrate 5X in the red and infrared semiconductor laser devices 2 and 3. The n-GaN substrate 1s of the blue-violet semiconductor laser device 1, which is more chemically stable as compared with the n-GaAs substrate 5X of the red and infrared semiconductor laser devices 2 and 3, is inferior in processability.

In processing of the blue-violet, red and infrared semiconductor laser devices 1, 2 and 3, however, the blue-violet semiconductor laser device 1 having the width g1 larger than the widths g2 and g3 of the red and infrared semiconductor laser devices 2 and 3 as shown in the above formula (3) requires no processing such as etching. Thus, the semiconductor laser apparatus 1000A can be easily prepared.

Referring to FIG. 10, symbol h denotes the distance between the blue-violet-beam-emission point 11 and the side surface of the blue-violet semiconductor laser device 1 closer to the red semiconductor laser device 2 in the direction Y. In this case, the width g2 of the red semiconductor laser device 2 is preferably smaller than the distance h.

This relation is expressed as follows:

$$g2 < h \tag{4}$$

Thus, the p-side pad electrode 13 can be formed on the corresponding insulating film 4 of the blue-violet semiconductor laser device 1, as described with reference to FIG. 2.

The distance between the blue-violet-beam-emission point 11 and the side surface of the blue-violet semiconductor laser device 1 closer to the infrared semiconductor laser device 3 in the direction Y and the width g3 of the infrared semiconductor laser device 3 also preferably satisfy relation similar to that expressed in the above formula (4). In this case, an effect similar to the above can be attained.

In the semiconductor laser apparatus 1000A shown in FIG. 10, the width g1 of the blue-violet semiconductor laser device 1 is preferably 300 to 1500 μm, and the widths g2 and g3 of the red and infrared semiconductor laser devices 2 and 3 are preferably 30 to 400 μm. Further, the distance h between the blue-violet-beam-emission point 11 and the side surface of the blue-violet semiconductor laser device 1 closer to the red semiconductor laser device 2 in the direction Y is preferably 150 to 750 μm.

Referring to FIG. 10, symbol a denotes the distance between the blue-violet and red-beam-emission points 11 and 21 in the direction Y, and symbol b denotes the distance between the red-beam-emission point 21 and the side surface of the blue-violet semiconductor laser device 1 closer to the red semiconductor laser device 2 in the direction Y. The distance a is preferably smaller than the distance b.

This relation is expressed as follows:

$$b > a \tag{5}$$

In this case, the red-beam-emission point 21 is positioned closer to the blue-violet-beam-emission point 11 as compared with a case where the red-beam-emission point 21 is positioned at the center of the portion between the blue-violet-beam-emission point 11 and the side surface of the blue-violet semiconductor laser device 1 closer to the red semiconductor laser device 2 in the direction Y, whereby the distance between the blue-violet-beam-emission point 11 of the blue-violet semiconductor laser device 1 and the red-beam-emission point 21 of the red semiconductor laser device 2 can be short. Therefore, both of the blue-violet and red-beam-emission points 11 and 21 can be closer to the center of the semiconductor laser apparatus 1000A.

Thus, the distance between the blue-violet and red-beam-emission points 11 and 21 in the direction Y can be so short that a common optical system can be employed for the laser beams emitted from the blue-violet and red-beam-emission points 11 and 21 respectively.

Thus, both of the blue-violet and red semiconductor laser devices 1 and 2 are improved in light extraction efficiency when the laser beams are condensed through a lens.

Further, the laser beams emitted from the blue-violet and red-beam-emission points 11 and 21 respectively can pass through the center of a common lens. Thus, light aberration resulting from passage of the laser beams through the lens is reduced to require no component for correcting light aberration. Consequently, an optical system such as an optical pickup is downsized and reduced in cost.

The distance between the blue-violet and red-beam-emission points 11 and 31 and the distance between the red-beam-emission point 31 and the side surface of the blue-violet semiconductor laser device 1 closer to the infrared semiconductor laser device 3 also preferably satisfy relation similar to that expressed in the above formula (5). In this case, an effect similar to the above can be attained.

In particular, the distance a between the blue-violet and red-beam-emission points 11 and 21 in the direction Y is preferably 10 to 400 μm and the distance b between the red-beam-emission point 21 and the side surface of the blue-violet semiconductor laser device 1 closer to the red semiconductor laser device 2 is preferably 100 to 700 μm in the semiconductor laser apparatus 1000A shown in FIG. 10.

Referring to FIG. 10, symbol c denotes the distance between a first side surface of the red semiconductor laser device 2 and the red-beam-emission point 21 in the direction Y, and symbol d denotes the distance between a second side surface of the red semiconductor laser device 2 and the red-beam-emission point 21 in the direction Y.

The distance c between the first side surface of the red semiconductor laser device 2 and the red-beam-emission point 21 in the direction Y is preferably smaller than the distance d between the second side surface of the red semiconductor laser device 2 and the red-beam-emission point 21 in the direction Y.

This relation is expressed as follows:

$$d > c \tag{6}$$

In other words, the red-beam-emission point 21 of the red semiconductor laser device 2 is preferably positioned closer to the blue-violet-beam-emission point 11 of the blue-violet semiconductor laser device 1 than the center of the red semiconductor laser device 2 in the direction Y.

In this case, the red-beam-emission point 21 of the red semiconductor laser device 2 can be closer to the blue-violet-beam-emission point 11 of the blue-violet semiconductor laser device 1, whereby both of the blue-violet and red-beam-emission points 11 and 21 can be closer to the center of the semiconductor laser apparatus 1000A.

Therefore, the distance between the blue-violet and red-beam-emission points 11 and 21 in the direction Y can be so short that a common optical system can be employed for the laser beams emitted from the blue-violet and red-beam-emission points 11 and 21 respectively.

Thus, both of the blue-violet and red semiconductor laser devices 1 and 2 are improved in light extraction efficiency when the laser beams are condensed through a lens.

Further, the laser beams emitted from the blue-violet and red-beam-emission points 11 and 21 respectively can pass through the center of a common lens. Thus, light aberration resulting from passage of the laser beams through the lens is reduced to require no component for correcting light aberration. Consequently, an optical system such as an optical pickup is downsized and reduced in cost.

According to the first embodiment, the wire 2Wb is connected to the n electrode 23 formed on the red semiconductor laser device 2, as described with reference to FIG. 2. The n electrode 23 must have a prescribed size for the connection with the wire 2Wb.

When the relation of the above formula (6) is satisfied, the red-beam-emission point 21 can be closer to the blue-violet-beam-emission point 11 of the blue-violet semiconductor laser device 1 while ensuring the size of the n electrode 23 of the red semiconductor laser device 2 in the direction Y.

When the relation of the above formula (6) is satisfied, therefore, the wire 2Wb can be reliably and easily connected to the red semiconductor laser device 2.

When the relation of the above formula (6) is satisfied, in addition, the width g2 of the red semiconductor laser device 2 can be ensured in the direction Y.

Therefore, the width g2 of the red semiconductor laser device 2 is so ensured in the direction Y that heat generated in the red-beam-emission point 21 of the red semiconductor laser device 2 spreads in the direction Y, thereby improving heat dissipativity of the red semiconductor laser device 2. Thus, the red semiconductor laser device 2 is improved in temperature characteristic as well as in reliability.

The distance between a first side surface of the infrared semiconductor laser device 3 and the infrared-beam-emission point 31 in the direction Y and the distance between a second side surface of the infrared semiconductor laser device 3 and the infrared-beam-emission point 31 in the direction Y also preferably satisfy relation similar to that expressed in the above formula (6). In this case, an effect similar to the above can be attained.

In the semiconductor laser apparatus 1000A according to the first embodiment, the distance c between a first side surface of the red semiconductor laser device 2 and the red-beam-emission point 21 in the direction Y is preferably 5 to 150 μm, and the distance d between a second side surface of the red semiconductor laser device 2 and the red-beam-emission point 21 in the direction Y is preferably 25 to 350 μm.

Referring to FIG. 10, symbol f denotes the distance between opposite side surfaces of the red and infrared semiconductor laser devices 2 and 3 bonded onto the blue-violet semiconductor laser device 1. According to the first embodiment, the distance f is preferably 50 to 400 μm.

Referring to FIG. 10, symbol e denotes the distance between a second side surface of the red semiconductor laser device 2 and the side surface of the blue-violet semiconductor laser device 1 closer to the red semiconductor laser device 2. According to the first embodiment, the distance e is preferably 30 to 300 μm.

The relation between the distance f between the red and infrared semiconductor laser devices 2 and 3 and the distance e between the side surfaces of the red and blue-violet semiconductor laser devices 2 and 1 is preferably decided in response to processability of wire bonding, wiring and the like.

Consider that the distances e and f are in the following relation:

$$f > e \qquad (7)$$

In this case, the distance f between the red and infrared semiconductor laser devices 2 and 3 is so large that a connector employed for connecting the wire 1W to the p electrode of the blue-violet semiconductor laser device 1 as described with reference to FIG. 2 is prevented from coming into contact with the red and infrared semiconductor laser devices 2 and 3.

Further, the distance e can be so short that the blue-violet semiconductor laser device 1 can be finely cut in preparation of the semiconductor laser apparatus 1000A. Thus, the number of semiconductor laser apparatuses 1000A prepared from a single wafer can be increased.

Consider that the distances e and f are in the following relation:

$$f < e \qquad (8)$$

In this case, a sufficient region for connecting the wire 2Wa can be ensured between the side surfaces of the red and blue-violet semiconductor laser devices 2 and 1 as shown in FIG. 2 also when the distance between the red and infrared-beam-emission points 21 and 31 of the red and infrared semiconductor laser devices 2 and 3 is short. Thus, the wires 2Wa and 2Wb are reliably and easily connected to the red semiconductor laser device 2.

Also between the distance f between the red and infrared semiconductor laser devices 2 and 3 and the distance between the outer side surface of the red semiconductor laser device 3 and the side surface of the blue-violet semiconductor laser device 1, relation similar to that expressed in the above formula (7) or (8) is so satisfied as to attain an effect similar to the above in response to the relation.

FIG. 10 illustrates the structures of the red and infrared semiconductor laser devices 2 and 3 provided on the blue-violet semiconductor laser device 1 as symmetrical in the direction Y with respect to the center of the blue-violet semiconductor laser device 1 in the direction Y.

Alternatively, the shapes and the structures of the red and infrared semiconductor laser devices 2 and 3 provided on the blue-violet semiconductor laser device 1 may be asymmetrical in the direction Y with respect to the center of the blue-violet semiconductor laser device 1 in the direction Y.

Figure 11:
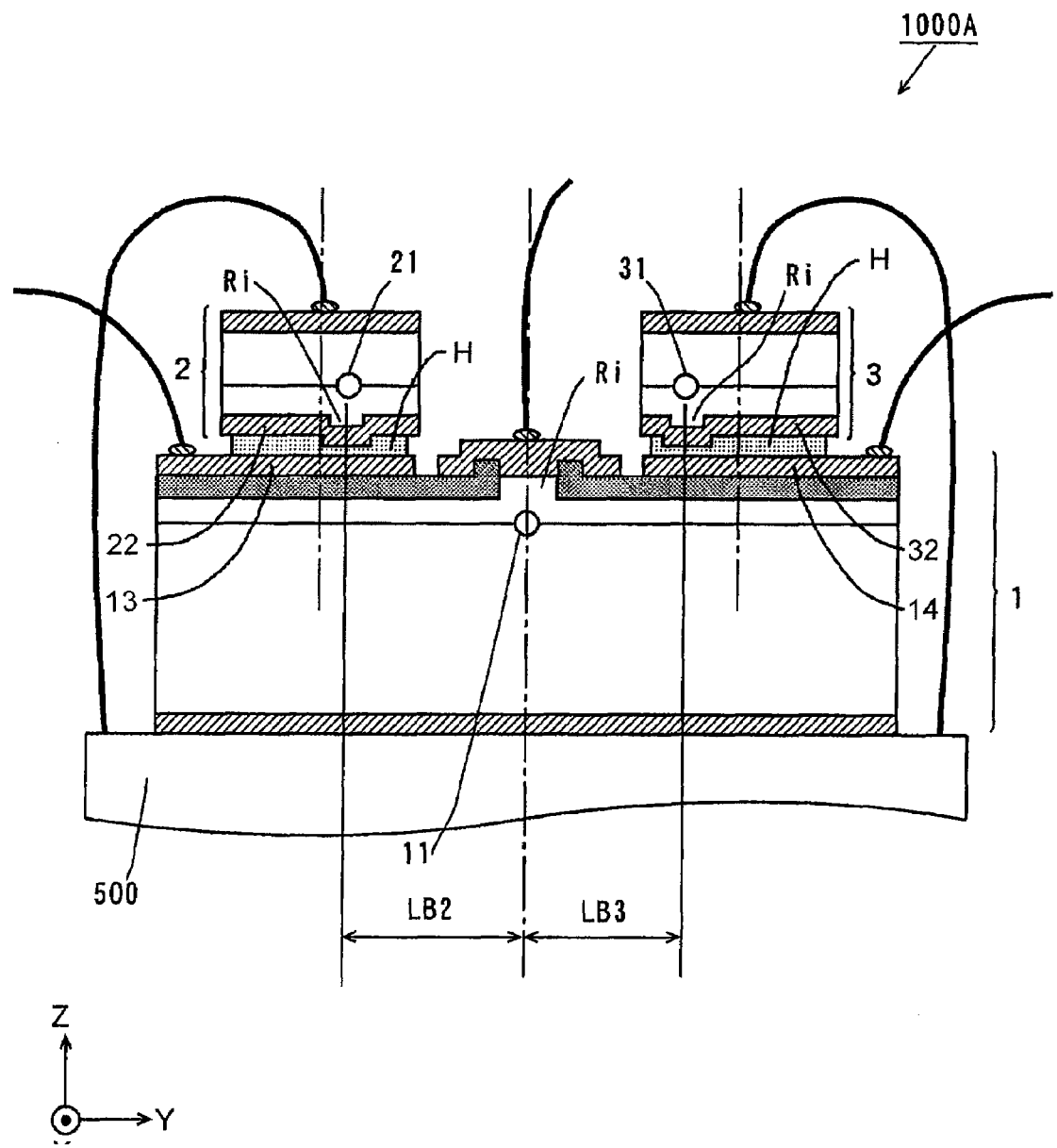
FIG. 11 schematically illustrates exemplary red and infrared-beam-emission points asymmetrically formed with respect to the center of the blue-violet semiconductor laser device.
Figure 12:
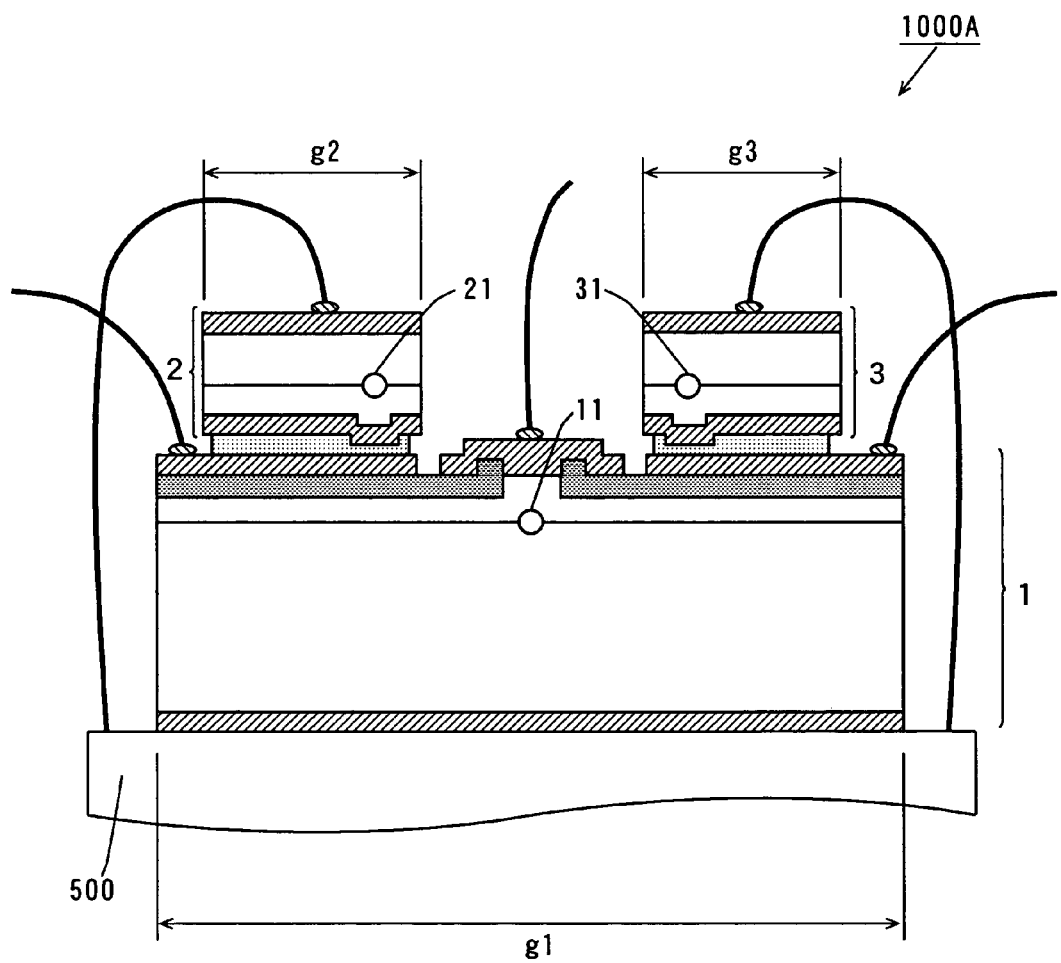
FIG. 12 schematically illustrates exemplary red and infrared semiconductor laser devices having widths asymmetrical with respect to the center of the blue-violet semiconductor laser device.
Figure 14:
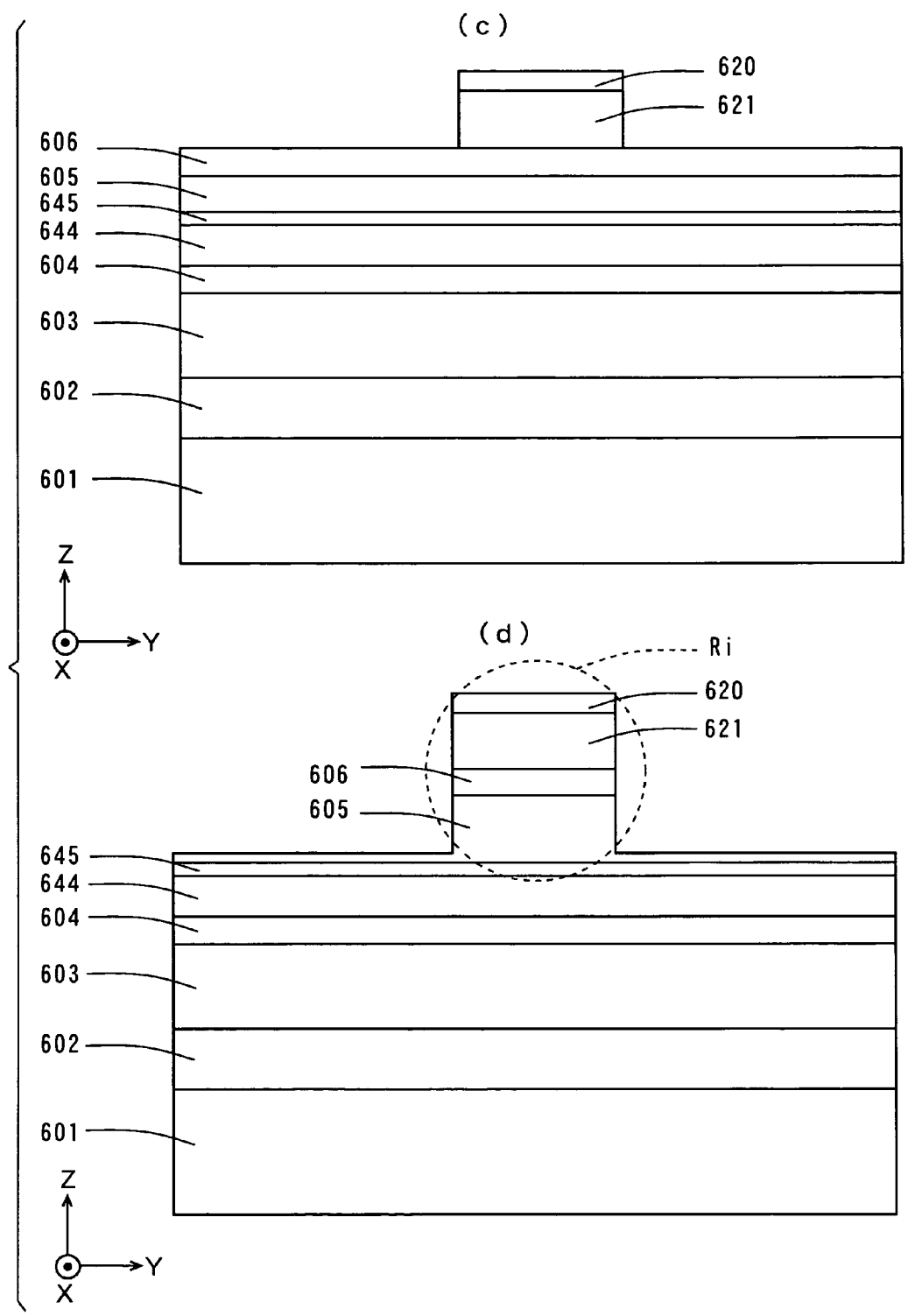
Figure 15:
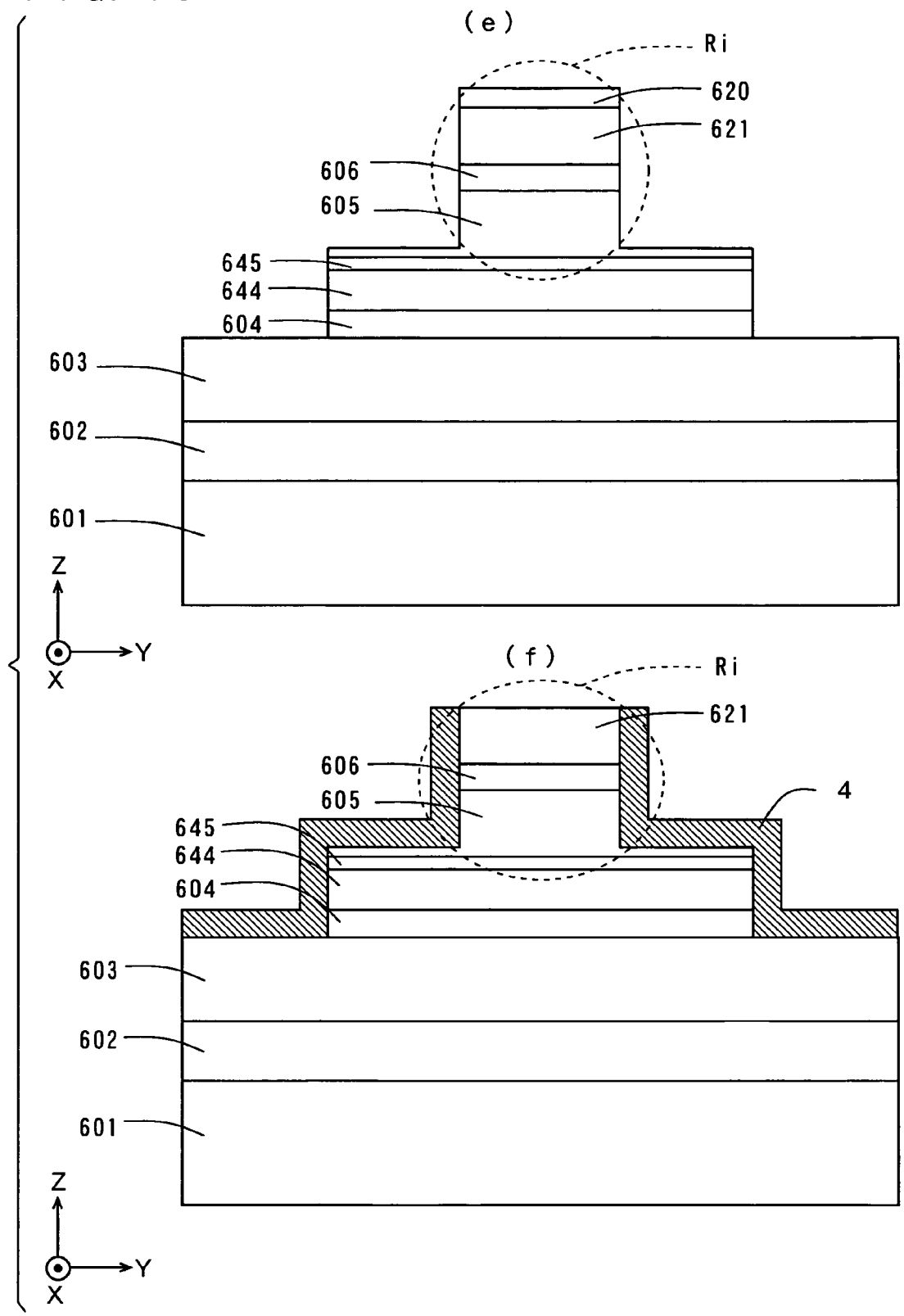
Figure 16:
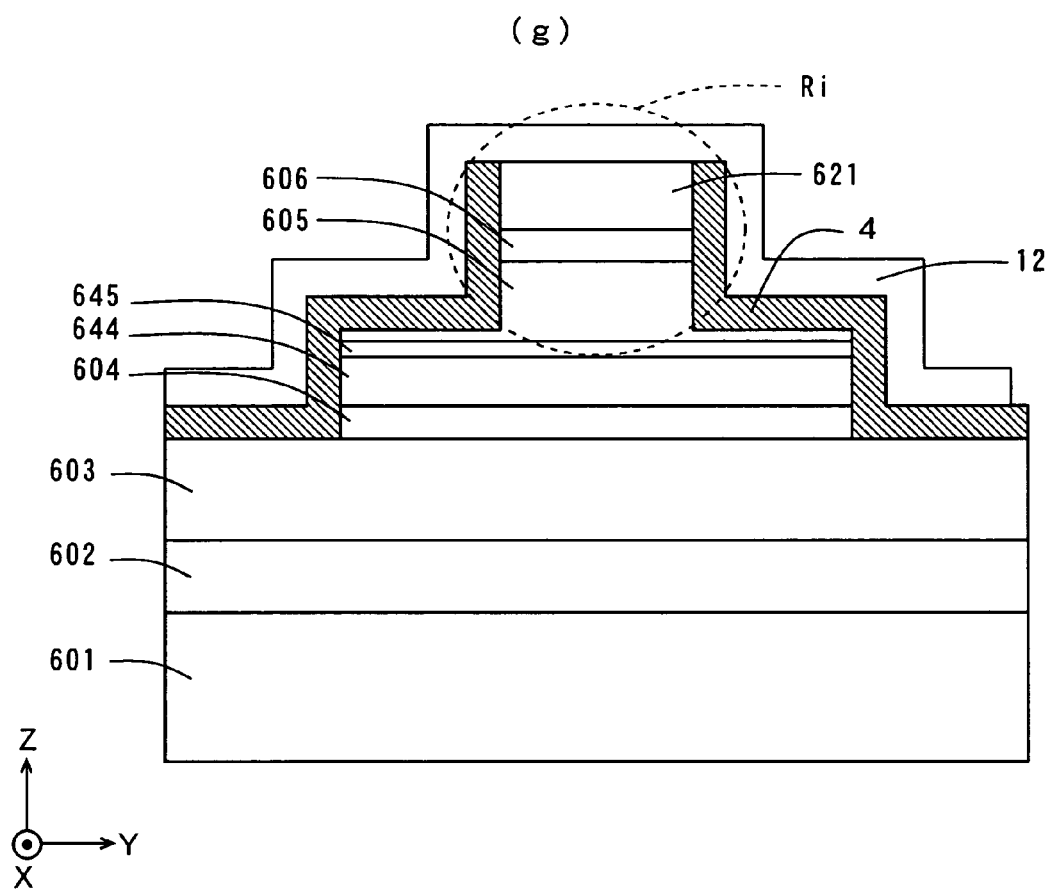
Figure 17:
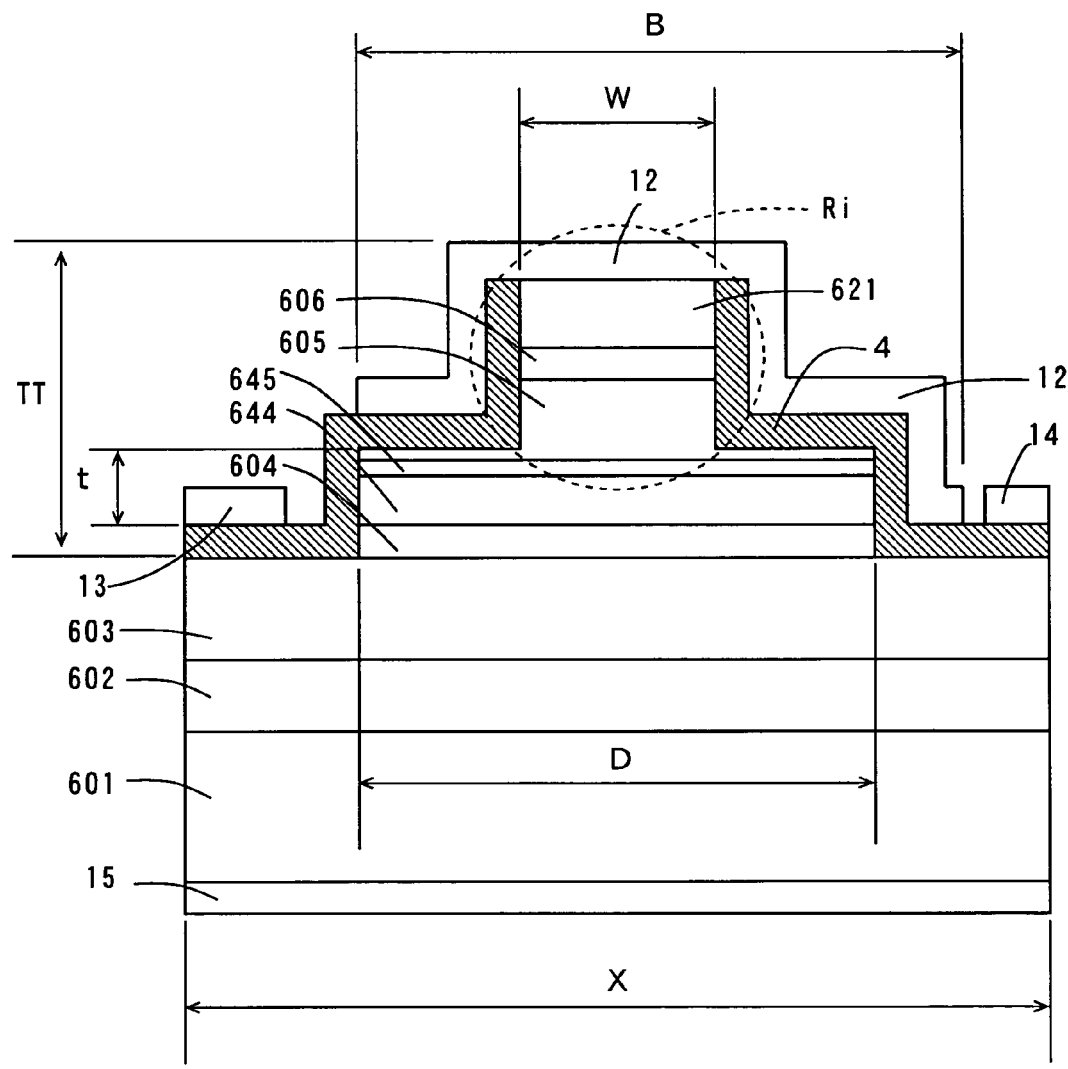
Figure 18:
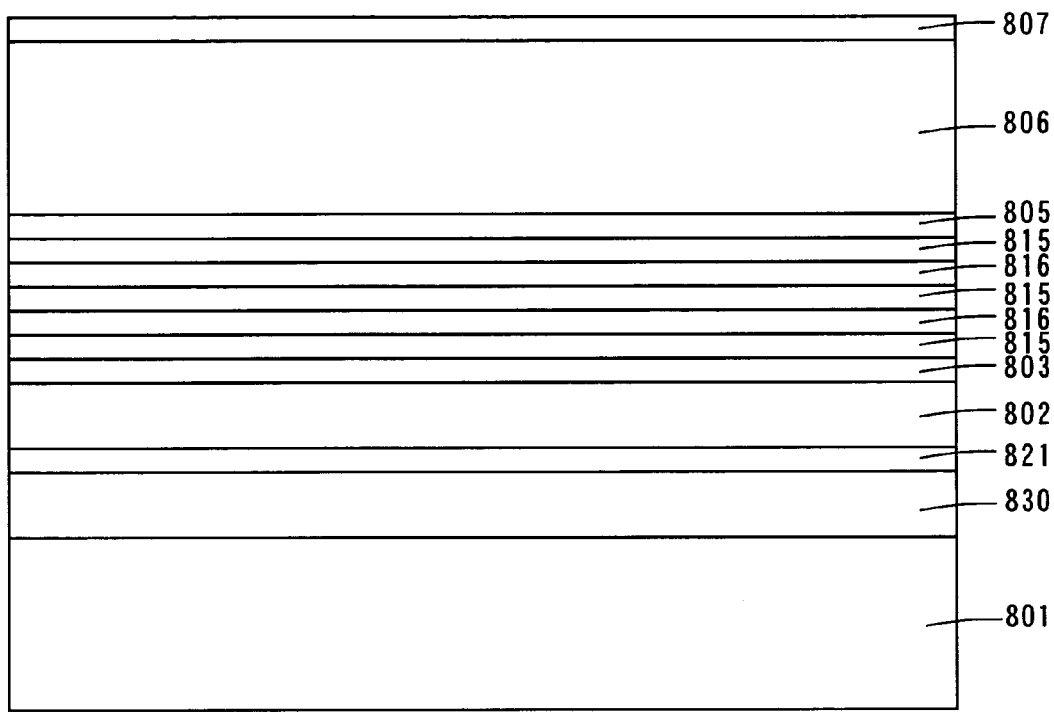
Figure 20:
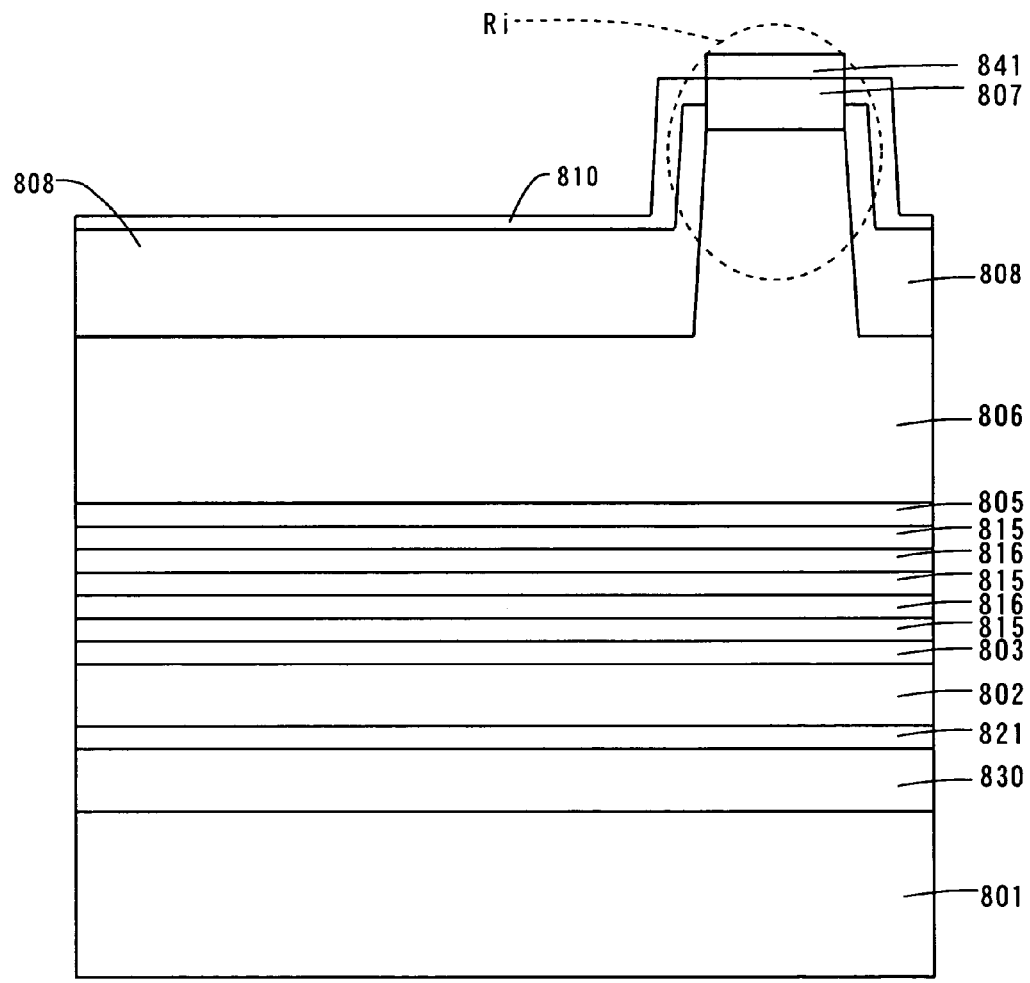
Figure 21:
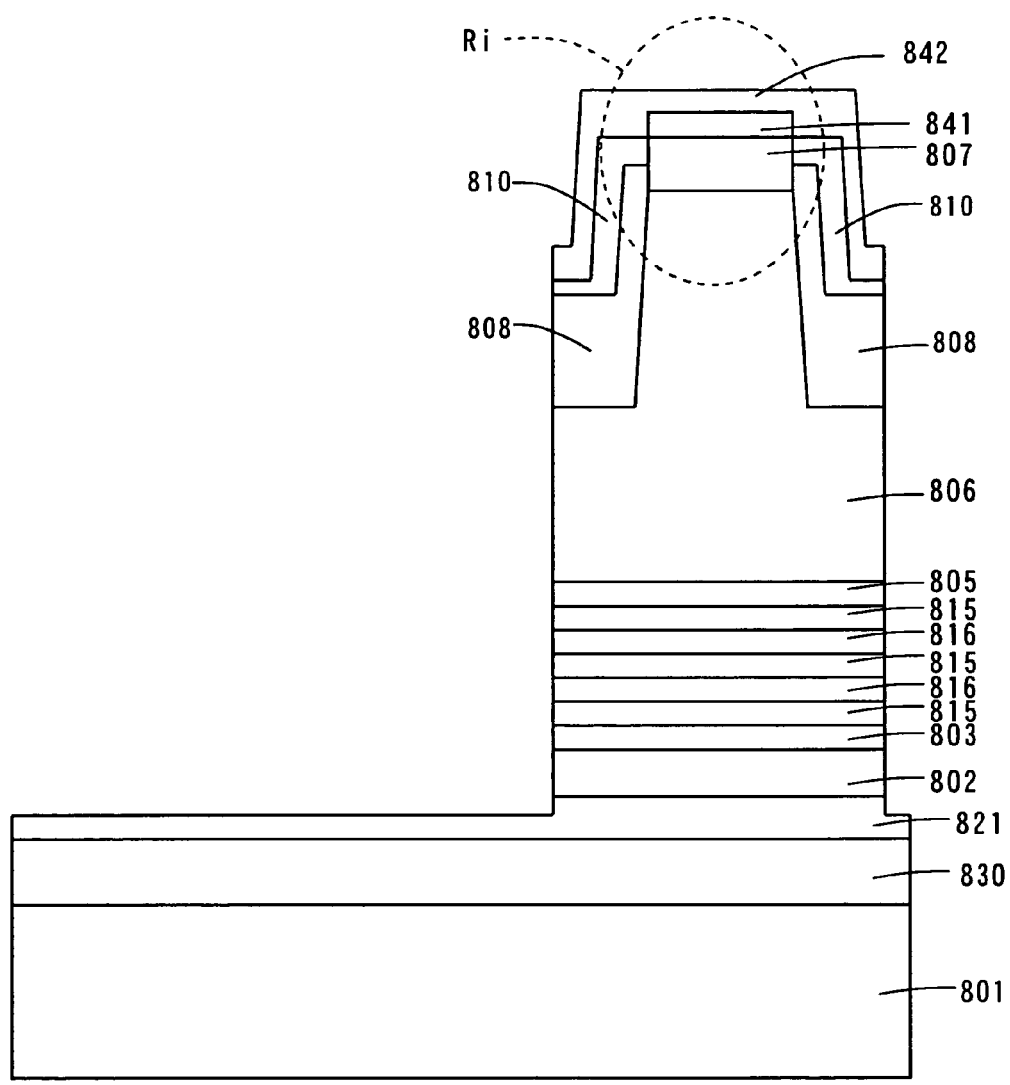
Figure 23:
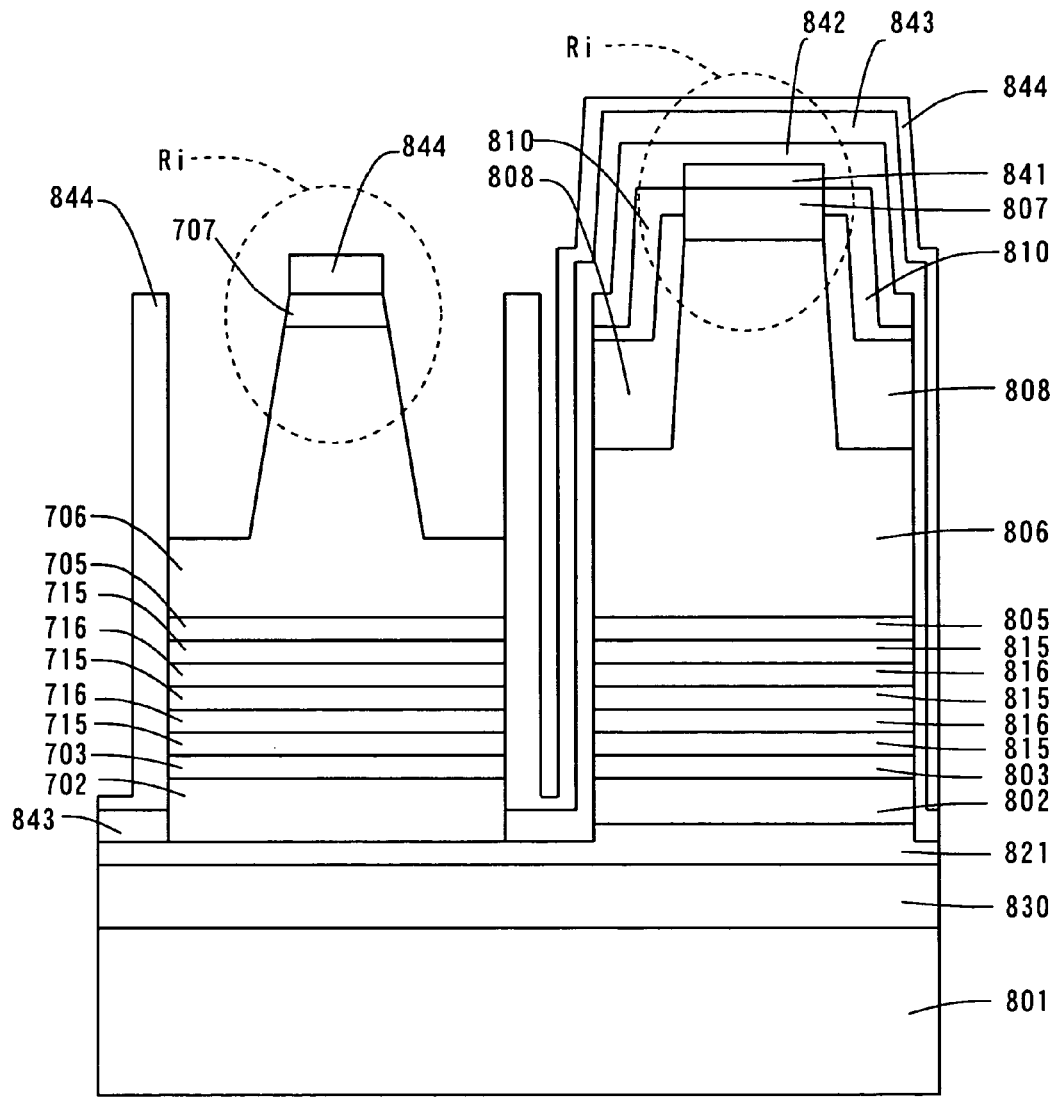
Figure 26:
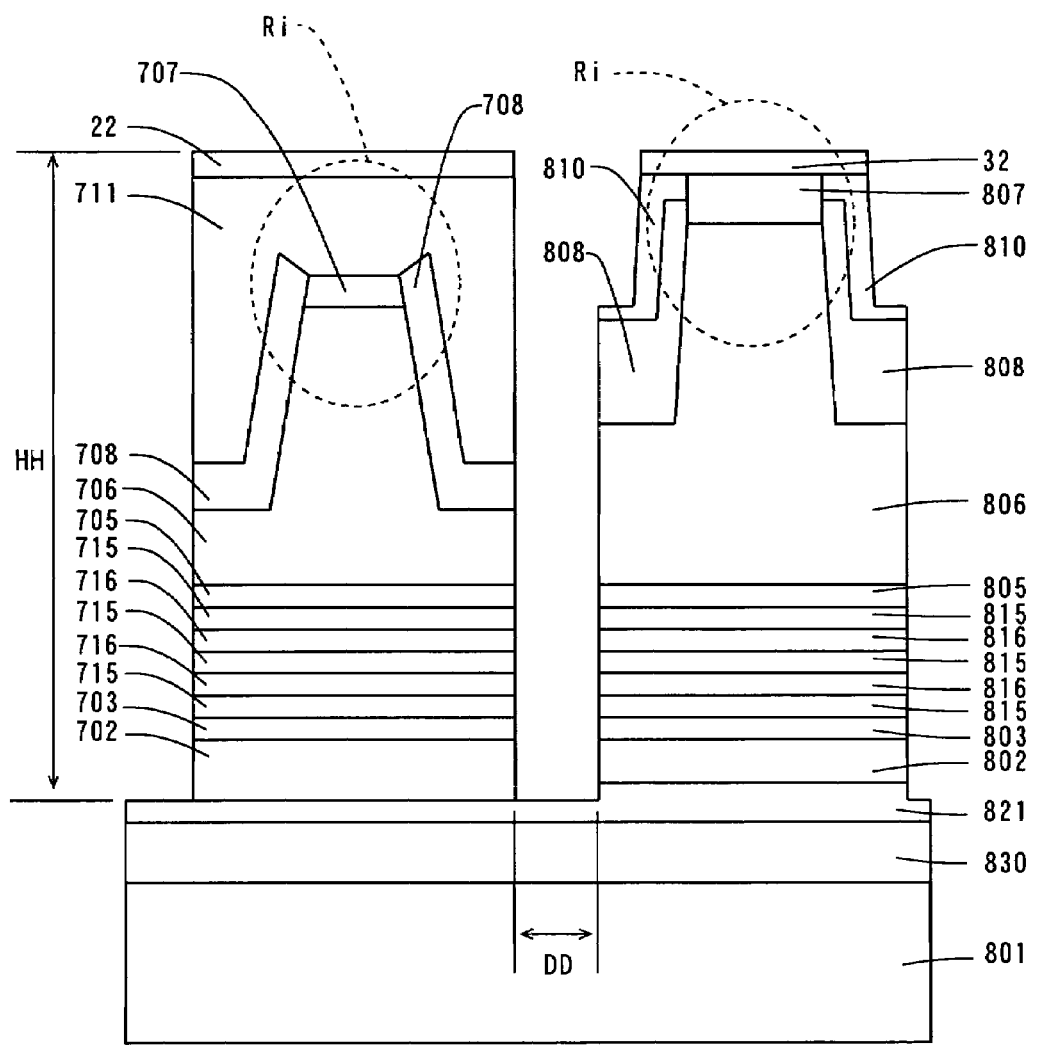
Figure 27:
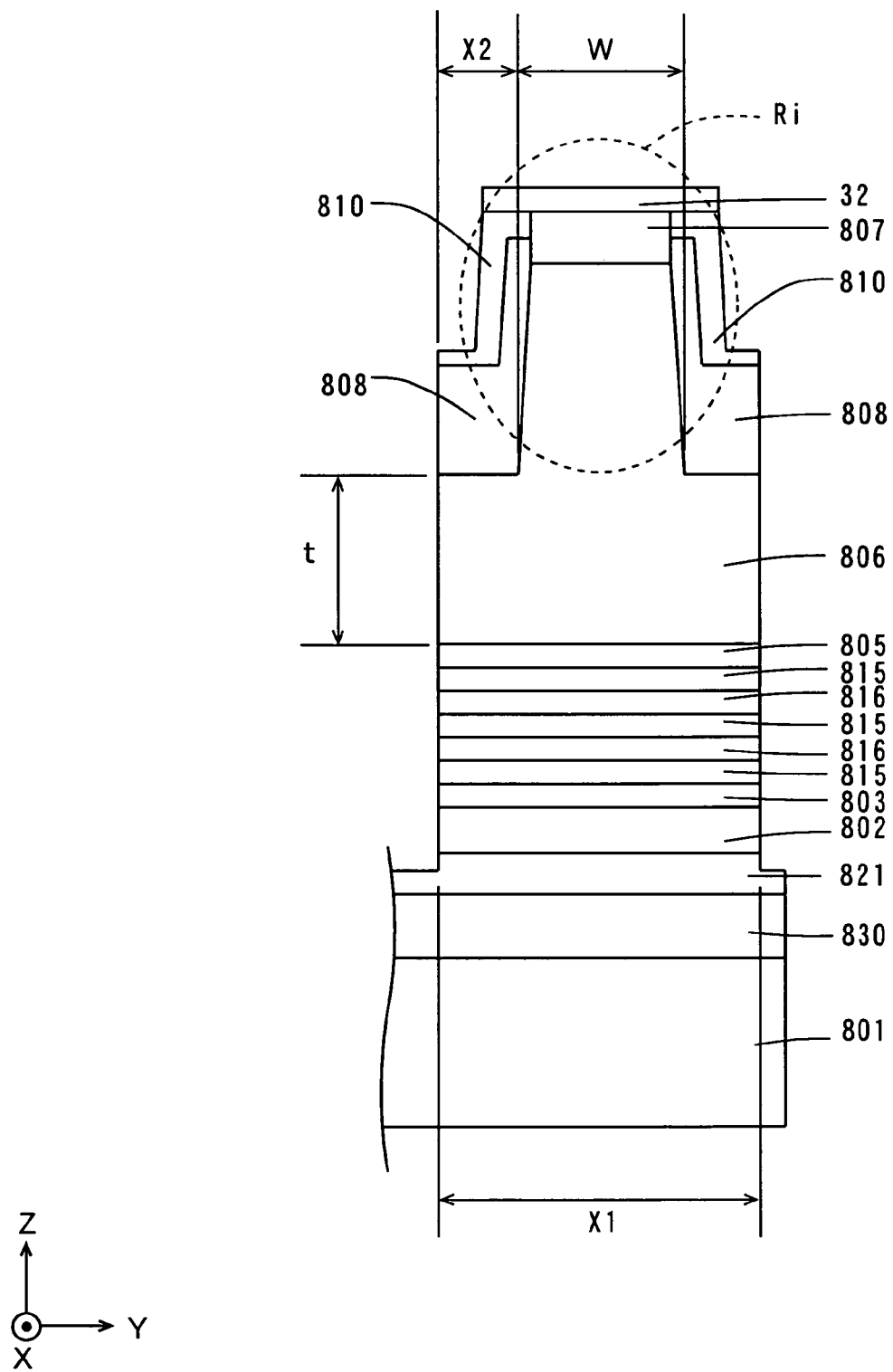
Figure 28:
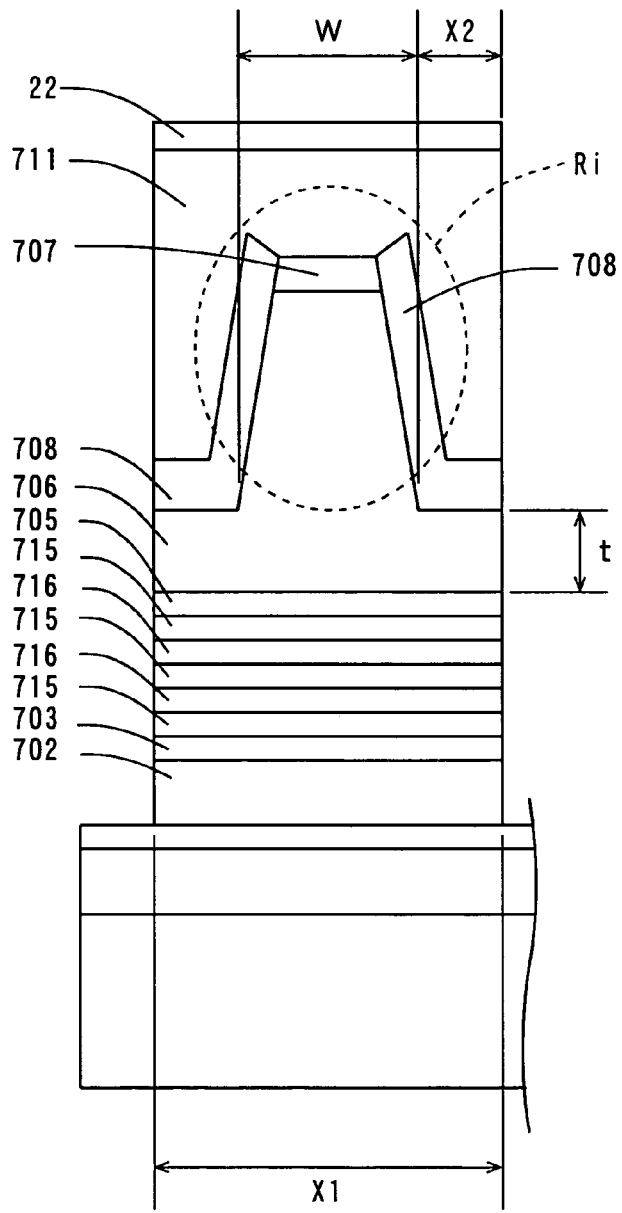

FIG. 11 schematically illustrates exemplary red and infrared-beam-emission points 21 and 31 asymmetrically formed with respect to the center of the blue-violet semiconductor laser device 1, and FIG. 12 illustrates exemplary red and infrared semiconductor laser devices 2 and 3 having widths g2 and g3 asymmetrical with respect to the center of the blue-violet semiconductor laser device 1.

In the example shown in FIG. 11, the distance LB3 between blue-violet and infrared-beam-emission points 11 and 31 in the direction Y is smaller than the distance LB2 between the blue-violet-beam-emission point 11 and a red-beam-emission point 21 in the direction Y.

In the example shown in FIG. 12, the width g3 of the infrared semiconductor laser device 3 in the direction Y is smaller than the width g2 of the red semiconductor laser device 2 in the direction Y.

Referring to FIG. 11, the distance LB3 may alternatively be larger than the distance LB2. Referring to FIG. 12, the width g3 may alternatively be larger than the width g2.

As shown in FIGS. 11 and 12, the semiconductor laser apparatus 1000A can attain the aforementioned various effects by satisfying the conditions of the above formulas (1) to (8) also when the widths g2 and g3 and the emission points 21 and 31 of the red and infrared semiconductor laser devices 2 and 3 are asymmetrical with respect to the center of the blue-violet semiconductor laser device 1.

In the semiconductor laser apparatus 1000A according to the first embodiment, the insulating films 4 are so formed as to extend from the side surfaces of the ridge Ri of the blue-violet semiconductor laser device 1 toward the red and infrared semiconductor laser devices 2 and 3 respectively in the direction Y, as hereinabove described.

The insulating films 4 serve as current blocking layers for the blue-violet semiconductor laser device 1. Further, the insulating films 4 electrically isolate the p-side pad electrodes 13 and 14 and the p-side pad electrode 12 from each other. Thus, the insulating films 4 are so formed on the blue-violet semiconductor laser device 1 as to form current blocking layers and electrically isolate the p-side pad electrodes 13 and 14 and the p-side pad electrode 12 from each other, whereby the manufacturing steps for the integrated semiconductor laser apparatus 1000A can be simplified.

In the semiconductor laser apparatus 1000A according to the first embodiment, the p-side pad electrodes 22 and 32 of the red and infrared semiconductor laser devices 2 and 3 are bonded to the p-side pad electrodes 13 and 14 provided on the surface of the blue-violet semiconductor laser device 1 with the insulating film 4 sandwiched therebetween. Further, the p-side pad electrodes 12, 22 and 32 of the blue-violet, red and infrared semiconductor laser devices 1, 2 and 3 are electrically isolated from each other.

Thus, arbitrary voltages can be supplied to the p-side pad electrodes 12, 22 and 32 of the blue-violet, red and infrared semiconductor laser devices 1, 2 and 3 respectively. Therefore, the driving system for the blue-violet, red and infrared semiconductor laser devices 1, 2 and 3 can be arbitrarily selected.

Further, the p-side pad electrodes 12, 22 and 32 of the blue-violet, red and infrared semiconductor laser devices 1, 2 and 3 are formed on the surfaces of the semiconductor layers it, 2t and 3t respectively. The p-side pad electrodes 22 and 32 formed on the surfaces of the red and infrared semiconductor laser devices 2 and 3 of the semiconductor layers 2t and 3t respectively are bonded to the surface of the blue-violet semiconductor laser device 1 of the semiconductor layer 1t with the insulating films 4 sandwiched therebetween.

Thus, the semiconductor layers it, 2t and 3t of the blue-violet, red and infrared semiconductor laser devices 1, 2 and 3 are positioned so close to each other that the distances between the blue-violet, red and infrared-beam-emission points 11, 21 and 31 of the blue-violet, red and infrared semiconductor laser devices 1, 2 and 3 can be short. Therefore, all of the blue-violet, red and infrared-beam-emission points 11, 21 and 31 of the blue-violet, red and infrared semiconductor laser devices 1, 2 and 3 can be closer to the center of the semiconductor laser apparatus 1000A.

Thus, a common optical system can be employed for the laser beams emitted from the blue-violet, red and infrared-beam-emission points 11, 21 and 31 of the blue-violet, red and infrared semiconductor laser devices 1, 2 and 3 respectively. Consequently, all of the blue-violet, red and infrared semiconductor laser devices 1, 2 and 3 are improved in light extraction efficiency when the laser beams emitted from the blue-violet, red and infrared-beam-emission points 11, 21 and 31 respectively are condensed through a lens.

Further, the blue-violet, red and infrared-beam-emission points 11, 21 and 31 are so close to each other that the laser beams emitted from the blue-violet, red and infrared-beam-emission points 11, 21 and 31 can pass through the center of a common lens. Thus, light aberration resulting from passage of the laser beams through the lens is reduced to require no component for correcting light aberration. Consequently, an optical system such as an optical pickup is downsized and reduced in cost.

In the semiconductor laser apparatus 1000A according to the first embodiment, the thickness T1 of the blue-violet semiconductor laser device 1 is so set smaller than the thicknesses T2 and T3 of the red and infrared semiconductor laser devices 2 and 3 as to reduce the strain in the n-GaN substrate is and the semiconductor layer 1t of the blue-violet semiconductor laser device 1. Thus, the wavelength and the emission efficiency of the laser beam emitted from the blue-violet semiconductor laser device 1 are stabilized.

In addition, the red-beam-emission point 21 of the red semiconductor laser device 2 may be formed on the position close to the blue-violet-beam-emission point 11 of the blue-violet semiconductor laser device 1 in the direction Y and the infrared-beam-emission point 31 of the infrared semiconductor laser device 3 may be formed on the position close to the blue-violet-beam-emission point 11 of the blue-violet semi-conductor laser device 1 in the direction Y in the semiconductor laser apparatus 1000A according to the first embodiment, as shown in FIG. 10.

Thus, the distances between the blue-violet, red and infrared-beam-emission points 11, 21 and 31 are so short that all of the blue-violet, red and infrared-beam-emission points 11, 21 and 31 can be closer to the center of the semiconductor laser apparatus 1000A. Therefore, a common optical system can be employed for the laser beams emitted from the blue-violet, red and infrared-beam-emission points 11, 21 and 31 respectively.

Consequently, all of the blue-violet, red and infrared semiconductor laser devices 1, 2 and 3 are improved in light extraction efficiency when the laser beams emitted from the blue-violet, red and infrared-beam-emission points 11, 21 and 31 respectively are condensed through a lens.

Further, the laser beams emitted from the blue-violet, red and infrared-beam-emission points 11, 21 and 31 respectively can pass through the center of a common lens. Thus, light aberration resulting from passage of the laser beams through the lens is reduced to require no component for correcting light aberration. Consequently, an optical system such as an optical pickup is downsized and reduced in cost.

According to the first embodiment, the wire 2Wa is connected to the p-side pad electrode 13 provided on the opposite side to the p-side pad electrode 12 of the blue-violet semiconductor laser device 1 with respect to the red semiconductor laser device 2 in the direction Y while the wire 3Wa is connected to the p-side pad electrode 14 provided on the opposite side to the p-side pad electrode 12 of the blue-violet semiconductor laser device 1 with respect to the infrared semiconductor laser device 3 in the direction Y, as shown in FIG. 2.

Thus, the p-side pad electrodes 13 and 14 of the red and infrared semiconductor laser devices 2 and 3 can be reliably and easily wire-bonded. Further, wiring is simplified.

In the semiconductor laser apparatus 1000A according to the first embodiment, the n-GaN substrate 1s of the blue-violet semiconductor laser device 1 is a translucent substrate. Therefore, the red and infrared semiconductor laser devices 2 and 3 bonded to the surface of the blue-violet semiconductor laser device 1 are viewable through the n-GaN substrate 1s.

Thus, the red and infrared semiconductor laser devices 2 and 3 can be easily aligned. Therefore, the bonded positions can be correctly adjusted. Consequently, accuracy of alignment of the blue-violet, red and infrared-beam-emission points 11, 21 and 31 of the blue-violet, red and infrared semiconductor laser devices 1, 2 and 3 can be improved.

Further, the n-GaN substrate 1s and the semiconductor layer 1t composed of nitride-based semiconductors are employed for the blue-violet semiconductor laser device 1. The n-GaN substrate 1s and the semiconductor layer 1t are so composed of the nitride-based semiconductors having high thermal conductivity as to improve heat dissipativity of the semiconductor layer 1t of the blue-violet semiconductor laser device 1. Thus, the blue-violet semiconductor laser device 1 is improved in temperature characteristic as well as in reliability.

In addition, the red and infrared semiconductor laser devices 2 and 3 have the n electrodes 23 and 33 on the surfaces opposite to the junctions with the blue-violet semiconductor laser device 1 respectively. The n electrodes 23 and 33 of the red and infrared semiconductor laser devices 2 and 3 are so positioned on the surfaces opposite to the blue-violet semi-conductor laser device 1 that the n electrodes 23 and 33 of the red and infrared semiconductor laser devices 2 and 3 can be wired from the same side as the p-side pad electrode 12 of the blue-violet semiconductor laser device 1.

As shown in FIG. 1, the insulating films 4 are formed on the side surfaces of the ridge Ri of the blue-violet semiconductor laser device 1. Thus, the insulating films 4 formed on the side surfaces of the ridge Ri narrow a current to the ridge Ri in the blue-violet semiconductor laser device 1.

According to the first embodiment, the semiconductor laser apparatus 1000A is prepared by integrating the blue-violet, red and infrared semiconductor laser devices 1, 2 and 3 with each other. However, the present invention is not restricted to this but a plurality of integrated semiconductor laser devices may alternatively emit light beams of other wavelengths.

In the method of manufacturing the semiconductor laser apparatus 1000A according to the first embodiment, the blue-violet, red and infrared semiconductor laser devices 1, 2 and 3 are prepared.

Then, the stacked substrate is so formed that the semiconductor layer 1t of the blue-violet semiconductor laser device 1 and the semiconductor layers 2t and 3t of the red and infrared semiconductor laser devices 2 and 3 are opposite to each other.

Thereafter the stacked substrate is so cleaved as to prepare the semiconductor laser apparatus 1000A.

Thus, the semiconductor laser apparatus 1000A can be obtained by cleaving the stacked substrate, whereby the n-GaN substrate 1s of the blue-violet semiconductor laser device 1 and the n-GaAs substrates 50 of the red and infrared semiconductor laser devices 2 and 3 may not be individually cleaved but the manufacturing steps are simplified.

As hereinabove described, the n-GaN substrate 1s has such transmittance and thickness that the red and infrared semiconductor laser devices 2 and 3 are viewable through the n-GaN substrate 1s.

The n-GaN substrate 1s has translucence so that the positions of the red and infrared semiconductor laser devices 2 and 3 bonded onto the blue-violet semiconductor laser device 1 can be confirmed through the blue-violet semiconductor laser device 1.

Thus, the blue-violet, red and infrared semiconductor laser devices 1, 2 and 3 can be easily aligned with each other. Further, accuracy of alignment of the blue-violet, red and infrared semiconductor laser devices 1, 2 and 3 is so improved that accuracy of alignment of the blue-violet, red and infrared-beam-emission points 11, 21 and 31 is also improved.

The n-GaN substrate 1s has conductivity. Thus, the semiconductor laser apparatus 1000A is so mounted on the stem 500 as shown in FIG. 2 that the n electrode 15 provided on the n-GaN substrate 1s is electrically connected with the stem 500.

Thus, both of the p-side pad electrode 12 and the n electrode 15 for driving the blue-violet semiconductor laser device 1 may not be provided on the insulating films 4 of the blue-violet semiconductor laser device 1. Consequently, the semiconductor laser apparatus 1000A is simplified in structure, and downsized.

When the semiconductor laser apparatus 100A is applied to an optical pickup, the n-GaN substrate 1s is bonded onto the stem 500 as shown in FIG. 2. The n-GaN substrate 1s is higher in thermal conductivity than the n-GaAs substrate 50, whereby the semiconductor laser apparatus 1000A is improved in heat dissipativity as well as in reliability.

If an insulating material is employed for a substrate of the blue-violet semiconductor laser device 1, a step of removing the substrate of the insulating material is required after formation of the stacked substrate in order to provide the n electrode 15 for driving the blue-violet semiconductor laser device 1 on the substrate, to result in complication of the manufacturing steps. When the substrate of the insulating material is removed, further, the blue-violet semiconductor laser device 1 may be damaged to deteriorate the device characteristics.

When the substrate is removed, in addition, the thickness of the n-GaAs substrate 50 for the red and infrared semiconductor laser devices 2 and 3 must be increased. However, the thermal conductivity of the n-GaAs substrate 50 is lower than that of the n-GaN substrate 1s, and hence the semiconductor laser apparatus 1000A is deteriorated in heat dissipativity and reduced in reliability as compared with the case of employing the n-GaN substrate 1s.

While the semiconductor laser apparatus 1000A is mounted on the stem 500 according to the first embodiment as shown in FIG. 2, the semiconductor laser apparatus 1000A may alternatively be mounted on a heat sink composed of an insulating material such as AlN, SiC, Si or diamond or a conductive material such as Cu, CuW or Al.

A metal can package or a resin frame package may be employed for the semiconductor laser apparatus 1000A, so far as the package can store the semiconductor laser apparatus 1000A therein.

Finally, a specific method of manufacturing the semiconductor laser apparatus 1000A according to the first embodiment is described in more detail.

FIGS. 13(a) to 31 are process drawings for illustrating the specific method of manufacturing the semiconductor laser apparatus 1000A according to the first embodiment.

Figure 29:
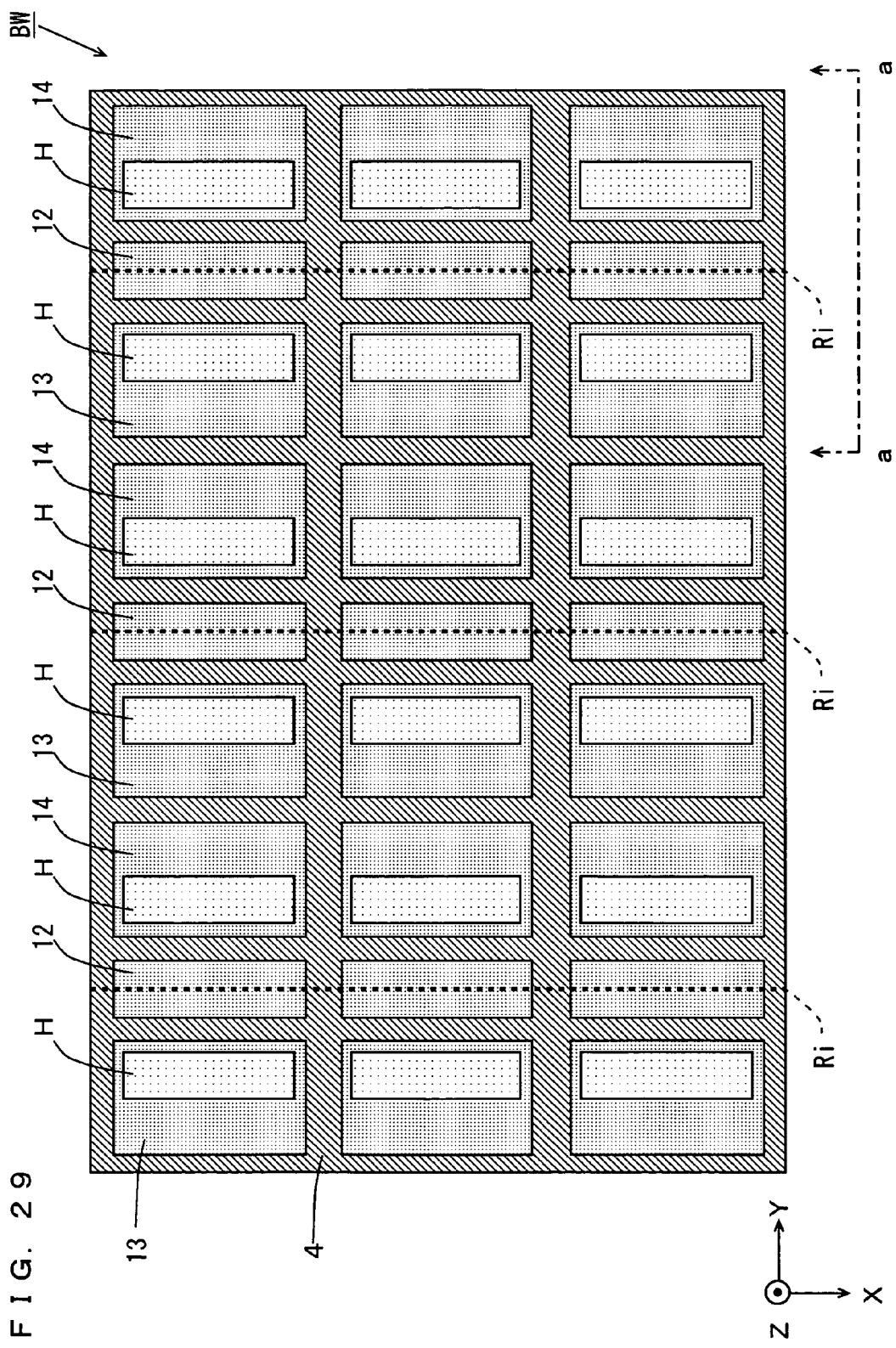
Figure 30:
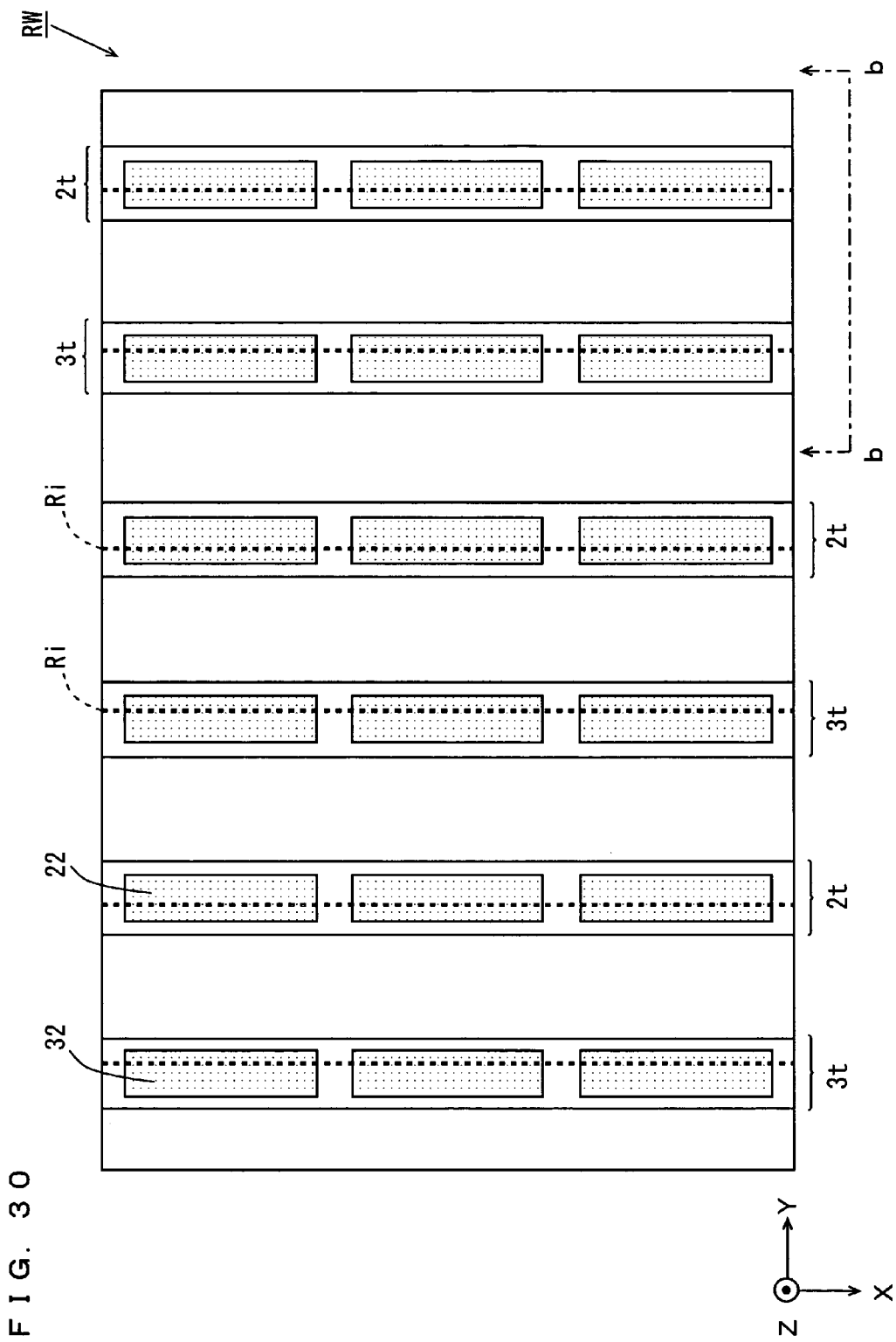
Figure 31:
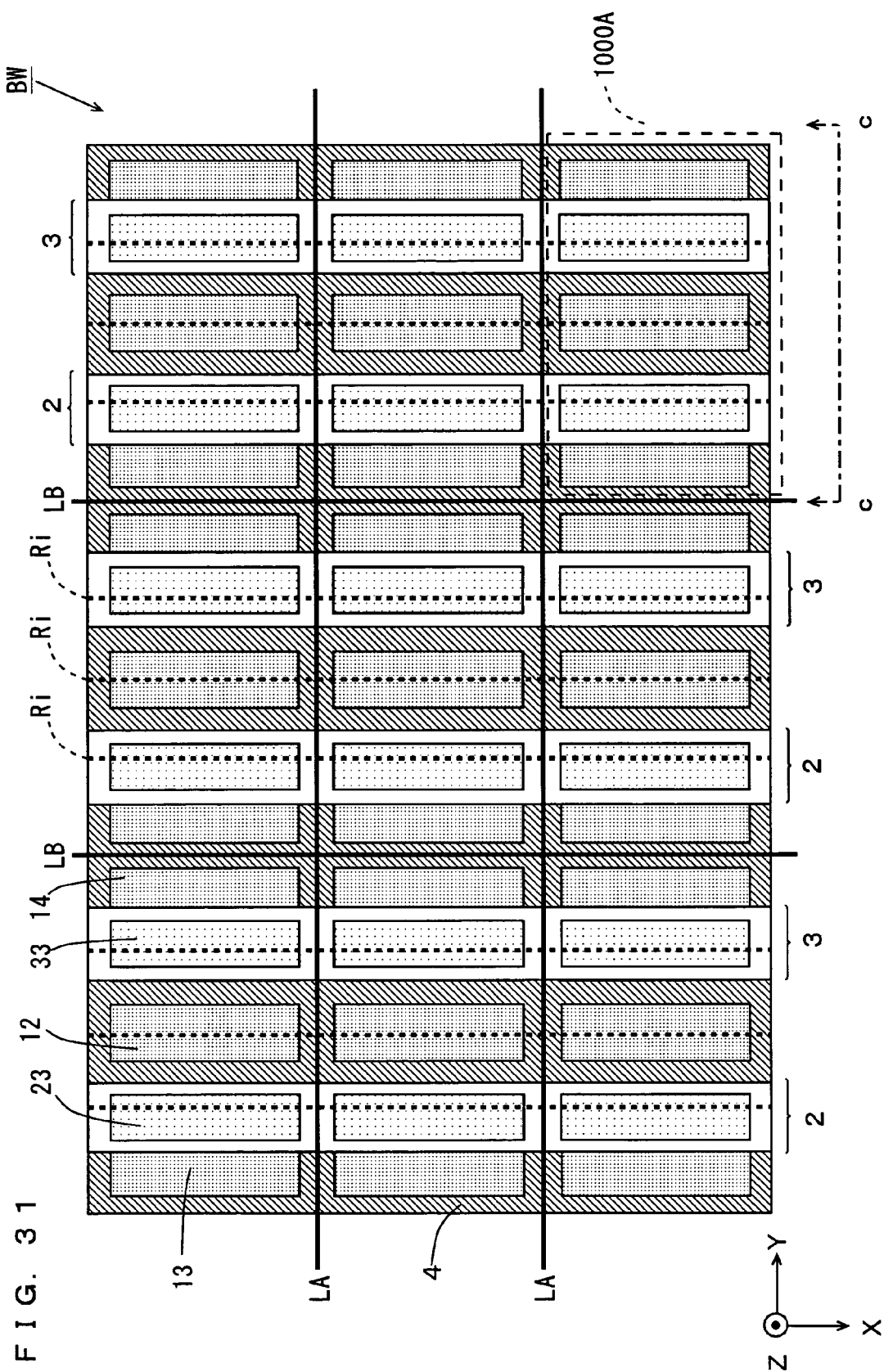

FIGS. 13(a) to 28 illustrate exemplary steps of manufacturing the blue-violet, red and infrared semiconductor laser devices 1, 2 and 3. FIGS. 29 to 31 show steps of bonding the blue-violet semiconductor laser device 1 and the red and infrared semiconductor laser devices 2 and 3 to each other and cleaving the semiconductor laser apparatus 1000A. Also in FIGS. 13(a) to 31, the directions X, Y and Z are defined similarly to those in FIG. 1.

FIGS. 13(a) to 17(h) show the exemplary steps of manufacturing the blue-violet semiconductor laser device 1 and the structure of the blue-violet semiconductor laser device 1 prepared through these steps.

As shown in FIG. 13(a), an n-type layer 602, an n-type cladding layer 603, an optical guide/active layer 604, an optical guide layer 644, a cap layer 645, a p-type cladding layer 605 and a contact layer 606 are successively crystal-grown on the (0001) plane of an n-type substrate 601 composed of GaN doped with O (oxygen), as semiconductor layers providing a multilayer structure. These layers 602 to 606 are formed by MOCVD, for example.

As shown in FIG. 13(b), the optical guide/active layer 604 has a structure obtained by successively forming a carrier blocking layer 641 and an optical guide layer 640 on the n-type cladding layer 603 while alternately stacking four barrier layers 643 and three well layers 642 on the optical guide layer 640.

The n-type substrate 601 has a carrier concentration of about $5\times10^{18}$ cm$^{-3}$ and a thickness of about 400 μm. The n-type layer 602 is formed by a GaN layer doped with Si of $5\times10^{18}$ cm$^{-3}$ having a thickness of 100 nm. The n-type cladding layer 603 is formed by an $Al_{0.07}Ga_{0.93}N$ layer doped with Si of $5\times10^{18}$ cm$^{-3}$ having a thickness of 400 nm. The n-type cladding layer 603 has a carrier concentration of $5\times10^{18}$ cm$^{-3}$.

The carrier blocking layer 641 is formed by an $Al_{0.16}Ga_{0.84}N$ layer doped with Si of $5\times10^{18}$ cm$^{-3}$ having a thickness of 5 nm. The carrier blocking layer 641 has a carrier concentration of $5\times10^{18}$ cm$^{-3}$.

The optical guide layer 640 is formed by a GaN layer doped with Si of $5\times10^{18}$ cm$^{-3}$ having a thickness of 100 nm. The optical guide layer 640 has a carrier concentration of $5\times10^{18}$ cm$^{-3}$.

Each well layer 642 is formed by an undoped $In_{0.15}Ga_{0.85}N$ layer having a thickness of 3 nm. Each barrier layer 643 is formed by an undoped $In_{0.02}Ga_{0.98}N$ layer having a thickness of 20 nm. The optical guide layer 644 is formed by a GaN layer doped with Mg of $4\times10^{19}$ cm$^{-3}$ having a thickness of 100 nm. The optical guide layer 644 has a carrier concentration of about $5\times10^{17}$ cm$^{-3}$. The cap layer 645 is formed by an $Al_{0.16}Ga_{0.84}N$ layer doped with Mg of $4\times10^{19}$ cm$^{-3}$ having a thickness of 20 nm. The cap layer 645 has a carrier concentration of about $5\times10^{17}$ cm$^{-3}$.

The p-type cladding layer 605 is formed by an $Al_{0.07}Ga_{0.93}N$ layer doped with Mg of $4\times10^{19}$ cm$^{-3}$ having a thickness of 400 nm. The p-type cladding layer 605 has a carrier concentration of $5\times10^{17}$ cm$^{-3}$. The contact layer 606 is formed by an $In_{0.02}Ga_{0.98}N$ layer doped with Mg of $4\times10^{19}$ cm$^{-3}$ having a thickness of 10 nm. The contact layer 606 has a carrier concentration of about $5\times10^{17}$ cm$^{-3}$.

The laminate shown in FIG. 13(a) is heat-treated (annealed) in an $N_2$ atmosphere at 800° C. As shown in FIG. 14(c), a p-type ohmic electrode 621 and an $SiO_2$ mask 620 are thereafter successively patterned and formed on the contact layer 606.

The p-type ohmic electrode 621 is formed by successively stacking Pt, Pd and Au layers on the contact layer 606. The Pt, Pd and Au layers have thicknesses of 5 nm, 100 nm and 150 nm respectively. The $SiO_2$ mask 620 has a thickness of 250 nm.

Then, the temperature of the laminate is set to about 200° C., for performing dry etching with $Cl_2$-based gas. Thus, the contact layer 606 and the p-type cladding layer 605 are partially etched for forming a ridge Ri, as shown in FIG. 14(d).

The ridge Ri has a width (in the direction Y) of 1.5 μm and a height (in the direction Z) of 380 nm, for example.

Then, prescribed regions of the optical guide/active layer 604 provided on the n-type cladding layer 603, the optical guide layer 644, the cap layer 645 and the p-type cladding layer 605 are etched as shown in FIG. 15(e).

Thereafter an insulating film 4 is formed on the upper surface of the laminate shown in FIG. 15(e). This insulating film 4 is formed by an SiN layer having a thickness of 250 nm. As shown in FIG. 15(f), only the $SiO_2$ mask 620 and a portion of the insulating film 4 formed on the p-type ohmic electrode 621 are removed by etching.

As shown in FIG. 16(g), a p-side pad electrode 12 is formed on the p-type ohmic electrode 621 and the insulating films 4 to cover the upper surface of the p-type ohmic electrode 621 of the laminate shown in FIG. 15(f).

The p-side pad electrode 12 is formed by successively stacking Ti, Pd and Au layers on the p-type ohmic electrode 621 and the insulating films 4. The Ti, Pd and Au layers have thicknesses of 100 nm, 100 nm and 3000 nm respectively.

In this specific example, the p-side pad electrode 12 is partially etched on the p-type ohmic electrode 621 and the insulating films 4. Thus, the p-side pad electrode 12 is so separated on the insulating films 4 that the separated portions of the p-side pad electrode 12 define p-side pad electrodes 13 and 14 as shown in FIG. 17(h). Alternatively, the p-side pad electrodes 12, 13 and 14 may be previously patterned and formed on the p-side ohmic electrode 621 and the insulating films 4.

Finally, the n-type substrate 601 is so polished that the thickness thereof is about 100 μm, and an n electrode 15 is formed on the lower surface of the polished n-type substrate 601. The n electrode 15 is formed after the blue-violet, red and infrared semiconductor laser devices 1, 2 and 3 are bonded to each other as described above.

The n electrode 15 is formed by successively stacking Al, Pt and Au layers under the n-type substrate 601. The Al, Pt and Au layers have thicknesses of 10 nm, 20 nm and 300 nm respectively.

FIG. 17(h) is a detailed sectional view of the blue-violet semiconductor laser device 1 in this specific example. Referring to FIG. 17(h), the p-side pad electrodes 13 and 14 are formed on the insulating films 4 separately from the p-side pad electrode 12.

The widths X, W and B of the blue-violet semiconductor laser device 1 shown in FIG. 17(h), the ridge Ri and the p-side pad electrode 12 are 1 mm, 1.6 μm and 125 μm respectively, for example.

Further, the width D of the etched optical guide layer 644, cap layer 645 and p-type cladding layer 605 described with reference to FIG. 15(e) is 4.5 μm, and the total thickness t of the optical guide layer 644, the cap layer 645 and the p-type cladding layer 605 on both sides of the ridge Ri is 0.2 μm.

A plurality of the aforementioned blue-violet semiconductor laser devices 1 are prepared on the common n-type substrate 601, i.e., on a common wafer, as described later in more detail.

FIGS. 18(a) to 28(k) show exemplary manufacturing steps for the red and infrared semiconductor laser devices 3 and the structures of the red and infrared semiconductor laser devices 3 prepared through these steps.

As shown in FIG. 18(a), an etching stopper layer 830, an n-type layer 821, an n-type cladding layer 802, an optical guide layer 803, well layers 815, barrier layers 816, an optical guide layer 805, a p-type cladding layer 806 and a contact layer 807 are successively crystal-grown on the (001) plane of an n-type substrate 801 composed of GaAs doped with Si, as semiconductor layers providing a multilayer structure. These layers 830, 821, 802, 803, 815, 816, 805, 806 and 807 are formed by MOCVD, for example. Three well layers 815 and two barrier layers 816 are alternately stacked on the optical guide layer 803.

The n-type substrate 801 is an off substrate having a crystal growth plane inclined from the (001) plane by 7°. The n-type substrate 801 has a carrier concentration of about $1\times10^{18}$ cm$^{-3}$ and a thickness of about 400 μm.

The etching stopper layer 830 is formed by an AlGaAs layer having a thickness of 1 μm. The n-type layer 821 is formed by a GaAs layer doped with Si of $3\times10^{18}$ cm$^{-3}$ having a thickness of 3000 nm. The n-type cladding layer 802 is formed by an $Al_{0.45}Ga_{0.55}As$ layer doped with Si having a thickness of 1500 nm. The n-type cladding layer 802 has a carrier concentration of $3\times10^{17}$ cm$^{-3}$.

The optical guide layer 803 is formed by an undoped $Al_{0.35}Ga_{0.65}As$ layer having a thickness of 30 nm. Each well layer 815 is formed by an undoped $Al_{0.1}Ga_{0.9}As$ layer having a thickness of 5 nm. Each barrier layer 816 is formed by an undoped $Al_{0.35}Ga_{0.65}As$ layer having a thickness of 5 nm. The optical guide layer 805 is formed by an undoped $Al_{0.35}Ga_{0.65}As$ layer having a thickness of 30 nm.

The p-type cladding layer 806 is formed by an $Al_{0.45}Ga_{0.55}As$ layer doped with Zn having a thickness of 1500 nm. The p-type cladding layer 806 has a carrier concentration of about $3\times10^{17}$ cm$^{-3}$.

The contact layer 807 is formed by a GaAs layer doped with Zn having a thickness of 200 nm. The contact layer 807 has a carrier concentration of about $2\times10^{18}$ cm$^{-3}$.

As shown in FIG. 19(b), a first SiN mask 841 is formed on a prescribed region of the contact layer 807 so that the contact layer 807 and the p-type cladding layer 806 are thereafter selectively etched, thereby forming a ridge Ri.

As shown in FIG. 20(c), current narrowing layers 808 and cap layers 810 are successively selectively grown to cover the upper surface and the side surfaces of the etched p-type cladding layer 806 and the side surfaces of the etched contact layer 807.

The current narrowing layers 808 are formed by $Al_{0.8}Ga_{0.2}As$ layers doped with Si. The current narrowing layers 808 have a carrier concentration of about $8\times10^{17}$ $cm^{-3}$. The cap layers 810 are formed by undoped GaAs layers having a thickness of 3000 nm.

As shown in FIG. 21(d), a second SiN mask 842 is formed to cover the upper surfaces and the side surfaces of the cap layers 810 and the upper surface of the first SiN mask 841. Portions not formed with the second SiN mask 842 are etched to externally expose the n-type layer 821. The laminate containing the AlGaAs-based materials formed to project from the n-type layer 821 is referred to as an infrared semiconductor laser laminate.

Then, a third SiN mask 843 is formed in a prescribed pattern to cover the upper surface and the side surfaces of the infrared semiconductor laser laminate and partial regions of the n-type layer 821.

An n-type cladding layer 702, an optical guide layer 703, well layers 715, barrier layers 716, an optical guide layer 705, a p-type cladding layer 706 and a contact layer 707 are successively crystal-grown on the exposed portion of the n-type layer 821. These layers 702, 703, 715, 716, 705, 706 and 707 are formed by MOCVD, for example. Three well layers 715 and two barrier layers 716 are alternately stacked on the optical guide layer 703.

The n-type cladding layer 702 is formed by an $(Al_{0.7}Ga_{0.3})_{0.5}In_{0.5}P$ layer doped with Si having a thickness of 1500 nm. The n-type cladding layer 702 has a carrier concentration of $3\times10^{17}$ $cm^{-3}$.

The optical guide layer 703 is formed by an undoped $(Al_{0.5}Ga_{0.5})_{0.5}In_{0.5}P$ layer having a thickness of 30 nm. Each well layer 715 is formed by an undoped $Ga_{0.5}In_{0.5}P$ layer having a thickness of 5 nm. Each barrier layer 716 is formed by an undoped $(Al_{0.5}Ga_{0.5})_{0.5}In_{0.5}P$ layer having a thickness of 5 nm. The optical guide layer 705 is formed by an undoped $(Al_{0.5}Ga_{0.5})_{0.5}In_{0.5}P$ layer having a thickness of 30 nm.

The p-type cladding layer 706 is formed by an $(Al_{0.7}Ga_{0.3})_{0.5}In_{0.5}P$ layer doped with Zn having a thickness of 1500 nm. The p-type cladding layer 706 has a carrier concentration of about $3\times10^{17}$ $cm^{-3}$. The contact layer 707 is formed by a $Ga_{0.5}In_{0.5}P$ layer doped with Zn having a thickness of 200 nm. The contact layer 707 has a carrier concentration of about $2\times10^{18}$ $cm^{-3}$. The portion of the laminate containing the AlGaInP-based materials formed to project from the n-type layer 821 is referred to as a red semiconductor laser laminate.

As shown in FIG. 22(e), a fourth SiN mask 844 is formed to cover a prescribed region of the contact layer 707, the side surfaces of the red semiconductor laser laminate and the exposed portion of the third SiN mask 843.

As shown in FIG. 23(f), the contact layer 707 and the p-type cladding layer 706 are selectively etched thereby forming a ridge Ri.

As shown in FIG. 24(g), current narrowing layers 708 are selectively grown to cover the upper surface and the side surfaces of the etched p-type cladding layer 706 and the side surfaces of the etched contact layer 707.

The current narrowing layers 708 are formed by AlInP layers doped with Si. The current narrowing layers 708 have a carrier concentration of about $8\times10^{17}$ $cm^{-3}$.

As shown in FIG. 25(h), the portion of the fourth SiN mask 844 located on the contact layer 707 is removed for crystal-growing a contact layer 711 on the current blocking layers 708 and the contact layer 707.

The contact layer 711 is formed by a GaAs layer doped with Zn having a thickness of about 3000 nm. The contact layer 711 has a carrier concentration of about $3\times10^{19}$ $cm^{-3}$.

As shown in FIG. 26(i), the first to fourth SiN masks 841 to 844 are finally removed by etching. The p-side pad electrode 32 is formed on the contact layer 807 and the cap layers 810 of the red semiconductor laser laminate, and the p-side pad electrode 22 is formed on the contact layer 711 of the red semiconductor laser laminate.

The p-side pad electrode 32 is formed by successively stacking AuGe and Au layers on the contact layer 807 and the cap layer 810. The AuGe and Au layers have thicknesses of 100 nm and 3000 nm respectively.

The p-side pad electrode 22 is formed by successively stacking AuGe and Au layers on the contact layer 711. The AuGe and Au layers have thicknesses of 100 nm and 3000 nm, respectively.

FIG. 27(j) is a detailed sectional view of an infrared semiconductor laser laminate of this specific example. In this specific example, the n electrode of the infrared semiconductor laser device 3 is formed in a later step.

The width X1 of the infrared semiconductor laser laminate shown in FIG. 27(j) is 250 μm, the width W of the ridge Ri is 2.5 μm, and the width X2 of the portion between the ridge Ri and a side surface of the infrared semiconductor laser laminate in the direction Y is 50 μm. The minimum thickness t of the etched p-type cladding layer 806 described with reference to FIG. 19(b) is 0.15 μm.

FIG. 28(k) is a detailed sectional view of the red semiconductor laser laminate in this specific example. In this specific example, the n electrode of the red semiconductor laser device 2 is formed in a later step.

The width X1 of the red semiconductor laser laminate shown in FIG. 28(k) is 250 μm, the width W of the ridge Ri is 2.5 μm, and the width X2 of the portion between the ridge Ri and a first side surface of the red semiconductor laser laminate in the direction Y is 50 μm. The minimum thickness t of the etched p-type cladding layer 706 described with reference to FIG. 23(f) is 0.15 μm.

A plurality of the aforementioned red semiconductor laser laminates and a plurality of the aforementioned infrared semiconductor laser laminates are prepared on the common n-type substrate 801, i.e., on a common wafer, as described later in detail.

In the aforementioned specific example, the dimension (etching depth) HH from the n-type layer 821 to the top of each of the red and infrared semiconductor laser laminates shown in FIG. 26(i) in the direction Z is set larger than the dimension (etching depth) TT from the n-type cladding layer 603 to the top of the blue-violet semiconductor laser device 1 shown in FIG. 17(h) in the direction Z.

Further, the distance DD between the red and infrared semiconductor laser laminates shown in FIG. 26(i) is set larger than the width D of the p-type cladding layer 605 shown in FIG. 17(h).

In this case, the ridge Ri of the blue-violet semiconductor laser device 1 can be easily arranged between the red and infrared semiconductor laser laminates in a step of bonding the blue-violet semiconductor laser device 1 and the red and infrared semiconductor laser laminates to each other. Consequently, the blue-violet semiconductor laser device 1 and the red and infrared semiconductor laser laminates are easily bonded to each other as described later.

FIG. 29 is a top plan view showing a plurality of blue-violet semiconductor laser devices 1 prepared according to the aforementioned specific example as viewed from the side of p-side pad electrodes 12, 13 and 14. Referring to FIG. 29, a GaN wafer BW is employed as the n-type substrate 601 common to the plurality of blue-violet semiconductor laser devices 1. The plurality of blue-violet semiconductor laser devices 1 prepared according to the aforementioned specific example are arranged on the GaN wafer BW. FIG. 29 shows ridges Ri of the plurality of blue-violet semiconductor laser devices 1 with thick dotted lines, for the purpose of easy understanding.

As shown in FIG. 29, solder films H are formed on the respective p-side pad electrodes 13 and 14 when the blue-violet semiconductor laser devices 1 are bonded to red and infrared semiconductor laser laminates.

The detailed sectional view of FIG. 17(h) is taken along the line a-a in FIG. 29.

FIG. 30 is a top plan view of a plurality of red semiconductor laser laminates and a plurality of infrared semiconductor laser laminates prepared according to the aforementioned specific example as viewed from the side of p-side pad electrodes 22 and 32. Referring to FIG. 30, a GaAs wafer RW is employed as the n-type substrate 801 common to the plurality of red semiconductor laser laminates and the plurality of infrared semiconductor laser laminates. The plurality of red semiconductor laser laminates and the plurality of infrared semiconductor laser laminates prepared according to the aforementioned specific example are arranged on the GaAs wafer RW. FIG. 30 shows ridges Ri of the plurality of red semiconductor laser laminates and the plurality of infrared semiconductor laser laminates with thick dotted lines, for the purpose of easy understanding.

The detailed sectional view of FIG. 26(i) of the red and infrared semiconductor laser laminate is taken along the line b-b in FIG. 30.

The laminates of the GaN wafer BW and the GaAs wafer RW shown in FIGS. 29 and 30 respectively are bonded to each other through the solder films H shown in FIG. 29. Thus, the p-side pad electrodes 22 of the red semiconductor laser laminates are bonded onto the p-side pad electrodes 13 of the plurality of blue-violet semiconductor laser devices 1. Further, the p-side pad electrodes 32 of the infrared semiconductor laser laminates are bonded onto the p-side pad electrodes 14 of the plurality of blue-violet semiconductor laser devices 1 respectively.

FIG. 4(d) corresponds to the state where the plurality of blue-violet semiconductor laser devices 1 provided on the GaN wafer BW and the plurality of red semiconductor laser laminates and the plurality of infrared semiconductor laser laminates provided on the GaAs wafer RW are bonded to each other.

In this specific example, the GaAs wafer RW (n-type substrate 801), the etching stopper layer 830 and the n-type layer 821 correspond to the n-GaAs substrate 50, the etching stopper layer 51 and the n-GaAs contact layer 5 shown in FIG. 4(c) respectively.

The GaAs wafer RW (n-type substrate 801) is polished into a prescribed thickness, and removed by dry etching employing RIE. The exposed etching stopper layer 830 is removed by wet etching with an etching solution composed of hydrofluoric acid or hydrochloric acid. Thus, the n-type layer 821 is exposed.

Thereafter the n electrodes 23 and 33 are formed on the exposed portions of the n-type layer 821 forming the red and infrared laser laminates respectively in prescribed patterns.

The n electrodes 23 and 33 are formed by successively staking Cr, Sn and Au layers on the exposed portions of the n-type layer 821. The Cr, Sn and Au layers have thicknesses of 100 nm, 200 nm and 300 nm respectively.

Thereafter the portion of the n-type layer 821 not forming the red and infrared semiconductor laser laminates is removed by dry etching. Thus, a plurality of red semiconductor laser devices 2 and a plurality of infrared semiconductor laser devices 3 are completed on the plurality of blue-violet semiconductor laser devices 1.

The n electrode 15 of each blue-violet semiconductor laser device 1 is formed after completion of the red and infrared semiconductor laser devices 2 and 3. After completion of the red and infrared semiconductor laser devices 2 and 3, the GaN wafer BW is polished into a prescribed thickness. The aforementioned n electrode 15 is formed on the polished GaN wafer BW in a prescribed pattern.

FIG. 31 is a top plan view of the laminate of the blue, red and infrared semiconductor laser devices 1, 2 and 3 prepared according to the aforementioned specific example.

Scribing lines LA are formed on the GaN wafer BW along the direction Y, as shown in FIG. 31. The GaN wafer BW is cleaved in the form of bars along the formed scribing lines LA. Thus, cavity facets of the blue-violet, red and infrared semiconductor laser devices 1, 2 and 3 are formed.

In this specific example, the cleavage plane of the GaN wafer BW along the scribing lines LA corresponds to the (1-100) plane of the GaN wafer BW (n-type substrate 601).

Thereafter protective films are formed on the cavity facets. Other scribing lines LB are formed on the GaN wafer BW along the direction X, as shown in FIG. 31. The GaN wafer BW is cleaved in the form of chips along the formed scribing lines LB. Thus, a plurality of semiconductor laser apparatus 1000A are completed.

According to this specific example, the ridge Ri extending in the direction X is formed in preparation of each blue-violet semiconductor laser device 1, and the red and infrared semiconductor laser laminates extending in the direction X are prepared in preparation of the red and infrared semiconductor laser devices 2 and 3. The GaAs wafer RW is bonded onto the GaN wafer BW so that the ridge Ri of the blue-violet semiconductor laser device 1 is substantially parallel to the red and infrared semiconductor laser laminates in preparation of a stacked substrate.

Further, the GaN wafer BW and the GaAs wafer RW are cleaved along the direction Y perpendicular to the direction X in formation of the semiconductor laser apparatus 1000A. Thus, the cavity facets of the blue-violet, red and infrared semiconductor laser devices 1, 2 and 3 are formed to be substantially parallel to each other.

Consequently, the respective laser beams emitted from the cavity facets of the blue-violet, red and infrared semiconductor laser devices 1, 2 and 3 respectively are substantially parallelized with each other.

Second Embodiment

Figure 32:
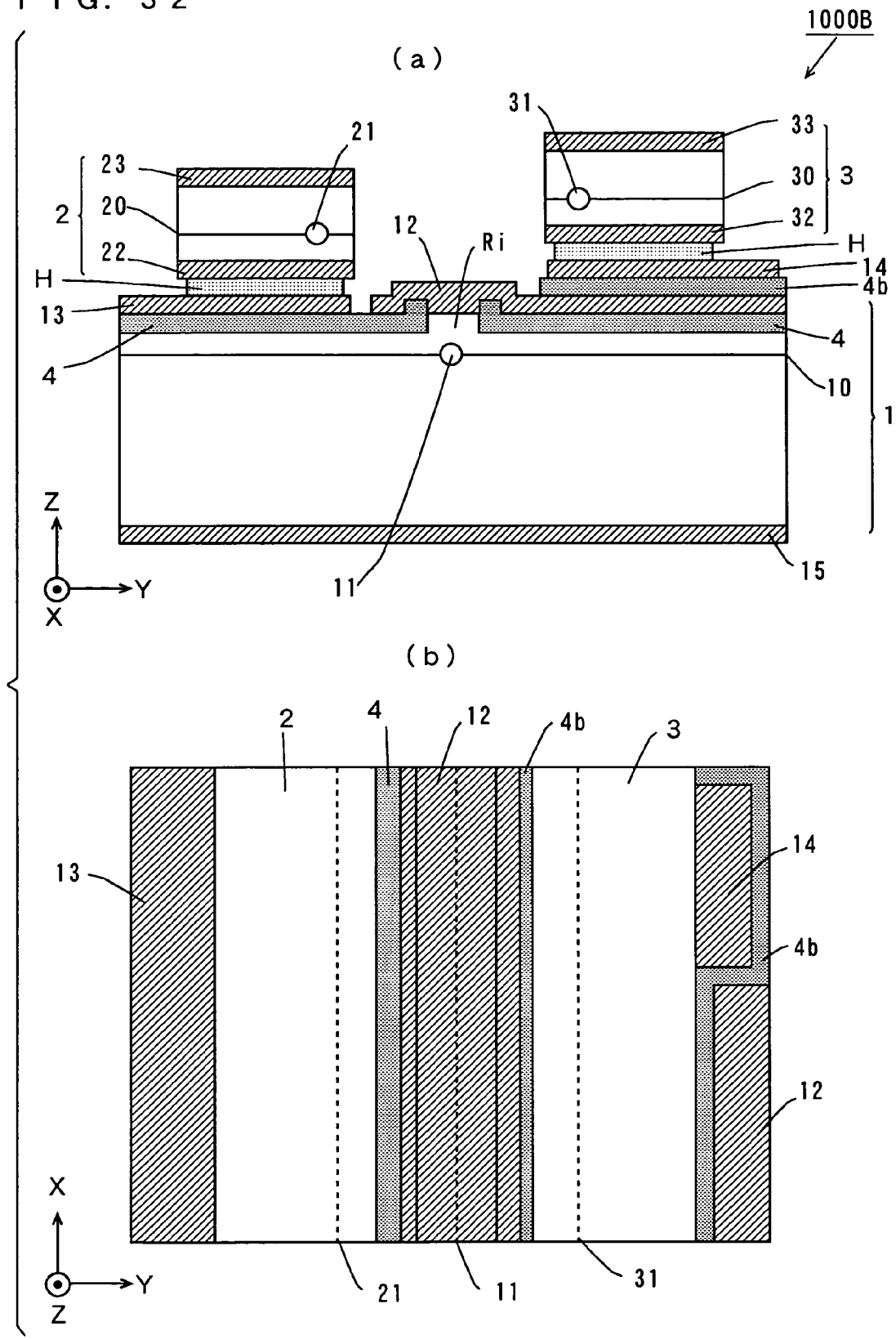
FIGS. 32(a) and 32(b) are schematic diagrams showing an exemplary semiconductor laser apparatus according to a second embodiment of the present invention.

FIGS. 32(a) and 32(b) are schematic diagrams showing an exemplary semiconductor laser apparatus 1000B according to a second embodiment of the present invention. Also in the following description, directions X, Y and Z are defined similarly to those in FIG. 1.

The semiconductor laser apparatus 1000B according to the second embodiment is different in structure from the semiconductor laser apparatus 1000A according to the first embodiment in the following point:

FIGS. 32(a) and 32(b) are a schematic sectional view and a plan view of the semiconductor laser apparatus 1000B respectively.

As shown in FIG. 32(a) and 32(b), a p-side pad electrode 12 of a blue-violet semiconductor laser device 1 extends in a direction (direction Y) on an insulating film 4 to project on the entire surface of an insulating film 4 on the side of the infrared semiconductor laser device 3. Another insulating film 4b is formed on the p-side pad electrode 12. The insulating film 4b is partially notched to partially expose the p-side electrode 12.

A p-side pad electrode 14 is formed on the insulating film 4b, to project sideward beyond the infrared semiconductor laser device 3. Thus, the p-side pad electrode 14 is partially exposed on the insulating film 4b.

As hereinabove described, the p-side pad electrode 12 is formed to extend in the prescribed direction from a ridge Ri on the insulating film 4, whereby the p-side pad electrode 12 of the blue-violet semiconductor laser device 1 can be wired on a portion other than the upper portion of the ridge Ri.

The p-side pad electrode 14, formed on the p-side pad electrode 12 with the insulating film 4b sandwiched therebetween, is electrically isolated from the p-side pad electrode 12. Thus, a p-side pad electrode 32 of the infrared semiconductor laser device 3 and the p-side pad electrode 12 of the blue-violet semiconductor laser device 1 are electrically isolated from each other.

According to the second embodiment, as hereinabove described, the p-side pad electrode 12 of the blue-violet semiconductor laser device 1 projects sideward beyond the infrared semiconductor laser device 3. Thus, the p-side pad electrode 12 projecting sideward beyond the infrared semiconductor laser device 3 can be wired also when it is difficult to wire the p-side pad electrode 12 provided on the ridge Ri of the blue-violet semiconductor laser device 1 from between a red semiconductor laser device 2 and the infrared semiconductor laser device 3. Thus, flexibility in wiring is increased.

Third Embodiment

Figure 33:
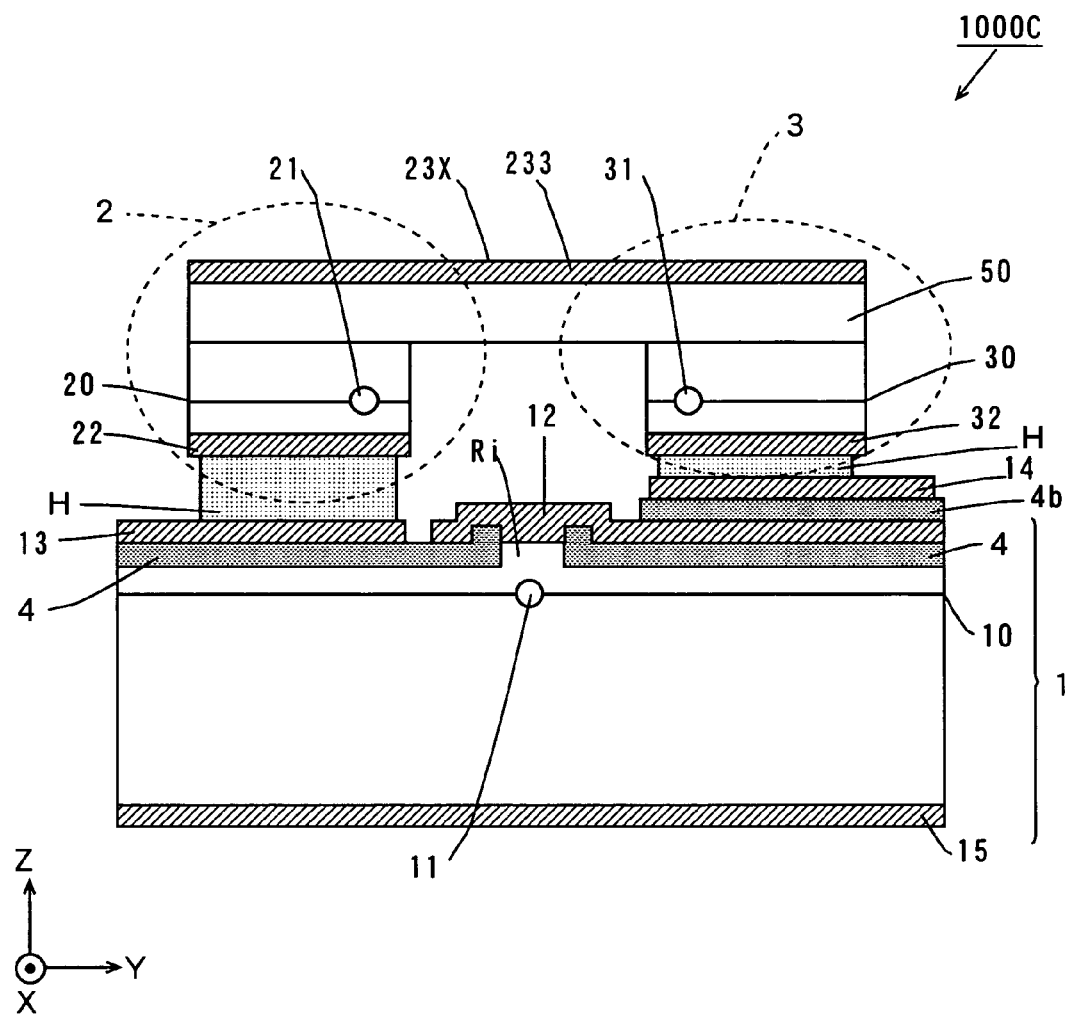
FIG. 33 is a schematic sectional view showing an exemplary semiconductor laser apparatus according to a third embodiment of the present invention.

FIG. 33 is a schematic sectional view showing an exemplary semiconductor laser apparatus 1000C according to a third embodiment of the present invention. Also in the following description, directions X, Y and Z are defined similarly to those in FIG. 1.

The semiconductor laser apparatus 1000C according to the third embodiment is different in structure from the semiconductor laser apparatus 1000B according to the second embodiment in the following point:

As shown in FIG. 33, red and infrared semiconductor laser devices 2 and 3 bonded onto a blue-violet semiconductor laser device 1 are integrally formed in the third embodiment. The combination of the integrally formed red and infrared semiconductor laser devices 2 and 3 is hereinafter referred to as a monolithic red/infrared semiconductor laser device 23X.

In preparation of this monolithic red/infrared semiconductor laser device 23X, neither etching stopper layer 51 nor n-GaAs contact layer 5 may be formed on an n-GaAs substrate 50 dissimilarly to the structure shown in FIG. 4(c) but semiconductor layers 2t and 3t are formed on a surface of the n-GaAs substrate 50 to be isolated from each other.

Thereafter p-side pad electrodes 22 and 32 are formed on the upper surfaces of the semiconductor layers 2t and 3t respectively, while forming a common n electrode 233 for the red and infrared semiconductor laser devices 2 and 3 on a second surface of the n-GaAs substrate 50.

The semiconductor laser apparatus 1000C according to the third embodiment is completed by bonding the monolithic red/infrared semiconductor laser device 23X prepared in the aforementioned manner top-side pad electrodes 13 and 14 provided on the upper surface of the blue-violet semiconductor laser device 1.

Preferable shapes of the blue-violet semiconductor laser device 1 and the monolithic red/infrared semiconductor laser device 23X according to the third embodiment are now described.

FIG. 34 is a diagram for illustrating the preferable shapes of the blue-violet semiconductor laser device 1 and the monolithic red/infrared semiconductor laser device 23X according to the third embodiment. Also in the following description, directions X, Y and Z are defined similarly to those in FIG. 1.

Referring to FIG. 34, symbols g1 and gx denote the widths (in the direction Y) of the blue-violet semiconductor laser device 1 and the monolithic red/infrared semiconductor laser device 23X respectively. The width g1 of the blue-violet semiconductor laser device 1 is preferably larger than the width gx of the monolithic red/infrared semiconductor laser device 23X.

This relation is expressed as follows:

$$g1 > gx \tag{9}$$

In this case, p-side pad electrodes 13 and 14 can be formed on insulating films 4 of the blue-violet semiconductor laser device 1.

Thus, the monolithic red/infrared semiconductor laser device 23X can be easily bonded onto the blue-violet semiconductor laser device 1 and easily connected with wires 2Wa and 3Wa.

As hereinabove described, the semiconductor layer 1t is formed on an n-GaN substrate 1s in the blue-violet semiconductor laser device 1. Further, the semiconductor layers 2t and 3t are formed on the n-GaAs substrate 50 in the monolithic red/infrared semiconductor laser device 23X. The n-GaN substrate 1s of the blue-violet semiconductor laser device 1, which is more chemically stable as compared with the n-GaAs substrate 50 of the monolithic red/infrared semiconductor laser device 23X, is inferior in processability.

In processing of the blue-violet and monolithic red/infrared semiconductor laser devices 1 and 23X, however, the blue-violet semiconductor laser device 1 having the width g1 larger than the width gx of the monolithic red/infrared semiconductor laser device 23X as shown in the above formula (9) requires no processing such as etching. Thus, the semiconductor laser apparatus 1000C can be easily prepared.

In the semiconductor laser apparatus 1000C according to the third embodiment, the blue-violet semiconductor laser device 1 has higher thermal conductivity than the monolithic red/infrared semiconductor laser device 23X. Further, the width g1 of the blue-violet semiconductor laser device 1 is larger than the width gx of the monolithic red/infrared semiconductor laser device 23X. Therefore, heat generated in red and infrared-beam-emission points 21 and 31 spreads toward the blue-violet semiconductor laser device 1 having high thermal conductivity, thereby improving heat dissipativity of the monolithic red/infrared semiconductor laser device 23X. Thus, the monolithic red/infrared semiconductor laser device 23X is improved in temperature characteristic as well as in reliability.

As hereinabove described, the n-GaAs substrate 50 serves as a common substrate for the red and infrared semiconductor laser devices 2 and 3 so that the semiconductor layers 2t and 3t are formed on the common n-GaAs substrate 50 to be isolated from each other and n electrodes of the red and infrared semiconductor laser devices 2 and 3 are formed on the common n-GaAs substrate 50 as the common n electrode 233 in the semiconductor laser apparatus 1000C according to the third embodiment.

Thus, the red and infrared semiconductor laser devices 2 and 3 are integrated into the monolithic red/infrared semiconductor laser device 23X on the common n-GaAs substrate 50, whereby the red and infrared semiconductor laser devices 2 and 3 are easily bonded to the blue-violet semiconductor laser device 1.

Further, the red and infrared semiconductor laser devices 2 and 3 having the common n electrode 233 are easily wired with the common n electrode 233.

Fourth Embodiment

FIG. 35 is a schematic sectional view showing an exemplary semiconductor laser apparatus 1000D according to a fourth embodiment of the present invention. Also in the following description, directions X, Y and Z are defined similarly to those in FIG. 1.

The semiconductor laser apparatus 1000D according to the fourth embodiment is different in structure from the semiconductor laser apparatus 1000A according to the first embodiment in the following point:

As shown in FIG. 35, a ridge Ri of a blue-violet semiconductor laser device 1 is provided at a side of red and infrared semiconductor laser devices 2 and 3, and a p-side pad electrode 12 is provided on the upper surface of the ridge Ri.

Thus, a blue-violet-beam-emission point 11 of the blue-violet semiconductor laser device 1 is formed at the side of red and infrared-beam-emission points 21 and 31.

Thus, the red semiconductor laser device 2 can be arranged at the center of the semiconductor laser apparatus 1000D according to the fourth embodiment. Therefore, the blue-violet, red and infrared-beam-emission points 11, 21 and 31 can be successively arranged in the direction Y.

Further, the positional relation between the red and infrared-beam-emission points 21 and 31 can also be changed by changing arrangement of the red and infrared semiconductor laser devices 2 and 3 in relation to p-side pad electrodes 13 and 14 provided on the blue-violet semiconductor laser device 1.

Fifth Embodiment

Figure 36:
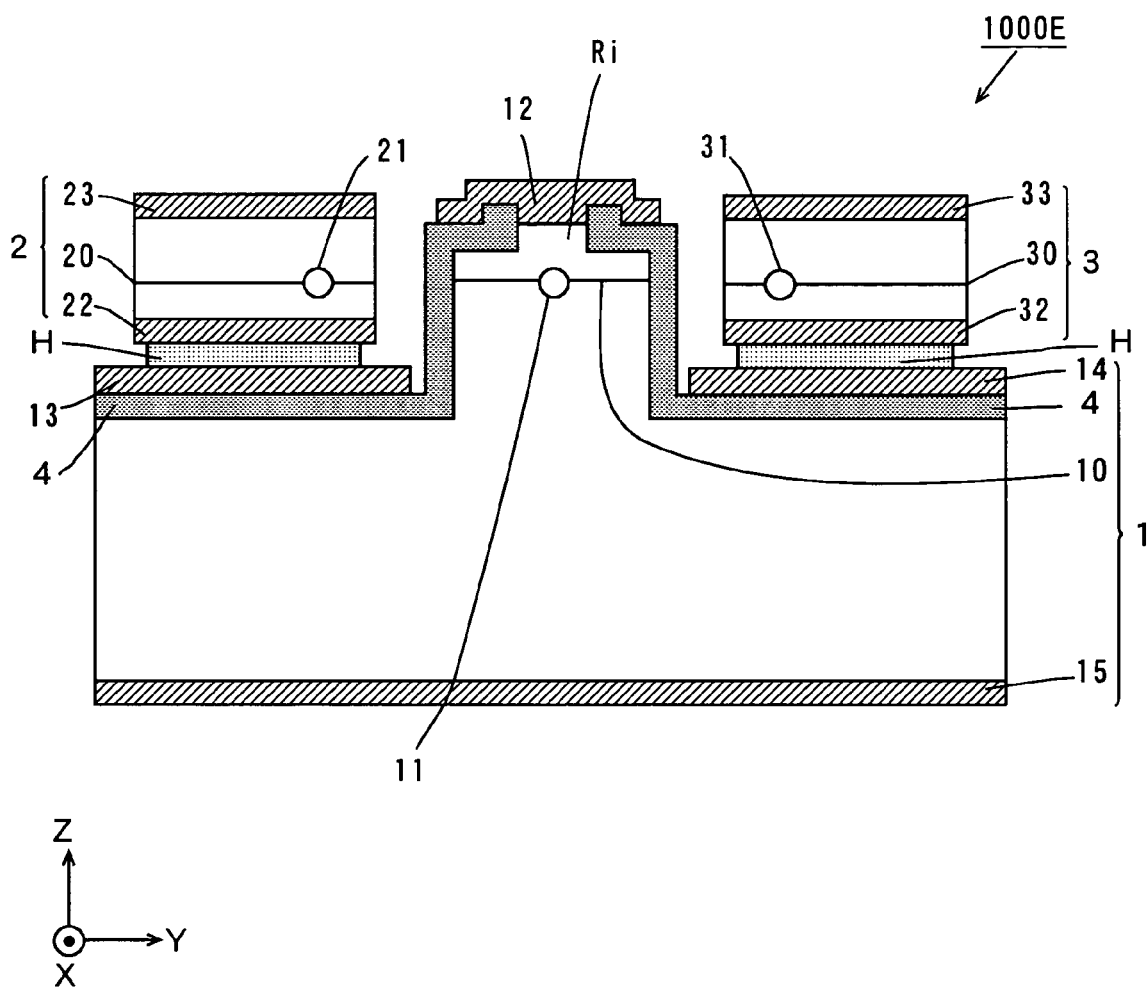
FIG. 36 is a schematic sectional view showing an exemplary semiconductor laser apparatus according to a fifth embodiment of the present invention.

FIG. 36 is a schematic sectional view showing an exemplary semiconductor laser apparatus 1000E according to a fifth embodiment of the present invention. Also in the following description, directions X, Y and Z are defined similarly to those in FIG. 1.

The semiconductor laser apparatus 1000E according to the fifth embodiment is different in structure from the semiconductor laser apparatus 1000A according to the first embodiment in the following point:

As shown in FIG. 36, a projection is provided on the central portion of a blue-violet semiconductor laser device 1 in the fifth embodiment. A p-n junction surface 10 is formed in this projection. P-side pad electrodes 13 and 14 are formed on both sides of the projection of the blue-violet semiconductor laser device 1 on insulating films 4, so that red and infrared semiconductor laser devices 2 and 3 are bonded thereto.

Thus, blue-violet, red and infrared-beam-emission points 11, 21 and 31 are substantially aligned with each other, whereby the semiconductor laser apparatus 1000E and an optical pickup can be easily designed.

Sixth Embodiment

Figure 37:
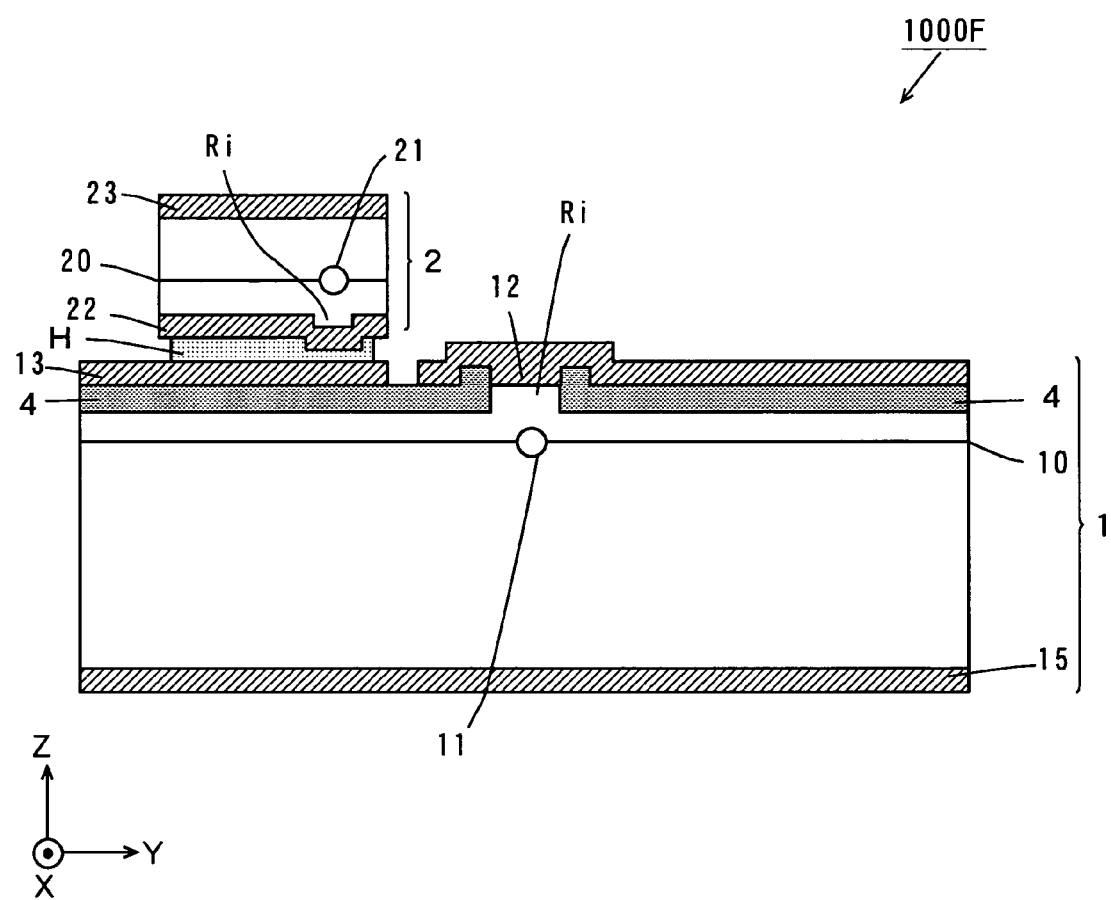
FIG. 37 is a schematic diagram showing an exemplary semiconductor laser apparatus according to a sixth embodiment of the present invention.

FIG. 37 is a schematic diagram showing an exemplary semiconductor laser apparatus 1000F according to a sixth embodiment of the present invention. Also in the following description, directions X, Y and Z are defined similarly to those in FIG. 1.

The semiconductor laser apparatus 1000F according to the sixth embodiment is different in structure from the semiconductor laser apparatus 100A according to the first embodiment in the following point:

FIG. 37 is a schematic sectional view of the semiconductor laser apparatus 1000F. As shown in FIG. 37, the semiconductor laser apparatus 1000F according to the sixth embodiment comprises blue-violet and red semiconductor laser devices 1 and 2.

Referring to FIG. 37, a p-side pad electrode 12 of the blue-violet semiconductor laser device 1 extends on insulating films 4 in a direction (direction Y) opposite to the red semiconductor laser device 2, so that the upper surface thereof is exposed.

A method of manufacturing the semiconductor laser device 1000F according to the sixth embodiment is as follows: First, the blue-violet and red semiconductor laser devices 1 and 2 are prepared similarly to the first embodiment.

Further, a stacked substrate is formed so that semiconductor layers 1t and 2t of the blue-violet and red semiconductor laser devices 1 and 2 are opposed to each other, similarly to the above description with reference to FIGS. 3(a) to 6(h). Thereafter the semiconductor laser apparatus 1000F having the blue-violet and red semiconductor laser devices 1 and 2 is prepared by cleaving the stacked substrate.

Thus, the semiconductor laser apparatus 1000F can be obtained by cleaving the stacked substrate, whereby an n-GaN substrate 1s of the blue-violet semiconductor laser device 1 and an n-GaAs substrate 50 of the red semiconductor laser device 2 may not be individually cleaved but manufacturing steps are simplified, as described with reference to FIGS. 3(a) to 6(h).

More specifically, the blue-violet semiconductor laser device 1 is first prepared through steps similar to those shown in FIGS. 13(a) to 17(h) and the red semiconductor laser device 2 is prepared through steps similar to those shown in FIGS. 22(e) to 26(i), in order to manufacture the semiconductor laser apparatus 1000F.

Thereafter a GaN wafer BW formed with a plurality of blue-violet semiconductor laser devices 1 and a GaAs wafer RW formed with a plurality of red semiconductor laser devices 2 are bonded to each other through solder films H through steps similar to those shown in FIGS. 29 to 31.

Finally, n electrodes 15 and 23 of the blue-violet and red semiconductor laser devices 1 and 2 are formed on a laminate obtained by bonding the GaN wafer BW and the GaAs wafer RW to each other, and the GaN wafer BW is cleaved thereby completing a plurality of semiconductor laser apparatus 1000F.

FIG. 38 is a schematic sectional view showing the semiconductor laser apparatus 1000F of FIG. 37 assembled on a stem 500. Also in FIG. 38, directions X, Y and Z are defined similarly to those in FIG. 37.

In this case, the n electrode 15 is bonded to the upper surface of the stem 500. Thus, the n electrode 15 and the stem 500 are electrically connected with each other. A wire 2Wb electrically connects then electrode 23 of the red semiconductor laser device 2 to the upper surface of the stem 500. Thus, the stem 500 serves as a common n electrode for the blue-violet and red semiconductor laser devices 1 and 2, for implementing common-cathode wire connection.

On the other hand, a wire 1W connects the p-side pad electrode 12 of the blue-violet semiconductor laser device 1 to a driving circuit (not shown). Further, a wire 2Wa connects a p-side pad electrode 13 electrically connected with a p-side pad electrode 22 of the red semiconductor laser device 2 to the driving circuit (not shown).

The blue-violet semiconductor laser device 1 can be driven by applying a voltage between the stem 500 and the wire 1W, and the red semiconductor laser device 2 can be driven by applying a voltage between the stem 500 and the wire 2Wa. Thus, the blue-violet and red semiconductor laser devices 1 and 2 can be individually driven respectively.

Thus, the p-side pad electrode 22 of the red semiconductor laser device 2 is bonded to the p-side pad electrode 13 provided on a surface of the blue-violet semiconductor laser device 1 with the corresponding insulating film 4 sandwiched therebetween in the semiconductor laser apparatus 1000F according to the sixth embodiment. Further, the p-side pad electrodes 12 and 22 of the blue-violet and red semiconductor laser devices 1 and 2 are electrically isolated from each other.

Thus, arbitrary voltages can be supplied to the p-side pad electrodes 12 and 22 of the blue-violet and red semiconductor laser devices 1 and 2 respectively. Therefore, the driving system for the blue-violet and red semiconductor laser devices 1 and 2 can be arbitrarily selected.

In the example shown in FIG. 38, the wire 1W for driving the blue-violet semiconductor laser device 1 is connected to the p-side pad electrode 12 formed above a blue-violet-beam-emission point 11.

On the other hand, the wire 2Wa for driving the red semiconductor laser device 2 is connected to an exposed portion of the p-side pad electrode 13 extending sideward beyond the red semiconductor laser device 2. Further, the wire 2Wb for driving the red semiconductor laser device 2 is connected to the n electrode 23 formed on the upper surface of the red semiconductor laser device 2.

Thus, the wire 2Wa is connected to the portion of the p-side pad electrode 13 of the red semiconductor laser device 2 opposite to the p-side pad electrode 12 of the blue-violet semiconductor laser device 1 in the direction (direction Y) parallel to the surface of the n-GaN substrate 1s and perpendicular to a direction for emitting a laser beam. Thus, the wire 2Wa is reliably and easily bonded to the red semiconductor laser device 2. Further, wiring is simplified.

While the semiconductor laser apparatus 1000F according to the sixth embodiment is mounted on the stem 500 as shown in FIG. 38, the semiconductor laser apparatus 1000F may alternatively be mounted on a heat sink composed of an insulating material such as AlN, SiC, Si or diamond or a conductive material such as Cu, CuW or Al.

A metal can package or a resin frame package may be employed for the semiconductor laser apparatus 1000F, so far as the package can store the semiconductor laser apparatus 1000F therein.

Similarly to the first embodiment, the n-GaN substrate is (the GaN wafer BW in the specific example) has such transmittance and thickness that the red semiconductor laser device 2 is viewable through this n-GaN substrate 1s.

Thus, the blue-violet and red semiconductor laser devices 1 and 2 can be easily aligned with each other, and accuracy of alignment of the blue-violet-beam-emission point 11 and red-beam-emission point 21 is improved.

Further, the n-GaN substrate 1s and the semiconductor layer 1t composed of nitride-based semiconductors are employed for the blue-violet semiconductor laser device 1. In this case, the semiconductor layer 1t of the blue-violet semiconductor laser device 1 is so improved in heat dissipativity that the blue-violet semiconductor laser device 1 is improved in temperature characteristic as well in reliability.

As shown in FIGS. 37 and 38, the insulating films 4 are formed on the side surfaces of a ridge Ri of the blue-violet semiconductor laser device 1. Thus, the insulating films 4 provided on the side surfaces of the ridge Ri narrow a current to the ridge Ri in the blue-violet semiconductor laser device 1.

The n-GaN substrate 1s has conductivity. Thus, the n electrode 15 provided on the n-GaN substrate 1s is electrically connected with the stem 500 when the semiconductor laser apparatus 1000F is mounted on the stem 500 as shown in FIG. 38.

Thus, both of the p-side pad electrode 12 and the n electrode 15 for driving the blue-violet semiconductor laser device 1 may not be provided on the insulating films 4 of the blue-violet semiconductor laser device 1. Consequently, the semiconductor laser apparatus 1000F is simplified in structure and downsized.

When the semiconductor laser apparatus 1000F is applied to an optical pickup, the n-GaN substrate 1s is bonded onto the stem 500 as shown in FIG. 38. The n-GaN substrate 1s has higher thermal conductivity than the n-GaAs substrate 50, whereby the semiconductor laser apparatus 1000F is improved in heat dissipativity as well as in reliability.

Preferable shapes, bonded positions and positions of the emission points 11 and 21 of the blue-violet and red semiconductor laser devices 1 and 2 according to the sixth embodiment are now described.

Figure 39:
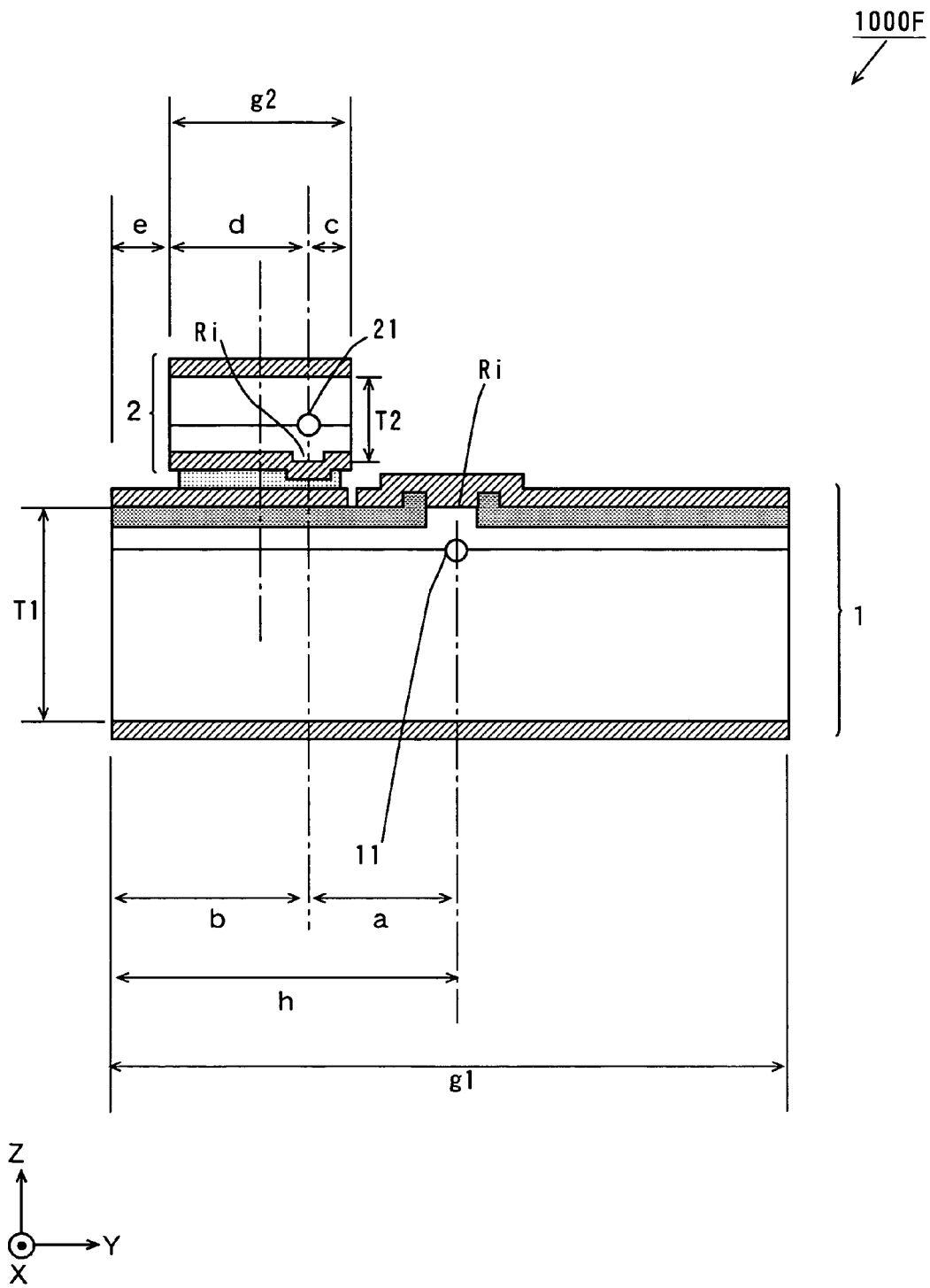
FIG. 39 is a diagram for illustrating preferable shapes, bonded positions and positions of emission points of a blue-violet semiconductor laser device and a red semiconductor laser device in the sixth embodiment.

FIG. 39 is a diagram for illustrating the preferable shapes, the bonded positions and the positions of the emission points 11 and 21 of the blue-violet and red semiconductor laser devices 1 and 2 according to the sixth embodiment. Also in the following description, directions X, Y and Z are defined similarly to those in FIG. 1.

Referring to FIG. 39, symbols T1 and T2 denote the thicknesses (in the direction Z) of the blue-violet and red semiconductor laser devices 1 and 2 respectively, similarly to the first embodiment. The thickness T1 of the blue-violet semiconductor laser device 1 is preferably larger than the thickness T2 of the red semiconductor laser device 2.

The aforementioned relation is expressed as follows:

$$T1 > T2 \tag{1}$$

In this case, the thickness T2 of the red semiconductor laser device 2 is smaller than the thickness T1 of the blue-violet semiconductor laser device 1, whereby the red semiconductor laser device 2 is also cleaved when the blue-violet semiconductor laser device 1 is cleaved in preparation of the semiconductor laser apparatus 1000F. Thus, cavity facets can be easily formed and flat cavity facets can be easily obtained.

Further, the strain in the blue-violet semiconductor laser device 1 can be reduced by setting the thickness T1 of the blue-violet semiconductor laser device 1 larger than the thickness T2 of the red semiconductor laser device 2 as described above. Consequently, the wavelength and emission efficiency of a laser beam emitted from the blue-violet semiconductor laser device 1 can be reduced in variation and stabilized.

Referring to FIG. 39, symbols g1 and g2 denote the widths (in the direction Y) of the blue-violet and red semiconductor laser devices 1 and 2 respectively. The width g1 of the blue-violet semiconductor laser device 1 is preferably larger than the width g2 of the red semiconductor laser device 2.

This relation is expressed as follows:

$$g1 > g2 \tag{9}$$

In this case, the p-side pad electrode 13 can be formed on the corresponding insulating film 4 of the blue-violet semiconductor laser device 1, as shown in FIG. 39.

As described with reference to the first embodiment, the n-GaN substrate 1s of the blue-violet semiconductor laser device 1, which is more chemically stable as compared with an n-GaAs substrate 5X of the red semiconductor laser device 2, is inferior in processability.

In processing of the blue-violet and red semiconductor laser devices 1 and 2, however, the blue-violet semiconductor laser device 1 having the width g1 larger than the width g2 of the red semiconductor laser device 2 as shown in the above formula (9) requires no processing such as etching. Thus, the semiconductor laser apparatus 1000F can be easily prepared.

Referring to FIG. 39, symbol h denotes the distance between the blue-violet-beam-emission point 11 and the side surface of the blue-violet semiconductor laser device 1 closer to the red semiconductor laser device 2 in the direction Y. In this case, the width g2 of the red semiconductor laser device 2 is preferably smaller than the distance h.

This relation is expressed as follows:

$$g2<h \quad (4)$$

Thus, the p-side pad electrode 13 can be formed on the corresponding insulating film 4 of the blue-violet semiconductor laser device 1, as shown in FIG. 39.

In the semiconductor laser apparatus 1000F shown in FIG. 39, the width g1 is preferably 200 to 1000 μm, and the distance h is preferably 100 to 750 μm. The preferable size of the width g2 is identical to that described with reference to the first embodiment.

Referring to FIG. 39, symbol a denotes the distance between the blue-violet-beam-emission points 11 and 21 in the direction Y, and symbol b denotes the distance between the red-beam-emission point 21 and the side surface of the blue-violet semiconductor laser device 1 closer to the red semiconductor laser device 2 in the direction Y. The distance a is preferably smaller than the distance b.

This relation is expressed as follows:

$$b>a \quad (5)$$

In this case, the distance between the blue-violet-beam-emission point 11 of the blue-violet semiconductor laser device 1 and the red-beam-emission point 21 of the red semiconductor laser device 2 can be short, as described with reference to the first embodiment. Thus, both of the blue-violet and red-beam-emission points 11 and 21 can be closer to the center of the semiconductor laser apparatus 1000F.

Thus, a common optical system can be employed for the laser beams emitted from the blue-violet and red-beam-emission points 11 and 21 respectively. Further, both of the blue-violet and red semiconductor laser devices 1 and 2 are improved in light extraction efficiency when the laser beams are condensed through a lens.

Further, light aberration resulting from passage of the laser beams through the lens is reduced and no component is required for correcting light aberration. Consequently, the semiconductor laser apparatus 1000F is downsized and reduced in cost.

In the semiconductor laser apparatus 1000F shown in FIG. 39, preferable sizes of the distances a and b are identical to those described with reference to the first embodiment.

Referring to FIG. 39, symbol c denotes the distance between a first side surface of the red semiconductor laser device 2 and the red-beam-emission point 21 in the direction Y, and symbol d denotes the distance between a second side surface of the red semiconductor laser device 2 and the red-beam-emission point 21 in the direction Y.

The distance c between the first side surface of the red semiconductor laser device 2 and the red-beam-emission point 21 in the direction Y is preferably smaller than the distance d between the second side surface of the red semiconductor laser device 2 and the red-beam-emission point 21 in the direction Y.

This relation is expressed as follows:

$$d>c \quad (6)$$

In other words, the red-beam-emission point 21 of the red semiconductor laser device 2 is preferably positioned closer to the blue-violet-beam-emission point 11 of the blue-violet semiconductor laser device 1 than the center of the red semiconductor laser device 2 in the direction Y.

In this case, the red-beam-emission point 21 of the red semiconductor laser device 2 approaches the blue-violet-beam-emission point 11 of the blue-violet semiconductor laser device 1, whereby both of the blue-violet and red-beam-emission points 11 and 21 can be closer to the center of the semiconductor laser apparatus 1000F.

Also in the sixth embodiment, the wire 2Wb is connected to the n electrode 23 formed on the red semiconductor laser device 2, as shown in FIG. 38. The n electrode 23 must have a prescribed size for the connection with the wire 2Wb.

An effect attained by satisfying the relation of the above formula (6) is identical to that described with reference to the first embodiment. In the semiconductor laser apparatus 1000F shown in FIG. 39, preferable sizes of the distances c and d are identical to those described with reference to the first embodiment.

Referring to FIG. 39, symbol e denotes the distance between a second side surface of the red semiconductor laser device 2 and the side surface of the blue-violet semiconductor laser device 1 closer to the red semiconductor laser device 2. A preferable size of the distance e is identical to that described with reference to the first embodiment.

Also in the sixth embodiment, the p-side pad electrodes 12 and 22 of the blue-violet and red semiconductor laser devices 1 and 2 are formed on the surfaces of the semiconductor layers 1t and 2t respectively. The p-side pad electrode 22 formed on the surface of the semiconductor layer 2t of the red semiconductor laser device 2 is bonded to the surface of the semiconductor layer 1t of the blue-violet semiconductor laser device 1 with the corresponding insulating film 4 sandwiched therebetween.

Thus, the semiconductor layers 1t and 2t of the blue-violet and red semiconductor laser devices 1 and 2 are closer to each other to reduce the distance between the blue-violet and red-beam-emission points 11 and 21. Thus, both of the blue-violet and red-beam-emission points 11 and 21 can be closer to the center of the semiconductor laser apparatus 1000F.

As shown in FIG. 38, the red semiconductor laser device 2 has the n electrode 23 on the surface opposite to the junction with the blue-violet semiconductor laser device 1. In this case, the n electrode 23 of the red semiconductor laser device 2 is so positioned on the surface opposite to the blue-violet semiconductor laser device 1 that the n electrode 23 of the red semiconductor laser device 2 can be wired from the same side as the p-side pad electrode 12 of the blue-violet semiconductor laser device 1.

While the semiconductor laser apparatus 1000F according to the sixth embodiment is formed by bonding the red semiconductor laser device 2 onto the blue-violet semiconductor laser device 1, the same infrared semiconductor laser device 3 as that described with reference to the first embodiment may alternatively be bonded onto the blue-violet semiconductor laser device 1, in place of the red semiconductor laser device 2.

Also when the infrared semiconductor laser device 3 is bonded onto the blue-violet semiconductor laser device 1, an effect similar to the above is attained.

Seventh Embodiment

FIG. 40 is a schematic diagram showing an exemplary semiconductor laser apparatus 1000G according to a seventh embodiment of the present invention. Also in the following description, directions X, Y and Z are defined similarly to those in FIG. 1.

The semiconductor laser apparatus 1000G according to the seventh embodiment is different in structure from the semiconductor laser apparatus 1000F according to the sixth embodiment in the following point:

As shown in the schematic sectional view of FIG. 40, a p-side pad electrode 12 of a blue-violet semiconductor laser device 1 extends in a direction (direction Y) on insulating films 4. An insulating film 4b is formed on partial regions of the insulating films 4 and the p-side pad electrode 12 forming the upper surface of the blue-violet semiconductor laser device 1. The insulating film 4b is so formed as to cover at least a portion positioned above a blue-violet-beam-emission point 11. The portion of the p-side pad electrode 12 not formed with the insulating film 4b is externally exposed.

A p-side pad electrode 13 is formed on the insulating film 4b in a state electrically isolated from the p-side pad electrode 12. A p-side pad electrode 22 of a red semiconductor laser device 2 is bonded onto the p-side pad electrode 13 with a solder film H sandwiched therebetween. The portion of the p-side pad electrode 13 to which the red semiconductor laser device 2 is not bonded is externally exposed on the side opposite to the p-side pad electrode 12 in the direction Y. An n electrode 23 of the red semiconductor laser device 2 is positioned on the surface opposite to the blue-violet semiconductor laser device 1.

In the semiconductor laser apparatus 1000G according to the seventh embodiment, the blue-violet and red semiconductor laser devices 1 and 2 are so bonded to each other that ridges Ri thereof face to each other. Further, blue-violet and red-beam-emission points 11 and 21 of the blue-violet and red semiconductor laser devices 1 and 2 are substantially aligned with each other in the direction Z. Thus, the distance between the blue-violet and red-beam-emission points 11 and 12 can be extremely small.

In addition, the blue-violet and red-beam-emission points 11 and 21 are substantially aligned with each other, whereby the semiconductor laser apparatus 1000G and an optical pickup can be easily designed.

Further, the blue-violet and red semiconductor laser devices 1 and 2 are so bonded to each other that the ridge Ri of the red semiconductor laser device 2 is located above the ridge Ri of the blue-violet semiconductor laser device 1, whereby the width of the semiconductor laser apparatus 1000G (the width of the blue-violet semiconductor laser device 1) in the direction Y can be short.

In the semiconductor laser apparatus 1000G according to the seventh embodiment, an infrared semiconductor laser device 3 may alternatively be bonded onto the blue-violet semiconductor laser device 1, in place of the red semiconductor laser device 2.

Eighth Embodiment

Figure 41:
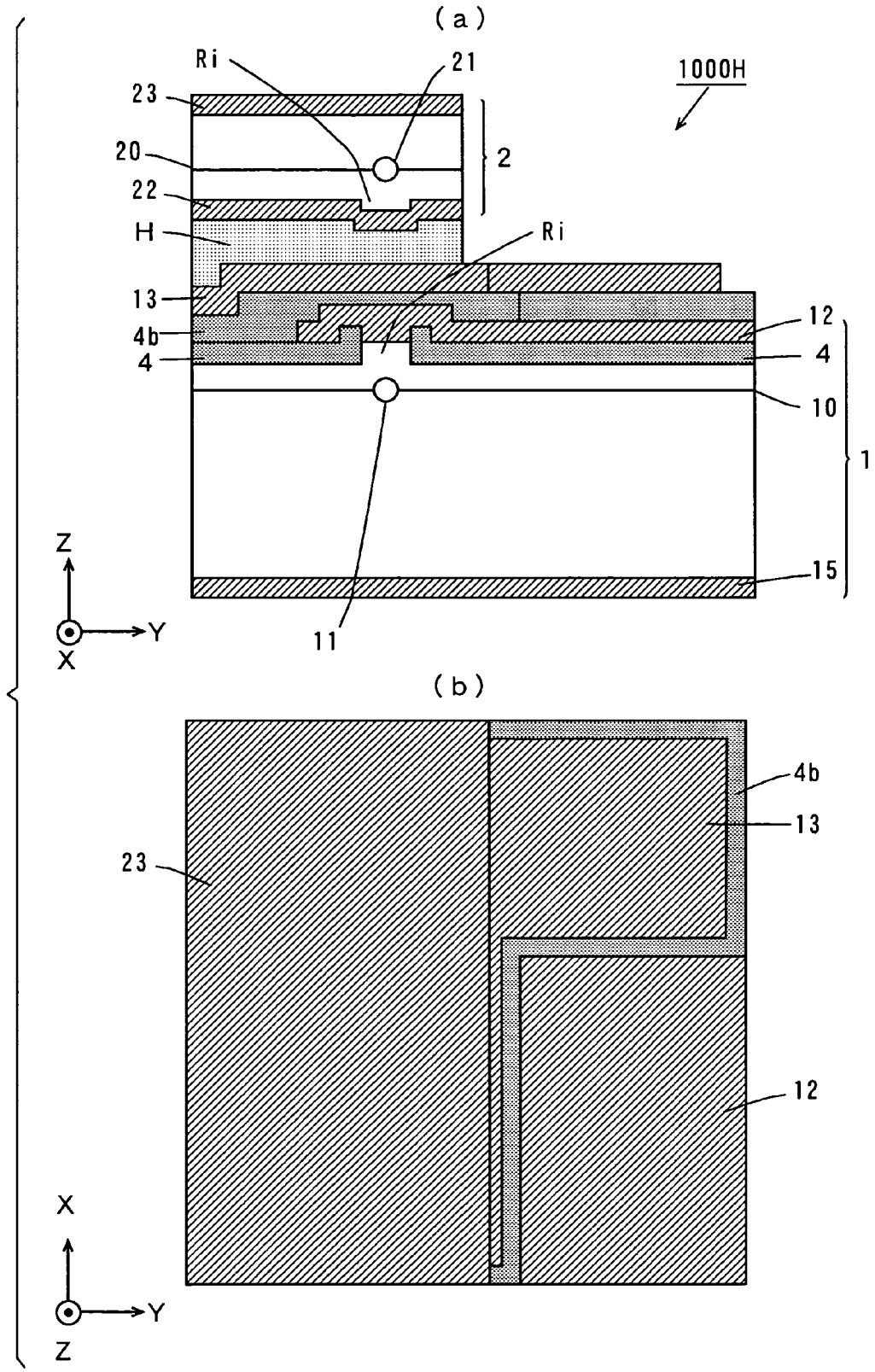
FIG. 41 is a schematic diagram showing an exemplary semiconductor laser apparatus according to an eighth embodiment of the present invention.

FIGS. 41(a) and 41(b) are schematic diagrams showing an exemplary semiconductor laser apparatus 1000H according to an eighth embodiment of the present invention. Also in the following description, directions X, Y and Z are defined similarly to those in FIG. 1.

The semiconductor laser apparatus 1000H according to the eighth embodiment is different in structure from the semiconductor laser apparatus 1000G according to the seventh embodiment in the following point:

FIGS. 41(a) and 41(b) are a schematic sectional view and a plan view of the semiconductor laser apparatus 1000H respectively.

As shown in FIGS. 41(a) and 42(b), a p-side pad electrode 12 of a blue-violet semiconductor laser device 1 extends in one direction (direction Y) on insulating films 4 to project on the entire surface of an insulating film 4 on the side of the red semiconductor laser device 2 on according to the eighth embodiment.

An insulating film 4b is formed on the insulating films 4 and the p-side pad electrode 12 forming the upper surface of the blue-violet semiconductor laser device 1. The insulating film 4b is partially notched to partially expose the p-side electrode 12.

A p-side pad electrode 13 is formed on the insulating film 4b in a state electrically isolated from the p-side pad electrode 12. The p-side pad electrode 13 is partially notched in response to the shape of the insulating film 4b. A p-side pad electrode 22 of a red semiconductor laser device 2 is bonded onto the p-side pad electrode 13 through a solder film H.

Referring to FIG. 41(a), the red semiconductor laser device 2 is so bonded onto the blue-violet semiconductor laser device 1 that a side surface of the red semiconductor laser device 2 in the direction Y and a side surface of the blue-violet semiconductor laser device 1 in the direction Y are substantially flush with each other in the direction Z.

Similarly to the seventh embodiment, blue-violet and red-beam-emission points 11 and 21 of the blue-violet and red semiconductor laser devices 1 and 2 are substantially aligned with each other along the direction Z. Thus, the distance between the blue-violet and red-beam-emission points 11 and 21 can be extremely small.

Further, the blue-violet and red-beam-emission points 11 and 21 are substantially aligned with each other, whereby the semiconductor laser apparatus 1000H and an optical pickup can be easily designed.

Referring to FIG. 41(b), the p-side pad electrodes 12 and 13 are exposed to extend from the red semiconductor laser device 2 in the direction Y in the state electrically isolated from each other.

In this case, the p-side pad electrodes 12 and 13 of the blue-violet and red semiconductor laser devices 1 and 2 can be wired on substantially identical positions in the direction Y. Thus, a region for wiring (region for wire bonding) can be reduced in size. Consequently, the width of the semiconductor laser apparatus 1000H (width of the blue-violet semiconductor laser device 1) in the direction Y can be shorter.

Ninth Embodiment

Figure 42:
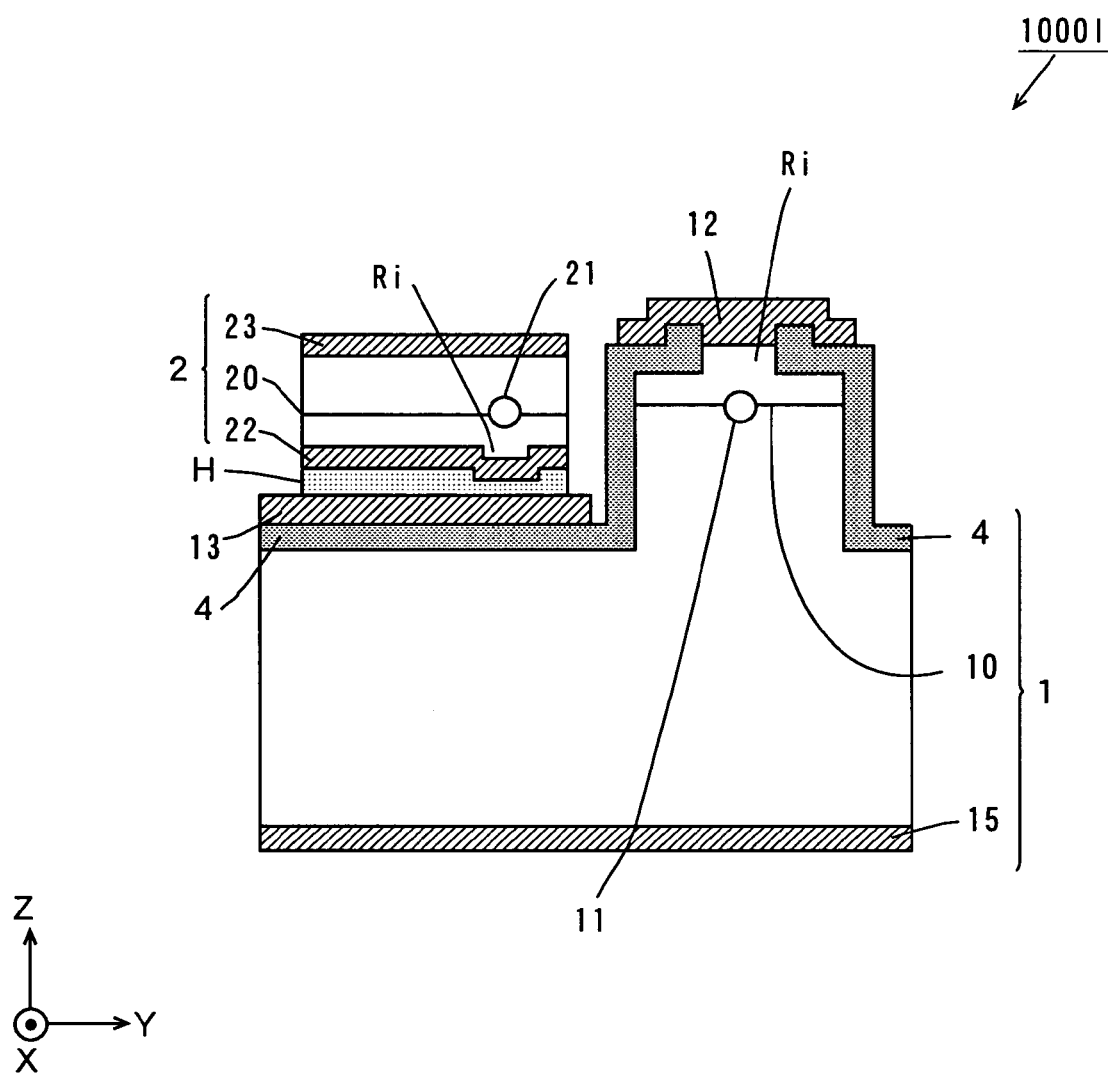
FIG. 42 is a schematic sectional view showing an exemplary semiconductor laser apparatus according to a ninth embodiment of the present invention.

FIG. 42 is a schematic sectional view showing an exemplary semiconductor laser apparatus 1000I according to a ninth embodiment of the present invention. Also in the following description, directions X, Y and Z are defined similarly to those in FIG. 1.

The semiconductor laser apparatus 1000I according to the ninth embodiment is different in structure from the semiconductor laser apparatus 1000F according to the sixth embodiment in the following point:

As shown in FIG. 42, a projection is provided on one side of a blue-violet semiconductor laser device 1 in the ninth embodiment. A p-n junction surface 10 is formed on this projection. A p-side pad electrode 13 is formed on a side of the projection of the blue-violet semiconductor laser device 1 on an insulating film 4, so that a red semiconductor laser device 2 is bonded thereto.

Thus, blue-violet and red-beam-emission points 11 and 21 are substantially aligned with each other, whereby the semiconductor laser apparatus 1000I and an optical pickup can be easily designed.

In each of the aforementioned first to ninth embodiments, the n-GaN substrate 1s corresponds to a first substrate, the laser beam having the wavelength of about 400 nm corresponds to a light beam of a first wavelength, the semiconductor layer it corresponds to a first semiconductor layer, and the blue-violet semiconductor laser device 1 corresponds to a first semiconductor laser device.

The n-GaAs contact layer 5 and the n-GaAs substrates 50 and 5X correspond to a second substrate, the laser beam having the wavelength of about 650 nm corresponds to a light beam of a second wavelength, the semiconductor layer 2t corresponds to a second semiconductor layer, and the red semiconductor laser device 2 corresponds to a second semiconductor laser device.

Further, the n-GaAs contact layer 5 and the n-GaAs substrates 50 and 5X correspond to a third substrate, the laser beam having the wavelength of about 780 nm corresponds to a light beam of a third wavelength, the semiconductor layer 3t corresponds to a third semiconductor layer, and the infrared semiconductor laser device 3 corresponds to a third semiconductor laser device.

The p-side pad electrode 12 of the blue-violet semiconductor laser device 1 corresponds to a first electrode of the first semiconductor laser device, and the insulating films 4 of the blue-violet semiconductor laser device 1 correspond to an insulating film.

The thickness T2 of the red semiconductor laser device 2 corresponds to the total thickness of the second substrate and the second semiconductor layer, the thickness T3 of the infrared semiconductor laser device 3 corresponds to the total thickness of the third substrate and the third semiconductor layer, and the thickness T1 of the blue-violet semiconductor laser device 1 corresponds to the total thickness of the first substrate and the first semiconductor layer.

The directions X and Y correspond to first and second directions respectively, the blue-violet, red and infrared-beam-emission points 11, 21 and 31 correspond to an emission point, and wires 2Wa and 3Wa correspond to a wire.

Further, the p-side pad electrodes 22 and 13 and the solder films H of the red semiconductor laser device 2 correspond to a first electrode of the second semiconductor laser device, and the p-side pad electrodes 32 and 14 and the solder films H of the infrared semiconductor laser device 3 correspond to a first electrode of the third semiconductor laser device.

The GaN wafer BW and the n-type substrate 601 correspond to a first growth substrate, the GaAs wafer RW and the n-type substrate 801 correspond to a second growth substrate, the dimension (etching depth) TT from the n-type cladding layer 603 to the top of the blue-violet semiconductor laser device 1 shown in FIG. 17(h) in the direction Z corresponds to the height of the ridge, the dimension (etching depth) HH form the n-type layer 821 to the each of the red and infrared semiconductor laser laminate shown in FIG. 26(i) in the direction Z corresponds to the height of the second and third semiconductor layers.

The width D of the p-type cladding layer 605 shown in FIG. 17(h) corresponds to the width of the ridge in the second direction, and the distance DD between the red and infrared semiconductor laser laminates in the direction Y shown in FIG. 26(i) corresponds to the distance between the second and third semiconductor layers in the second direction.

The red semiconductor laser laminate corresponds to a second cavity, the infrared semiconductor laser laminate corresponds to a third cavity, and the semiconductor layer forming the ridge Ri of the blue-violet semiconductor laser device 1 corresponds to a first cavity.

Further, the region of the blue-violet semiconductor laser device 1 on the side of the infrared semiconductor laser device 3 opposite to the red semiconductor laser device 2 in the direction Y in FIG. 32(b) and the region on the blue-violet semiconductor laser device 1 on the side of the red semiconductor laser device 2 in the direction Y in FIG. 41(b) correspond to a first region. The region of the p-side pad electrode 12 exposed on the region of the blue-violet semiconductor laser device 1 on the side of the red semiconductor laser device 2 in the direction Y corresponds to a second region. The region formed with the p-side pad electrode 14 exposed on the insulating film 4b in FIG. 32(b) and the region formed with the p-side pad electrode 13 exposed on the insulating film 4b in FIG. 41(b) correspond to a third region.

While the first electrode of the second or third semiconductor laser device is formed in a three-layer structure of the solder film and two p-side pad electrodes in each of the aforementioned first to ninth embodiments, the present invention is not restricted to this but the first electrode of the second or third semiconductor laser device may alternatively be formed in a two-layer structure of two p-side pad electrodes or an electrode of an integral structure serving as both of p-side pad electrodes of the second or third and first semiconductor laser devices.

The p-side pad electrode is preferably formed in a two-layer structure so that ohmic contact with the semiconductor layer is improved and bonding strength between the pad electrode an the wire can be increased. Further, a solder film is more preferably formed between the two p-side pad electrodes, in order to increase the bonding strength of the two p-side pad electrodes. In this case, other pad electrodes may be further formed on the pad electrodes after the step shown in FIG. 6(g).

While in each of the aforementioned second and eight embodiments, the p-side pad electrode 12 is formed on the entire surface on the side of the infrared semiconductor laser device 3 or the side of the red semiconductor laser device 2, and the p-side pad electrode 14 or p-side pad electrode 13 is formed so as to be stacked on the p-side pad electrode 12 and insulating films 4b. The present invention, however, is not restricted to this, and instead of forming the p-side pad electrode 12 on the lower surface of the p-side pad electrode 14 or p-side pad electrode 13, the p-side pad electrode 14 or p-side pad electrode 13 may be formed so as not to be stacked on the p-side pad electrode 12.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
    a first semiconductor laser device having a first semiconductor layer emitting a light beam of a first wavelength on a first substrate;
    a second semiconductor laser device having a second semiconductor layer emitting a light beam of a second wavelength on a second substrate; and a
    a third semiconductor laser device having a third semiconductor layer emitting a light beam of a third wavelength on a third substrate, wherein
    said first, second and third wavelengths are different from each other and at least one of said second and third substrates is composed of a material different from that of said first substrate,
    said first semiconductor laser device has a first electrode on a first surface thereof,
    said second semiconductor laser device has a first electrode on a first surface thereof,
    said third semiconductor laser device has a first electrode on a first surface thereof,
    said first electrode of said second semiconductor laser device and said first electrode of said third semiconductor laser device are bonded to said first surface of said first semiconductor laser device with an insulating film sandwiched therebetween, and
    said first electrode of said first semiconductor laser device, said first electrode of said second semiconductor laser device and said first electrode of said third semiconductor laser device are electrically isolated from each other.

2. The semiconductor laser apparatus according to claim 1, wherein
    said first electrode of said first semiconductor laser device is formed on a surface of said first semiconductor layer, said first electrode of said second semiconductor laser device is formed on a surface of said second semiconductor layer, and said first electrode of said third semiconductor laser device is formed on a surface of said third semiconductor layer.

3. The semiconductor laser apparatus according to claim 1, wherein
    said first electrode of said first semiconductor laser device extends between at least one of said second and third semiconductor laser devices and said first semiconductor laser device and projects from a side surface of said at least one of said second and third semiconductor laser devices.

4. The semiconductor laser apparatus according to claim 1, wherein
    said first electrode of at least one of said second and third semiconductor laser devices extends between said at least one of said second and third semiconductor laser devices and said first semiconductor laser device and projects from a side surface of said at least one of said second and third semiconductor laser devices.

5. The semiconductor laser apparatus according to claim 4, wherein
    a portion of said first electrode of said at least one of said second and third semiconductor laser devices projecting from said side surface of said at least one of said second and third semiconductor laser devices is formed on said first surface of said first semiconductor laser device.

6. The semiconductor laser apparatus according to claim 1, wherein
    both of said first electrode of said first semiconductor laser device and said first electrode of at least one of said second and third semiconductor laser devices extend between said at least one of said second and third semiconductor laser devices and said first semiconductor laser device and project from a same side surface of said at least one of said second and third semiconductor laser devices.

7. The semiconductor laser apparatus according to claim 6, wherein
    a portion of said first electrode of said first semiconductor laser device projecting from said side surface of said at least one of said second and third semiconductor laser devices is at least partially exposed on a first region of said first surface of said first semiconductor laser device on said side of at least one of said second and third semiconductor laser devices, and
    a portion of said first electrode of said at least one of said second and third semiconductor laser devices projecting from said side surface of said at least one of said second and third semiconductor laser devices is at least partially exposed on said first region.

8. The semiconductor laser apparatus according to claim 7, wherein
    each of said second and third semiconductor laser devices has a cavity extending in one direction and side surfaces along the longitudinal direction of said cavity, and
    said first region includes a second region in which said first electrode of said first semiconductor laser device is at least partially exposed, and a third region in which said first electrode of said at least one of said second and third semiconductor laser devices is at least partially exposed, and wherein
    said second and third regions are arranged along a direction parallel to the respective side surfaces of said second and third semiconductor laser devices.

9. The semiconductor laser apparatus according to claim 6, wherein
    said portion of said first electrode of said at least one of said second and third semiconductor laser devices projecting from said side surface of said at least one of said second and third semiconductor laser devices is formed on said portion of said first electrode of said first semiconductor laser device projecting from said side surface of said at least one of said second and third semiconductor laser devices with said insulating film sandwiched therebetween.

10. The semiconductor laser apparatus according to claim 9, wherein
    said insulating film is formed such that said first electrode of said first semiconductor laser device is at least partially exposed on said portion of said first electrode of said first semiconductor laser device projecting from said side surface of said at least one of said second and third semiconductor laser devices.

11. The semiconductor laser apparatus according to claim 1, wherein
    said second substrate and said third substrate are formed by a common substrate,
    said second semiconductor layer and said third semiconductor layer are formed on said common substrate to be isolated from each other, and
    said second semiconductor laser device and said third semiconductor laser device have a common second electrode formed on said common substrate.

12. The semiconductor laser apparatus according to claim 1, wherein
    said second semiconductor laser device has a second electrode on a surface opposite to a junction with said first semiconductor laser device, and said third semiconductor laser device has a second electrode on a surface opposite to a junction with said first semiconductor laser device.

13. The semiconductor laser apparatus according to claim 1, wherein the total thickness of said second substrate and said second semiconductor layer in said second semiconductor laser device and/or the total thickness of said third substrate and said third semiconductor layer in said third semiconductor laser device is smaller than the total thickness of said first substrate and said first semiconductor layer in said first semiconductor laser device.

14. The semiconductor laser apparatus according to claim 1, wherein said first semiconductor laser device has an emission point emitting a light beam in a first direction parallel to a first surface of said first substrate, said second semiconductor laser device has an emission point emitting a light beam in said first direction, and said third semiconductor laser device has an emission point emitting a light beam in said first direction.

15. The semiconductor laser apparatus according to claim 14, wherein said emission point of said second semiconductor laser device is formed on a position closer to said emission point of said first semiconductor laser device than the center of said second semiconductor layer in a second direction parallel to said first surface of said first substrate and perpendicular to said first direction, and said emission point of said third semiconductor laser device is formed on a position closer to said emission point of said first semiconductor laser device than the center of said third semiconductor layer in said second direction parallel to said first surface of said first substrate and perpendicular to said first direction.

16. The semiconductor laser apparatus according to claim 1, wherein a wire is connected to a position of said first electrode of said second semiconductor laser device, which is opposite to said third semiconductor laser device, in a direction parallel to a first surface of said first substrate and perpendicular to a light-emitting direction and/or a position of said first electrode of said third semiconductor laser device, which is opposite to said second semiconductor laser device, in said direction parallel to said first surface of said first substrate and perpendicular to said light-emitting direction.

17. The semiconductor laser apparatus according to claim 1, wherein said first substrate is a translucent substrate.

18. The semiconductor laser apparatus according to claim 1, wherein said first semiconductor layer is composed of a nitride-based semiconductor.

19. The semiconductor laser apparatus according to claim 1, wherein said first semiconductor laser device has a ridge on said first surface, and said insulating film is formed on a side surface of said ridge.

* * * * *